United States Patent
Li et al.

(10) Patent No.: US 12,261,241 B2
(45) Date of Patent: *Mar. 25, 2025

(54) MICRO-LED STRUCTURE INCLUDING CONTINUOUS LIGHT EMITTING LAYER, AND MICRO-LED CHIP INCLUDING SAME

(71) Applicant: JADE BIRD DISPLAY (SHANGHAI) LIMITED, Shanghai (CN)

(72) Inventors: Qiming Li, Albuquerque, NM (US); Yuankun Zhu, Shanghai (CN); Anle Fang, Shanghai (CN); Deshuai Liu, Shanghai (CN)

(73) Assignee: JADE BIRD DISPLAY (SHANGHAI) LIMITED, Shanghai (CN)

( * ) Notice: Subject to any disclaimer, the term of this patent is extended or adjusted under 35 U.S.C. 154(b) by 492 days.

This patent is subject to a terminal disclaimer.

(21) Appl. No.: 17/562,191

(22) Filed: Dec. 27, 2021

(65) Prior Publication Data

US 2022/0209055 A1    Jun. 30, 2022

Related U.S. Application Data

(60) Provisional application No. 63/131,128, filed on Dec. 28, 2020.

(51) Int. Cl.
*H01L 33/06* (2010.01)
*H01L 25/075* (2006.01)
(Continued)

(52) U.S. Cl.
CPC .......... *H01L 33/06* (2013.01); *H01L 25/0753* (2013.01); *H01L 27/15* (2013.01);
(Continued)

(58) Field of Classification Search
CPC ... H01L 25/0753; H01L 27/15; H01L 27/153; H01L 33/02; H01L 33/04; H01L 33/06;
(Continued)

(56) References Cited

U.S. PATENT DOCUMENTS

| 2011/0122172 A1* | 5/2011 | Tanigawa | G02B 3/0056 |
| | | | 257/E33.068 |
| 2015/0222094 A1* | 8/2015 | Lee | H01S 5/18313 |
| | | | 372/50.12 |
| 2022/0223771 A1* | 7/2022 | Behringer | H01L 33/20 |

FOREIGN PATENT DOCUMENTS

| CN | 101258616 A | 9/2008 |
| CN | 102931303 A | 2/2013 |
| WO | WO 2020162195 A1 | 8/2020 |

OTHER PUBLICATIONS

International Search Report and Written Opinion of International Application No. PCT/IB2021/062348, mailed Apr. 14, 2022.

\* cited by examiner

*Primary Examiner* — Cheung Lee
(74) *Attorney, Agent, or Firm* — FINNEGAN, HENDERSON, FARABOW, GARRETT & DUNNER LLP

(57) ABSTRACT

A micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. A profile of the second type conductive layer perpendicularly projected on a top surface of the first type conductive layer is surrounded by an edge of the first type conductive layer.

20 Claims, 30 Drawing Sheets

(51) Int. Cl.
*H01L 27/15* (2006.01)
*H01L 33/02* (2010.01)
*H01L 33/04* (2010.01)
*H01L 33/10* (2010.01)
*H01L 33/20* (2010.01)
*H01L 33/24* (2010.01)
*H01L 33/38* (2010.01)
*H01L 33/46* (2010.01)
*H01L 33/50* (2010.01)
*H01L 33/58* (2010.01)
*H01L 33/60* (2010.01)
*H01L 33/62* (2010.01)
*H01L 33/36* (2010.01)

(52) U.S. Cl.
CPC ............ *H01L 27/153* (2013.01); *H01L 33/02* (2013.01); *H01L 33/04* (2013.01); *H01L 33/10* (2013.01); *H01L 33/20* (2013.01); *H01L 33/24* (2013.01); *H01L 33/38* (2013.01); *H01L 33/46* (2013.01); *H01L 33/50* (2013.01); *H01L 33/58* (2013.01); *H01L 33/60* (2013.01); *H01L 33/62* (2013.01); *H01L 33/36* (2013.01)

(58) Field of Classification Search
CPC ......... H01L 33/10; H01L 33/14; H01L 33/20; H01L 33/24; H01L 33/36; H01L 33/38; H01L 33/382; H01L 33/385; H01L 33/405; H01L 33/44; H01L 33/46; H01L 33/50; H01L 33/54; H01L 33/58; H01L 33/60; H01L 33/62
See application file for complete search history.

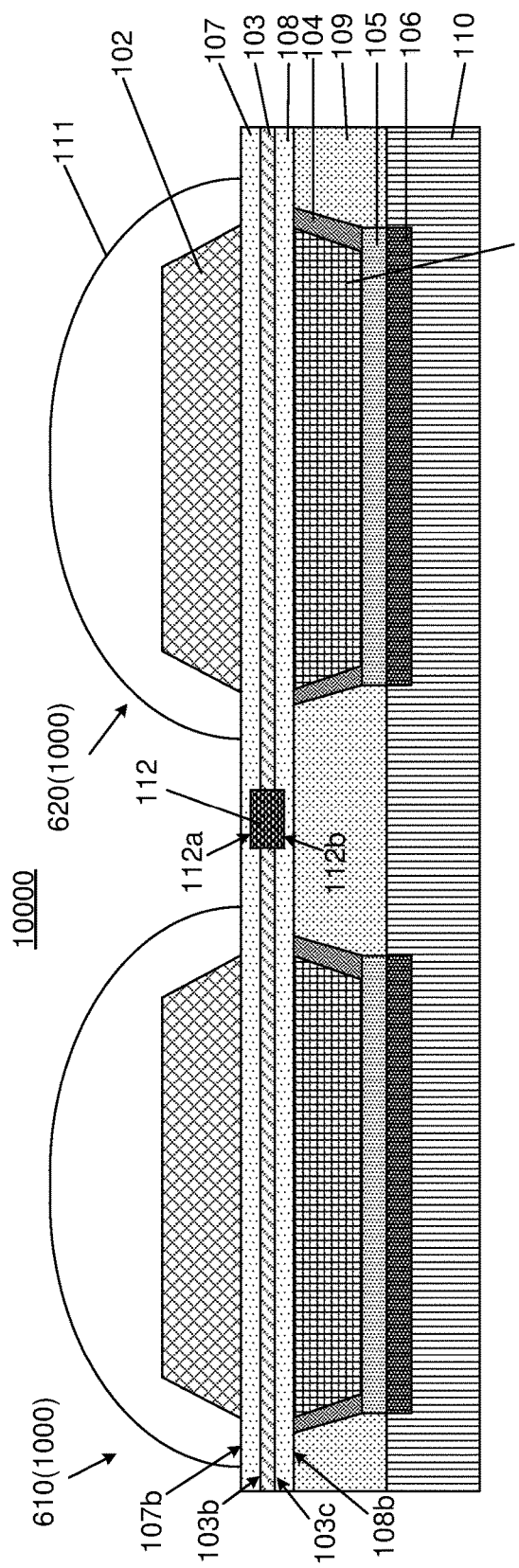
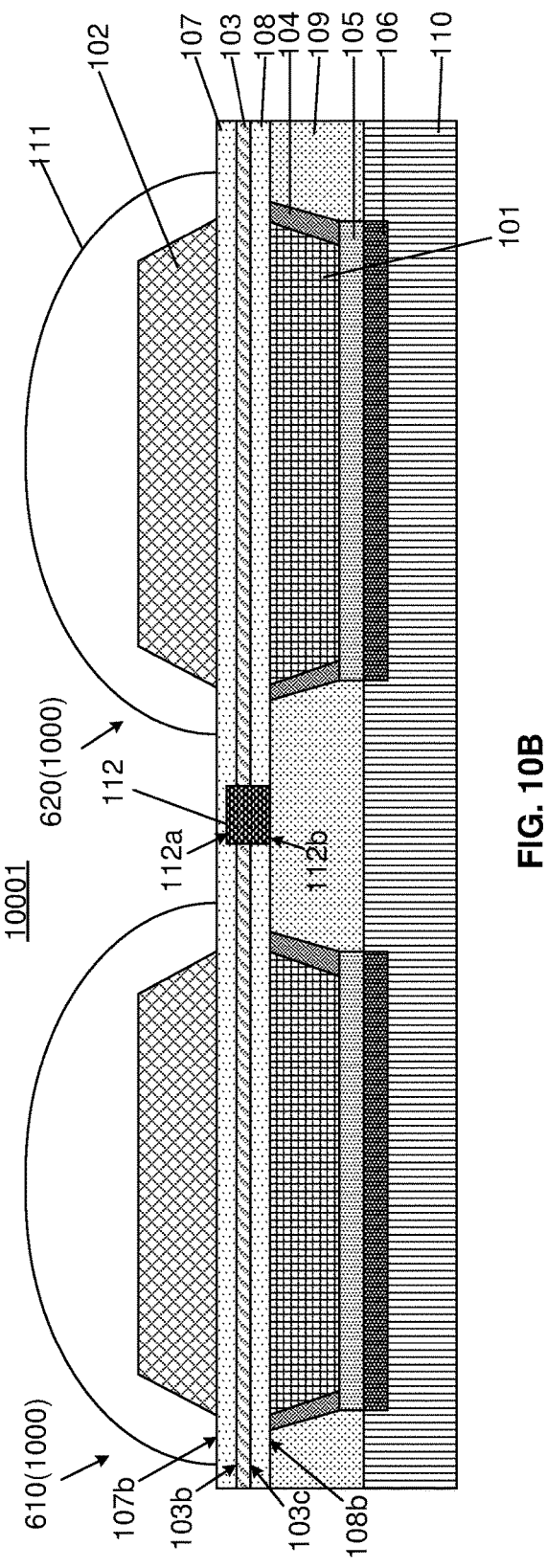
FIG. 10A
FIG. 10B

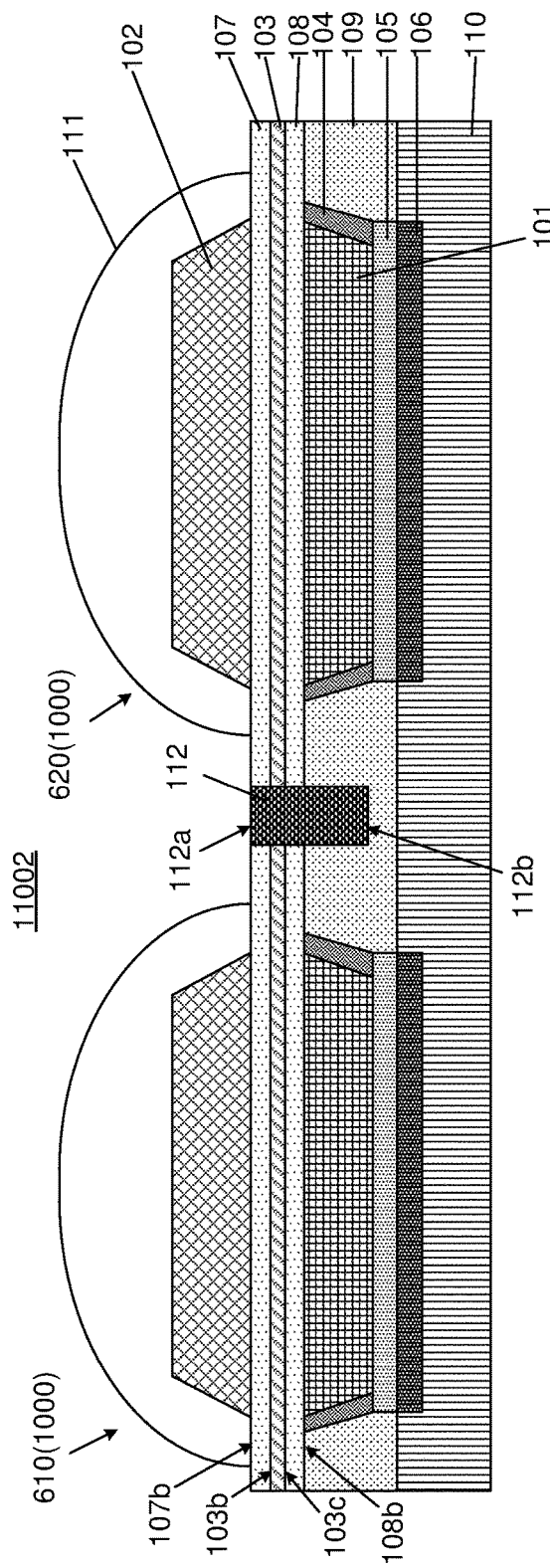
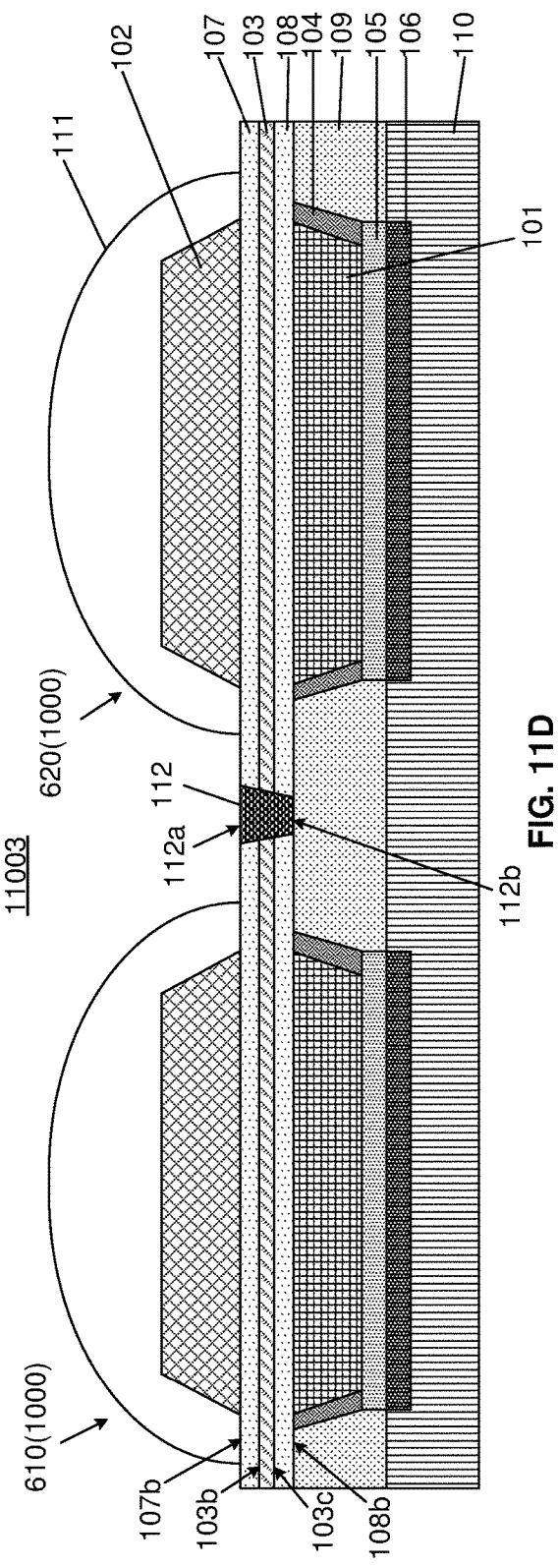
FIG. 11C
FIG. 11D

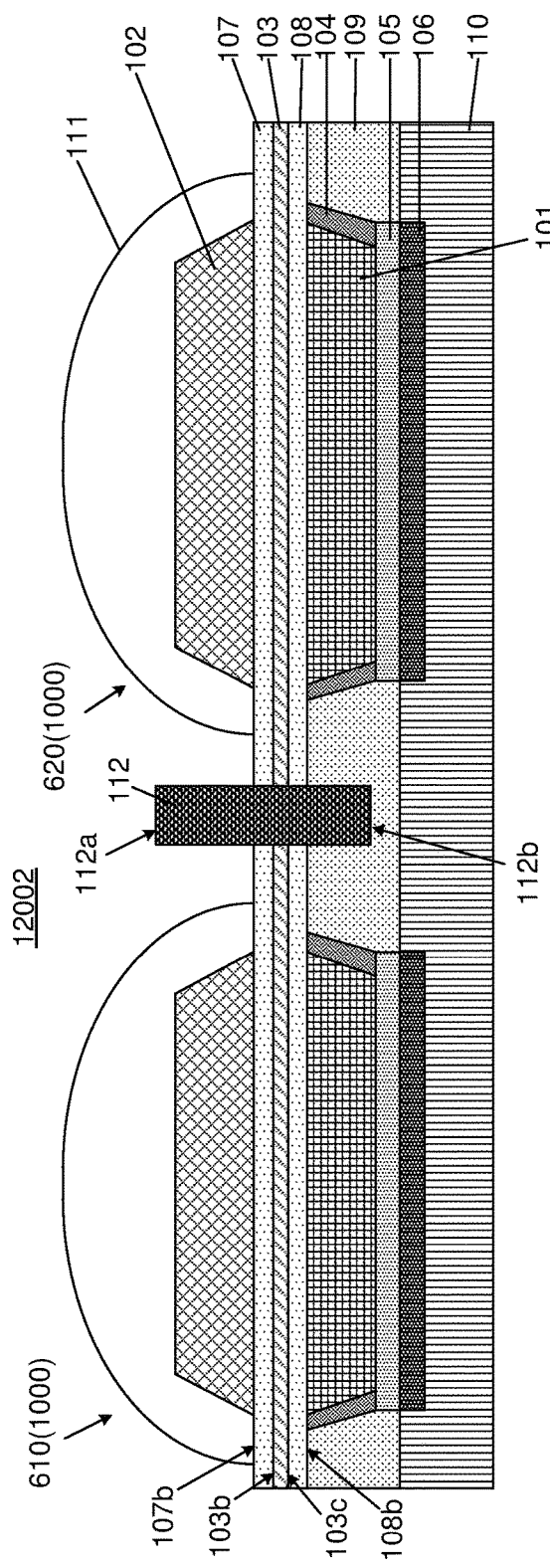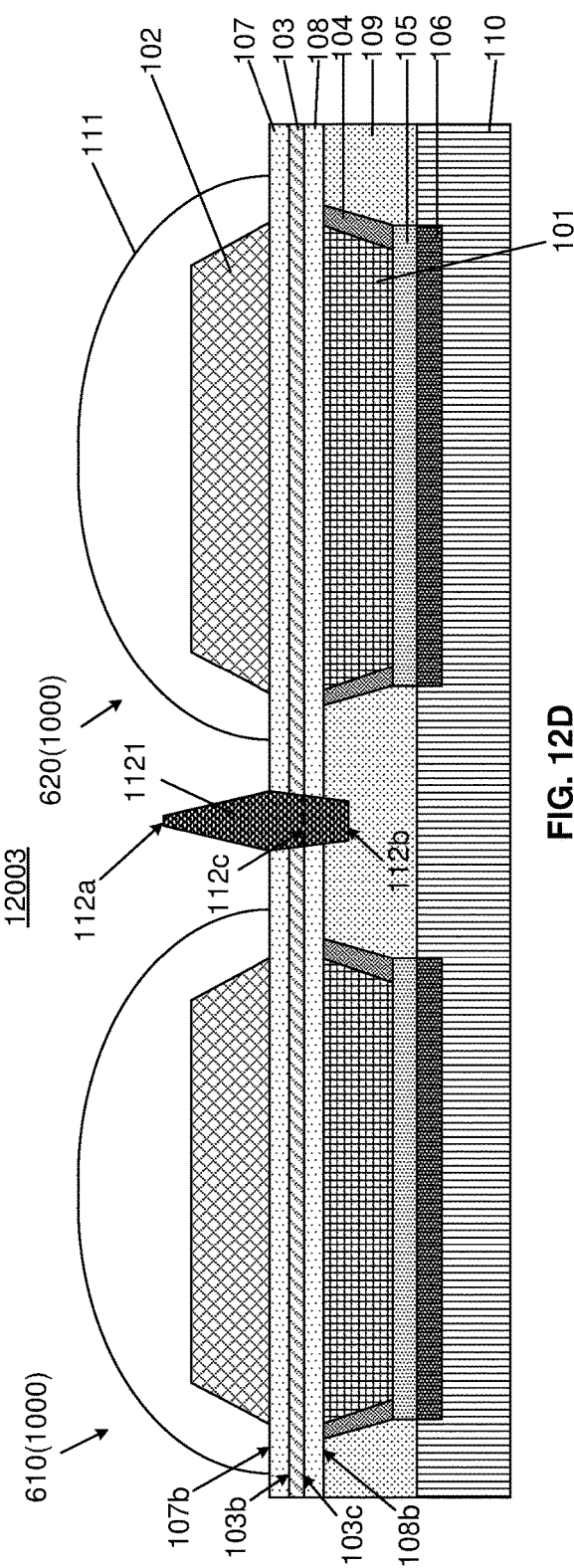
FIG. 12C
FIG. 12D

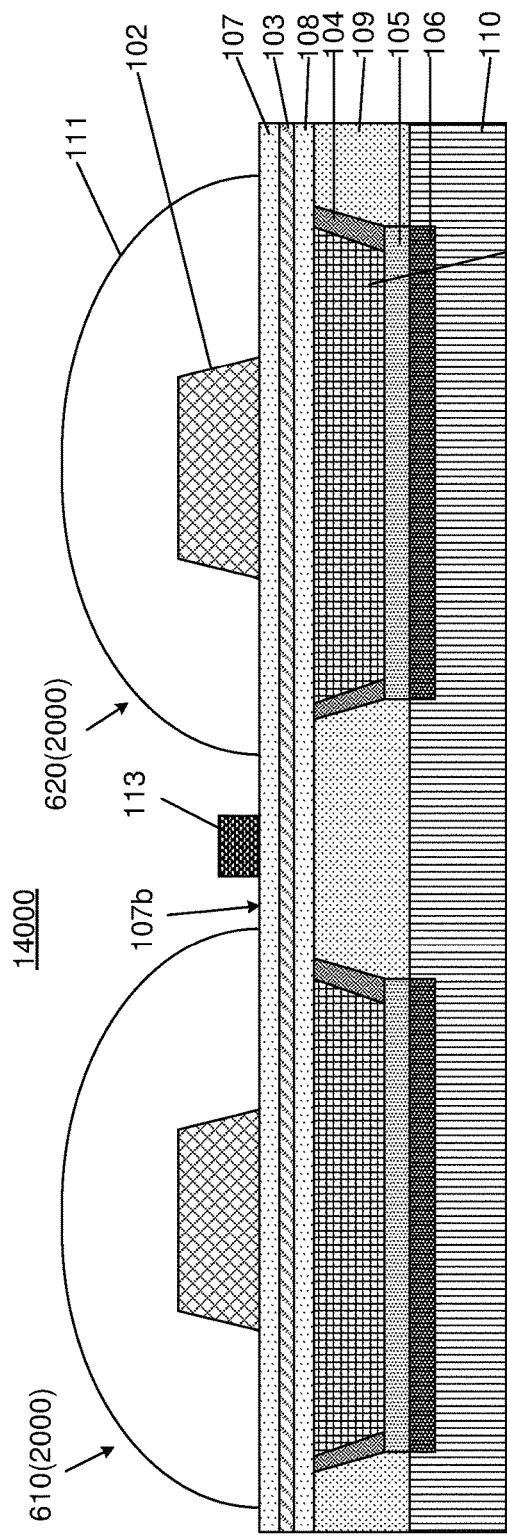
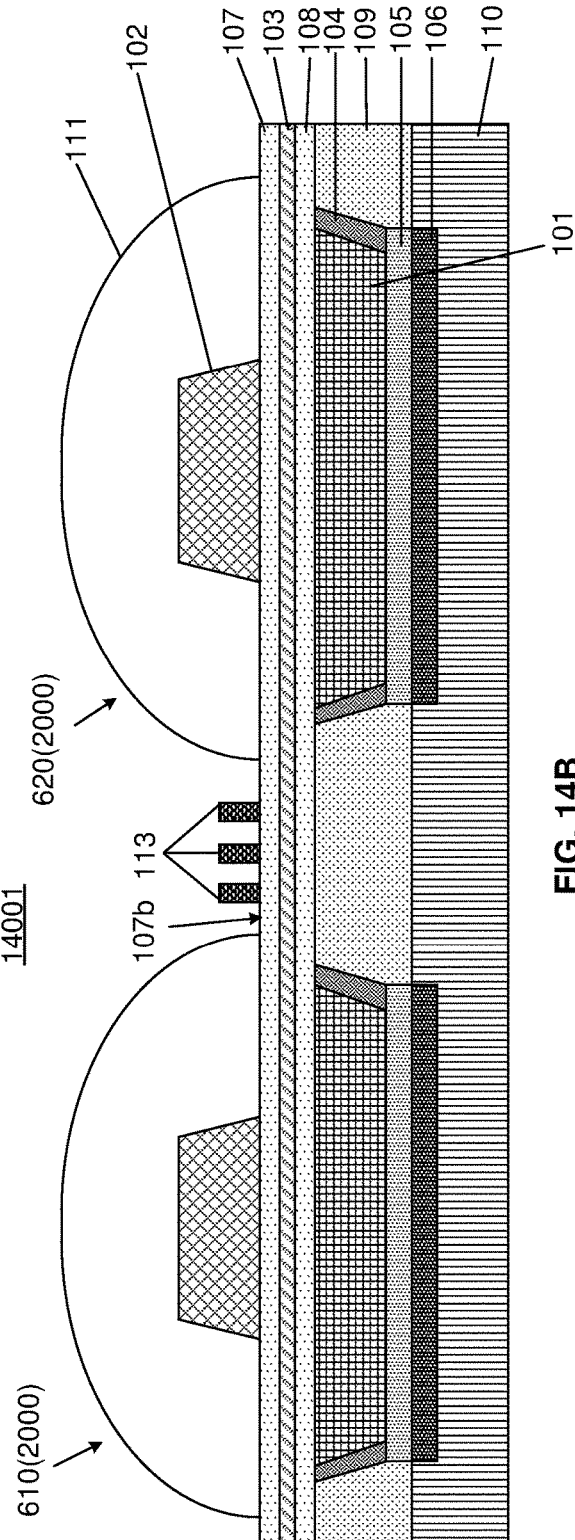
FIG. 14A
FIG. 14B

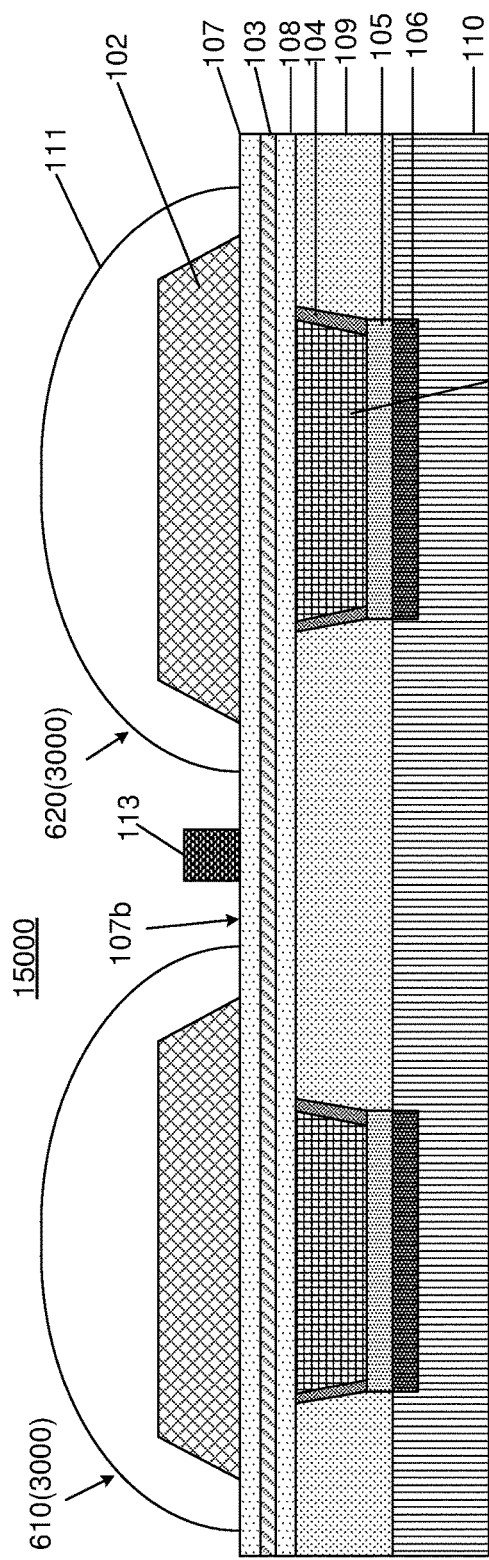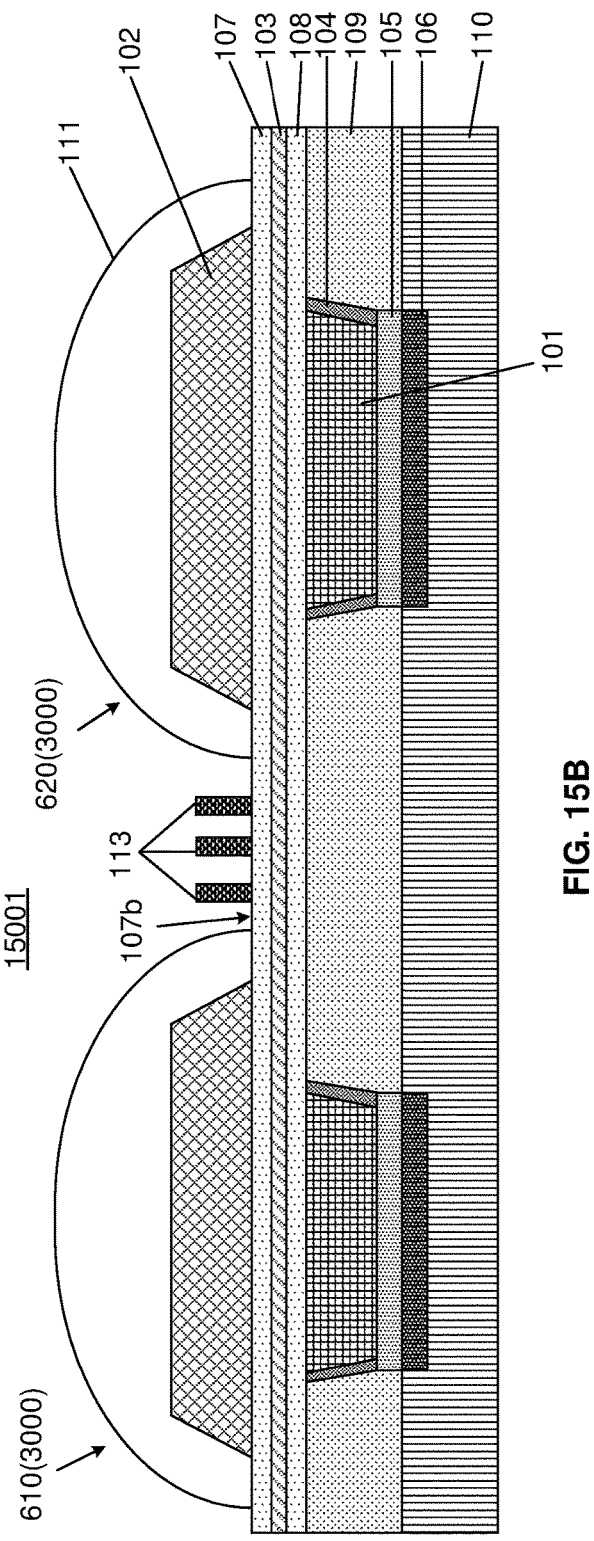

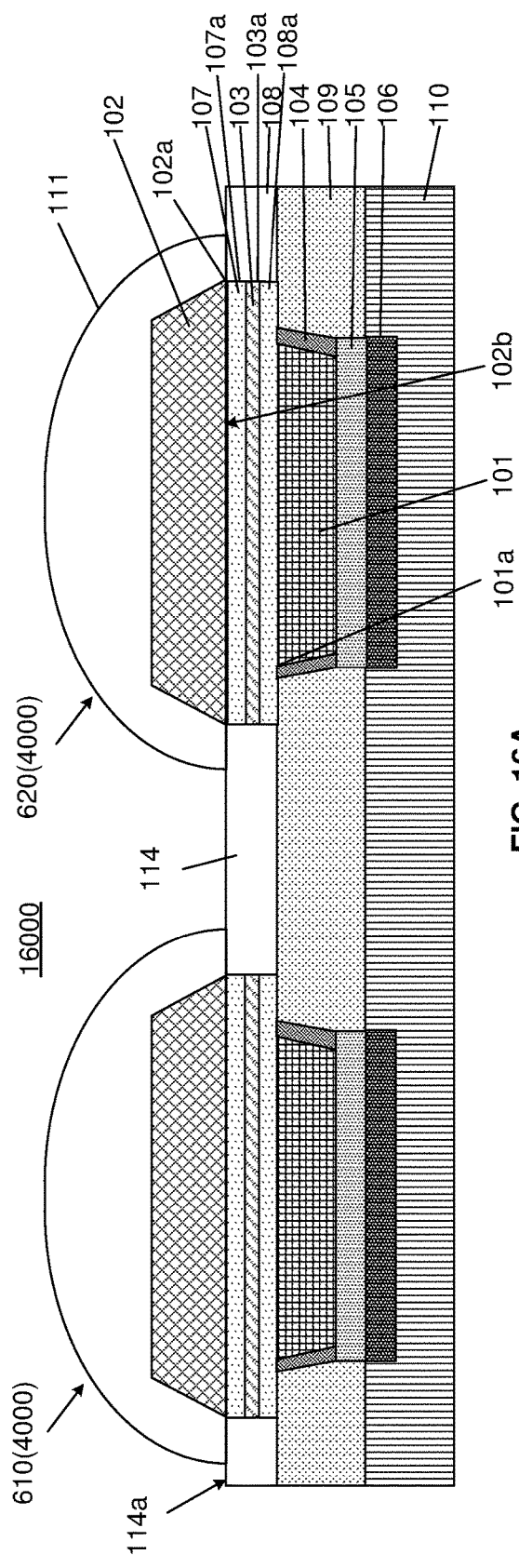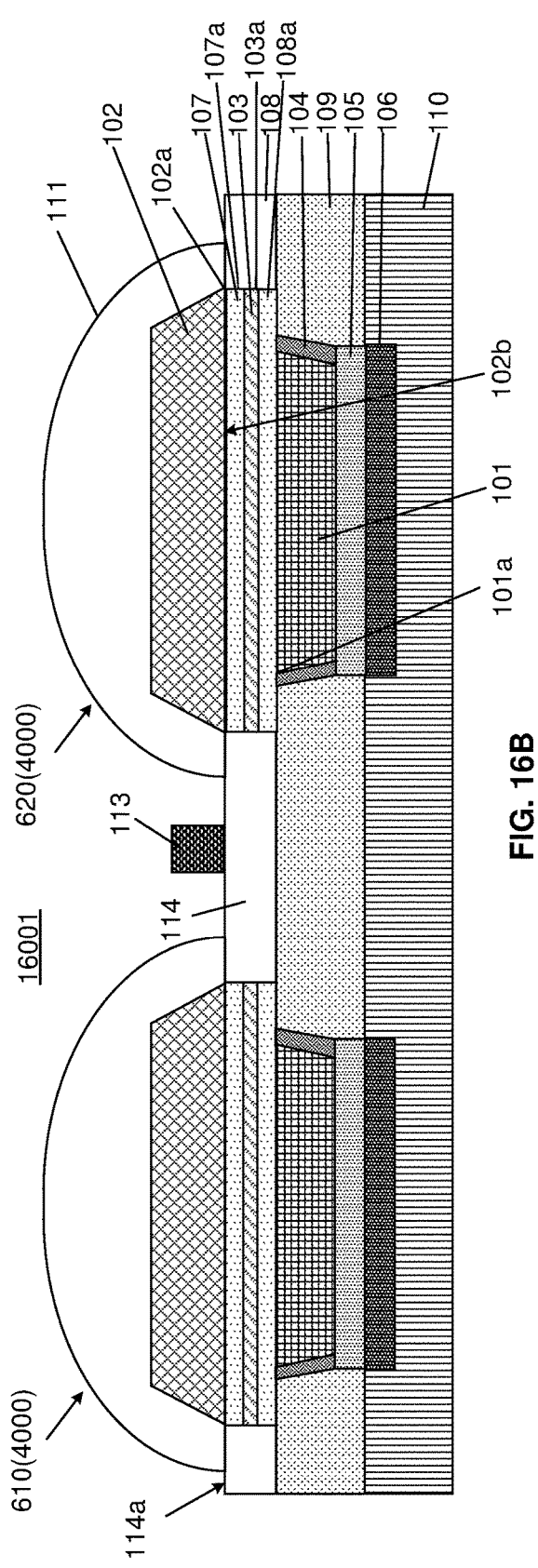

MICRO-LED STRUCTURE INCLUDING CONTINUOUS LIGHT EMITTING LAYER, AND MICRO-LED CHIP INCLUDING SAME

CROSS-REFERENCE TO RELATED APPLICATIONS

This application claims the benefit of priority to U.S. Provisional Application No. 63/131,128, filed on Dec. 28, 2020, the entire contents of which are incorporated herein by reference.

FIELD

The present disclosure relates to a micro-LED structure and a micro-LED chip including the micro-LED structure.

BACKGROUND

A micro-light emitting diode (micro-LED) is a device that emits light using an electric signal and has a size on the order of micrometers or even smaller. The micro-LED can be driven at a low voltage such that it is widely implemented in small-sized optical elements. In recent years, the micro-LED has been developed as an illuminating light source by increasing its efficiency.

SUMMARY

According to one aspect of embodiments of the present disclosure, a micro-LED structure includes: a first type conductive layer; a second type conductive layer stacked on the first type conductive layer; and a light emitting layer formed between the first type conductive layer and the second type conductive layer. The light emitting layer extends along a horizontal level away from a top edge of the first type conductive layer and a bottom edge of the second type conductive layer, such that an edge of the light emitting layer does not contact the top edge of the first type conductive layer and the bottom edge of the second type conductive layer. The bottom edge of the second type conductive layer is aligned with the top edge of the first type conductive layer.

According to another aspect of embodiments of the present disclosure, a micro-LED structure includes: a first type conductive layer; a second type conductive layer stacked on the first type conductive layer; and a light emitting layer formed between the first type conductive layer and the second type conductive layer. The light emitting layer extrudes along a horizontal level away from a top edge of the first type conductive layer and a bottom edge of the second type conductive layer, such that an edge of the light emitting layer does not contact the top edge of the first type conductive layer and the bottom edge of the second type conductive layer. A profile of the second type conductive layer perpendicularly projected on a top surface of the first type conductive layer is surrounded by the top edge of the first type conductive layer.

According to another aspect of embodiments of the present disclosure, a micro-LED structure includes a first type conductive layer; a second type conductive layer stacked on the first type conductive layer; and a light emitting layer formed between the first type conductive layer and the second type conductive layer. The light emitting layer extends along a horizontal level away from a top edge of the first type conductive layer and a bottom edge of the second type conductive layer, such that an edge of the light emitting layer does not contact the top edge of the first type conductive layer and the bottom edge of the second type conductive layer. A profile of the first type conductive layer perpendicularly projected on a bottom surface of the second type conductive layer is surrounded by the bottom edge of the second type conductive layer.

According to another aspect of embodiments of the present disclosure, a micro-LED structure includes a first type conductive layer; a second type conductive layer stacked on the first type conductive layer; and a light emitting layer formed between the first type conductive layer and the second type conductive layer. The light emitting layer extends along a horizontal level from an edge of the first type conductive layer. An edge of the light emitting layer is aligned with an edge of the second type conductive layer. The edge of the second type conductive layer extends along the horizontal level away from the edge of the first type conductive layer.

According to another aspect of embodiments of the present disclosure, a micro-LED structure includes: a first type conductive layer; a second type conductive layer stacked on the first type conductive layer; and a light emitting layer formed between the first type conductive layer and the second type conductive layer. The light emitting layer extends along a horizontal level from an edge of the second type conductive layer. An edge of the light emitting layer is aligned with an edge of the first type conductive layer. The edge of the first type conductive layer extends along the horizontal level away from the edge of the second type conductive layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. An isolation structure is formed between adjacent micro-LEDs, at least a portion of the isolation structure being formed in the light emitting layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole chip, the multiple micro-LEDs sharing the light emitting layer. An isolation structure is formed between adjacent micro-LEDs, at least a portion of the isolation structure being formed in the light emitting layer. A top surface of the isolation structure is aligned with a top of the light emitting layer, and a bottom surface of the isolation structure is under the light emitting layer.

According to another aspect of embodiments of the present disclosure, a micro-LED chip includes multiple micro-LEDs. At least one micro-LED of the multiple micro-LEDs includes a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is aligned with a top of the light emitting layer, and a bottom surface of the isolation structure is above a bottom surface of the bottom spacer and is under the light emitting layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is aligned with a top of the light emitting layer, and a bottom surface under the bottom spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further comprises: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is aligned with a top of the light emitting layer, and a bottom surface of the isolation structure is aligned with a bottom surface of the bottom spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes an isolation structure formed between adjacent micro-LEDs, at least a portion of the isolation structure being formed in the light emitting layer. A top surface of the isolation structure is above the light emitting layer. A bottom surface of the isolation structure is aligned with a bottom of the light emitting layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is aligned with a bottom surface of the light emitting layer, and a top surface of the isolation structure is above the light emitting layer and under the top surface of the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is aligned with a bottom surface of the light emitting layer, and a top surface of the isolation structure is aligned with a top surface of the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is aligned with a bottom surface of the light emitting layer, and a top surface of the isolation structure is above the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. An isolation structure is formed between adjacent micro-LEDs, at least a portion of the isolation structure being formed in the light emitting layer. A top surface of the isolation structure is above the light emitting layer, and a bottom surface of the isolation structure is under the light emitting layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is above the light emitting layer and under a top surface of the top spacer, and a bottom surface of the isolation structure is under a bottom of the light emitting layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is above the light emitting layer and under a top surface of the top spacer, and a bottom surface of the isolation structure is under a bottom of the light emitting layer, and above a bottom surface of the bottom spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is above the light emitting layer and under a top surface of the top spacer, and a bottom surface of the isolation structure aligned with a bottom surface of the bottom spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is above the light emitting layer and under a top surface of the top spacer, and a bottom surface of the isolation structure is under the bottom spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is under the light emitting layer, and above a bottom surface of the bottom spacer, and a top surface of the isolation structure is aligned with a top surface of the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, and the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is under the light emitting layer, and above a bottom surface of the bottom spacer, and a top surface of the isolation structure is above the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, and the multiple micro-LEDs sharing the light emitting layer. An isolation structure is formed between adjacent micro-LEDs, at least a portion of the isolation structure being formed in the light emitting layer. A bottom surface of the isolation structure is aligned with a bottom of the light emitting layer, and a top surface of the isolation structure is aligned with a top surface of the light emitting layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, and the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is aligned with a bottom surface of the bottom spacer, and a top surface of the isolation structure is aligned with a top surface of the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a top surface of the isolation structure is aligned with a top surface of the top spacer, and a bottom surface of the isolation structure is under the bottom spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is aligned with a bottom surface of the bottom spacer, and a top surface of the isolation structure is above the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. The micro-LED chip further includes: a top spacer formed on a top surface of the light emitting layer; a bottom spacer formed on a bottom surface of the light emitting layer, wherein an edge of the top spacer is aligned with an edge of the light emitting layer, and an edge of the bottom spacer is aligned with the edge of the light emitting layer; and an isolation structure formed between adjacent micro-LEDs, wherein at least a portion of the isolation structure is formed in the light emitting layer, a bottom surface of the isolation structure is under the bottom spacer, and a top surface of the isolation structure is above the top spacer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro- LED chip, the multiple micro-LEDs sharing the light emitting layer. A bottom edge of the second type conductive layer is aligned with a top edge of the first type conductive layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. A profile of the second type conductive layer perpendicularly projected on a top surface of the first type conductive layer is surrounded by an edge of the first type conductive layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer is continuously formed on the whole micro-LED chip, the multiple micro-LEDs sharing the light emitting layer. A profile of the first type conductive layer perpendicularly projected on a bottom surface of the second type conductive layer is surrounded by an edge of the second type conductive layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer, at least one part of the light emitting layer being formed between adjacent micro-LEDs. the micro-LED chip further comprises a metal layer formed on the light emitting layer between the adjacent micro-LEDs.

According to another aspect of embodiments of the present disclosure, a micro-LED chip includes multiple micro-LEDs. At least one micro-LED includes: a first type conductive layer; a second type conductive layer stacked on the first type conductive layer; and a light emitting layer formed between the first type conductive layer and the second type conductive layer. The light emitting layer extends along a horizontal level from a top edge of the first type conductive layer and from a bottom edge of the second type conductive layer, such that an edge of the light emitting layer does not contact the top edge of the first type conductive layer and the bottom edge of the second type conductive layer, and the bottom edge of the second type conductive layer is aligned with the top edge of the first type conductive layer. The micro-LED chip further includes a metal layer formed on the light emitting layer between adjacent micro-LEDs.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer extends along a horizontal level from a top edge of the first type conductive layer and a bottom edge of the second type conductive layer, such that an edge of the light emitting layer does not contact the top edge of the first type conductive layer and the bottom edge of the second type conductive layer, and a profile of the second type conductive layer perpendicularly projected on a top surface of the first type conductive layer is surrounded by an edge of the first type conductive layer. The micro-LED chip further includes a metal layer formed on a portion of the light emitting layer that extends from the top edge of the first type conductive layer.

According to another aspect of embodiments of the present disclosure, a micro-LED chip includes multiple micro-LEDs. At least one micro-LED of the multiple micro-LEDs includes: a first type conductive layer; a second type conductive layer stacked on the first type conductive layer; and a light emitting layer formed between the first type conductive layer and the second type conductive layer. The light emitting layer extends along a horizontal level from a top edge of the first type conductive layer and a bottom edge of the second type conductive layer, such that an edge of the light emitting layer does not touch the top edge of the first type conductive layer and the bottom edge of the second type conductive layer. A profile of the first type conductive layer perpendicularly projected on a bottom surface of the second type conductive layer is surrounded by the bottom edge of the second type conductive layer. The micro-LED chip further includes a metal layer formed on a portion of the light emitting layer that extends from the second type conductive layer.

BRIEF DESCRIPTION OF DRAWING(S)

FIG. 10A is a cross-sectional view of a micro-LED chip, according to a tenth embodiment of the present disclosure.

FIG. 10B is a cross-sectional view of a micro-LED chip, according to a first variation of the tenth embodiment of the present disclosure.

FIG. 11C is a cross-sectional view of a micro-LED chip, according to a second variation of the eleventh embodiment of the present disclosure.

FIG. 11D is a cross-sectional view of a micro-LED chip, according to a third variation of the eleventh embodiment of the present disclosure.

FIG. 12C is a cross-sectional view of a micro-LED chip, according to a second variation of the twelfth embodiment of the present disclosure.

FIG. 12D is a cross-sectional view of a micro-LED chip, according to a third variation of the twelfth embodiment of the present disclosure.

FIG. 14A is a cross-sectional view of a micro-LED chip, according to a fourteenth embodiment of the present disclosure.

FIG. 14B is a cross-sectional view of a micro-LED chip, according to a variation of the fourteenth embodiment of the present disclosure.

FIG. 15A is a cross-sectional view of a micro-LED chip, according to a fifteenth embodiment of the present disclosure.

FIG. 15B is a cross-sectional view of a micro-LED chip, according to a variation of the fifteenth embodiment of the present disclosure.

FIG. 16A is a cross-sectional view of a micro-LED chip, according to a sixteenth embodiment of the present disclosure.

FIG. 16B is a cross-sectional view of a micro-LED chip, according to a variation of the sixteenth embodiment of the present disclosure.

DETAILED DESCRIPTION

Figure 1A:
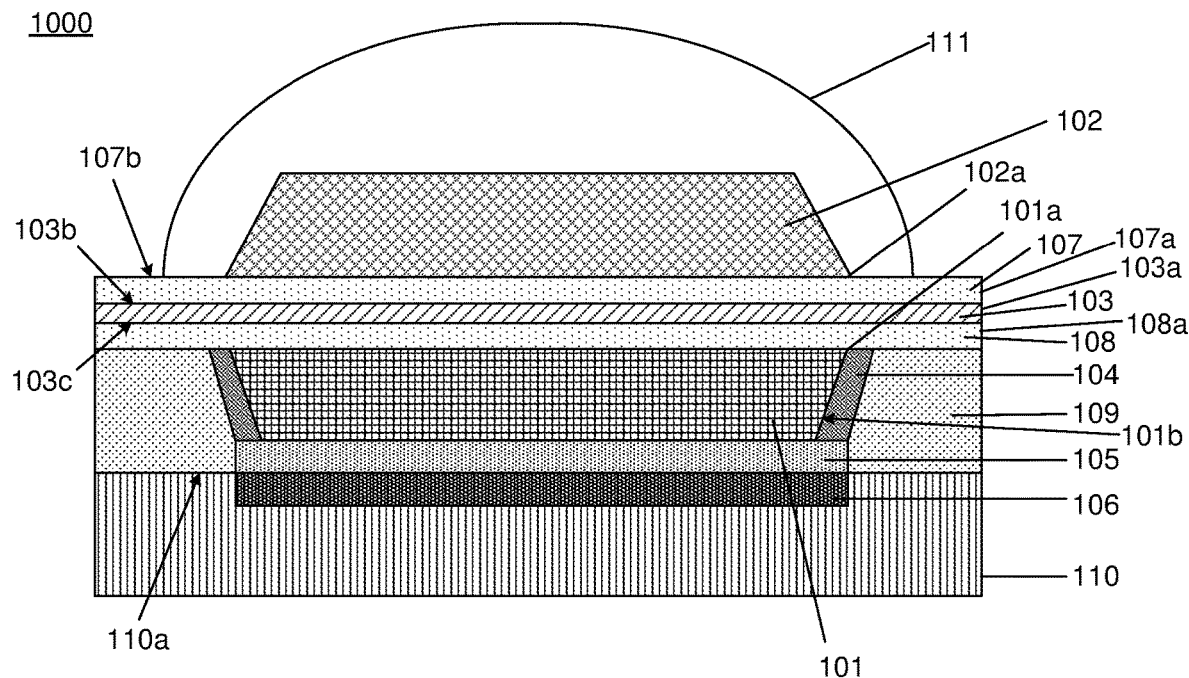
FIG. 1A is a cross-sectional view of a micro-LED structure, according to a first embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present application are only for the purpose of illustrating the basic structure of the subject matter of the present application. The same numbers in different drawings represent the same or similar elements unless otherwise represented.

Additionally, terms in the text indicating relative spatial position, such as "front," "back," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

First Embodiment

FIG. 1A is a cross-sectional view of a micro-light emitting diode (micro-LED) structure 1000, according to a first embodiment of the present disclosure. As illustrated in FIG. 1A, the micro-LED structure 1000 includes a first type conductive layer 101, a second type conductive layer 102 stacked on the first type conductive layer 101, and a light emitting layer 103 formed between the first type conductive layer 101 and the second type conductive layer 102. The light emitting layer 103 extends along a horizontal level away from a top edge 101*a* of the first type conductive layer 101 and a bottom edge 102*a* of the second type conductive layer 102, such that an edge 103*a* of the light emitting layer 103 and does not contact the top edge 101*a* of the first type conductive layer 101 and the bottom edge 102*a* of the second type conductive layer 102. The bottom edge 102*a* of the second type conductive layer 102 is aligned with the top edge 101*a* of the first type conductive layer 101.

The first type conductive layer 101 and the second type conductive layer 102 may be any type of conductive layers. In one embodiment, the first type conductive layer 101 may be an n-type conductive semiconductor containing one or more n-type dopants, and the second type conductive layer 102 may be a p-type conductive semiconductor layer containing one or more p-type dopants. In another embodiment, the first type conductive layer 101 may be a p-type conductive semiconductor, and the second type conductive layer 102 may be an n-type conductive semiconductor layer. As illustrated in FIG. 1A, a top area of the first type conductive layer 101 is larger than a bottom area of the first type conductive layer 101. A top area of the second type conductive layer 102 is smaller than a bottom area of the second type conductive layer 102.

The light emitting layer 103 may have a quantum well structure in which quantum well layers and barrier layers are alternately stacked. In one embodiment, the light emitting layer 103 may include one pair of quantum well layers and a barrier layer interposed between the quantum well layers. In another embodiment, the light emitting layer 103 may include multiple pairs of quantum well layers and a barrier layer interposed between adjacent quantum well layers. The quantum well layers are made of, for example, GaAs, AlGaAs, InGaAs, GaAsP, AlGaInP, GaInAsP, GaInP, AlInP, GaP, InP, or the like. The barrier layers are formed of, for example, GaAs, AlGaAs, InGaAs, GaAsP, AlGaInP, GaInAsP, GaInP, AlInP, GaP, InP, or the like.

As illustrated in FIG. 1A, the micro-LED structure 1000 also includes a top spacer 107 formed on a top surface 103*b* of the light emitting layer 103, and a bottom spacer 108 formed on a bottom surface 103*c* of the light emitting layer 103. The top spacer 107 and the bottom spacer 108 may be made of GaAs, AlGaAs, InGaAs, GaAsP, AlGaInP, GaInAsP, GaInP, AlInP, GaP, InP or the like. The top spacer 107 and the bottom spacer 108 are configured to control the carrier injection efficiency to improve the performance and reliability of the micro-LED. An edge 107*a* of the top spacer 107 and an edge 108*a* of the bottom spacer 108 are aligned with the edge 103*a* of the light emitting layer 103. A thickness of the top spacer 107 is larger than a thickness of the light emitting layer 103. A thickness of the bottom spacer 108 is larger than the thickness of the light emitting layer 103.

In the embodiment illustrated in FIG. 1A, the micro-LED structure 1000 further includes a reflective structure 104 surrounding the first type conductive layer 101. The reflective structure 104 is attached on a sidewall surface 101*b* of the first type conductive layer 101. The reflective structure 104 on the sidewall of the first type conductive layer 101 is inclined relative to a surface 110*a* of a substrate 110. An inclined angle of the reflective structure 104 is approximately 30° to approximately 75° relative to the surface 110*a* of the substrate 110. The reflective structure 104 on the sidewall surface 101*b* of the first type conductive layer 101 is made of an ODR (omnidirectional reflector) structure or a DBR (distributed bragg reflection) structure. The reflective structure 104 is configured to focus light on the second type conductive layer 102.

In the embodiment illustrated in FIG. 1A, the micro-LED structure 1000 further includes a bottom connection structure 105 formed under the first type conductive layer 101, and electrically connected with the first type conductive layer 101. The bottom connection structure 105 may be formed of electrically conductive material, such as, for example, metal. The bottom connection structure 105 may be reflective.

As illustrated in FIG. 1A, the micro-LED structure 1000 further includes the substrate 110 under the first type conductive layer 101, and is electrically connected with the bottom connection structure 105 by a connecting pad 106 in the substrate 110. In some embodiments, the substrate 110 may be made of one of more of the materials from the III-V groups, such as, for example, GaN. In some other embodiments, the substrate 110 may include an IC circuit. The connecting pad 106 may be made of conductive materials, such as, for example, Cu.

As illustrated in FIG. 1A, the micro-LED structure 1000 further includes an isolation layer 109 surrounding the first type conductive layer 101 and under the light emitting layer 103. The isolation layer 109 may be made of a light absorption material which includes, for example, impurity doped $SiO_2$ or $Si_3N_4$.

As illustrated in FIG. 1A, the micro-LED structure 1000 further includes a microlens 111 formed on the second type conductive layer 102 and on a top surface of 107b the top spacer 107. The microlens 111 is configured to converge light emitted by the light emitting layer 103.

First Variation of First Embodiment

Figure 1B:
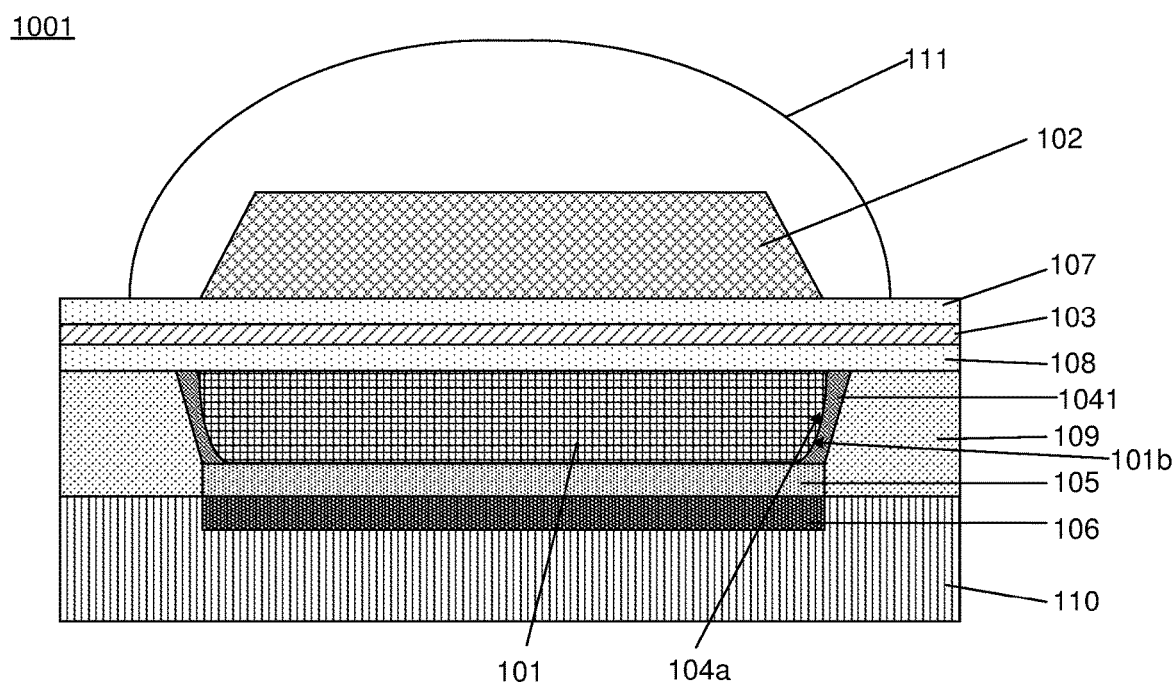
FIG. 1B is a cross-sectional view of a micro-LED structure, according to a first variation of the first embodiment of the present disclosure.

FIG. 1B is a cross-sectional view of a micro-LED structure 1001, according to a first variation of the first embodiment of the present disclosure. The embodiment illustrated in FIG. 1B differs from the embodiment illustrated in FIG. 1A in that the sidewall surface 101b of the first type conductive layer 101 is curved, and a reflective structure 1041 is formed on the sidewall surface 101b of the first type conductive layer 101 has a curved surface 104a. Except for the reflective structure 1041, the components of the micro-LED structure 1001 illustrated in FIG. 1B are the same as the components of the micro-LED structure 1000 illustrated in FIG. 1A, and therefore detailed descriptions of these components are not repeated.

Second Variation of First Embodiment

Figure 1C:
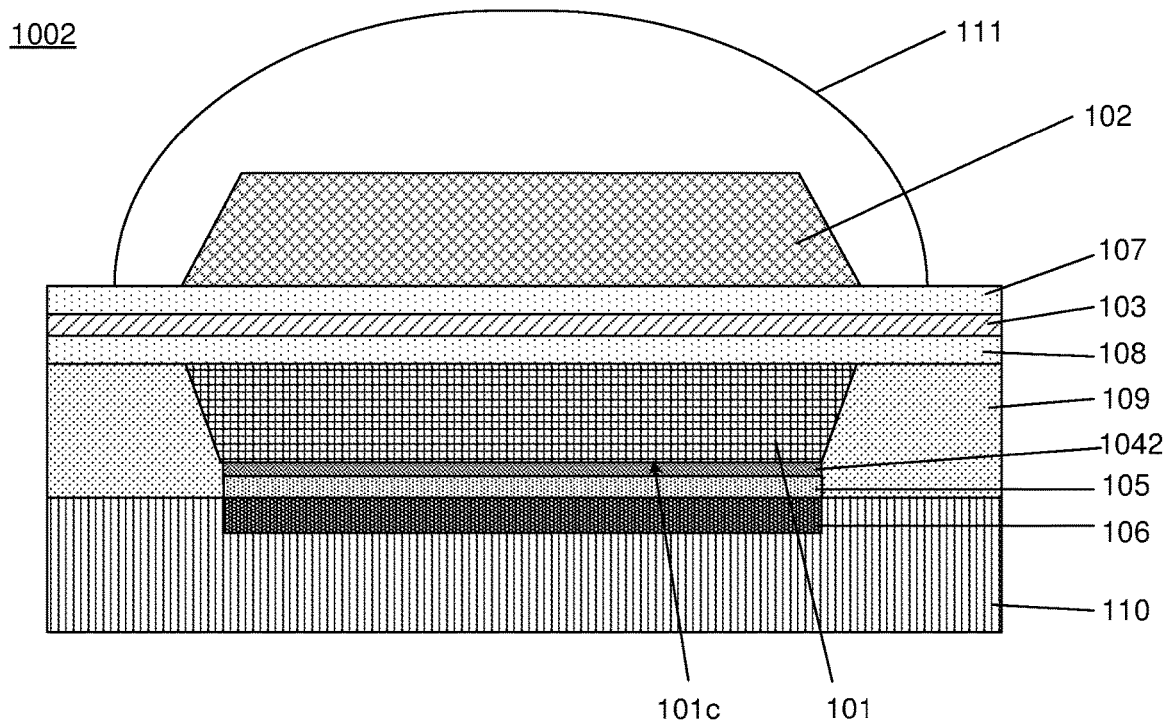
FIG. 1C is a cross-sectional view of a micro-LED structure, according to a second variation of the first embodiment of the present disclosure.

FIG. 1C is a cross-sectional view of a micro-LED structure 1002, according to a second variation of the first embodiment of the present disclosure. The embodiment illustrated in FIG. 1C differs from the embodiment illustrated in FIG. 1A in that a reflective structure 1042 is attached on a bottom surface 101c of the first type conductive layer 101. The reflective structure 1042 is electrically conductive. The bottom connection structure 105 is formed at the bottom of the reflective structure 1042, and is electrically connected with the reflective structure 1042. The reflective structure 1042 on the bottom surface 101c of the first type conductive layer 101 may be made of metal. Except for the reflective structure 1042, the components of the micro-LED structure 1002 illustrated in FIG. 1C are the same as the components of the micro-LED structure 1000 illustrated in FIG. 1A, and therefore detailed descriptions of these components are not repeated.

Third Variation of First Embodiment

Figure 1D:
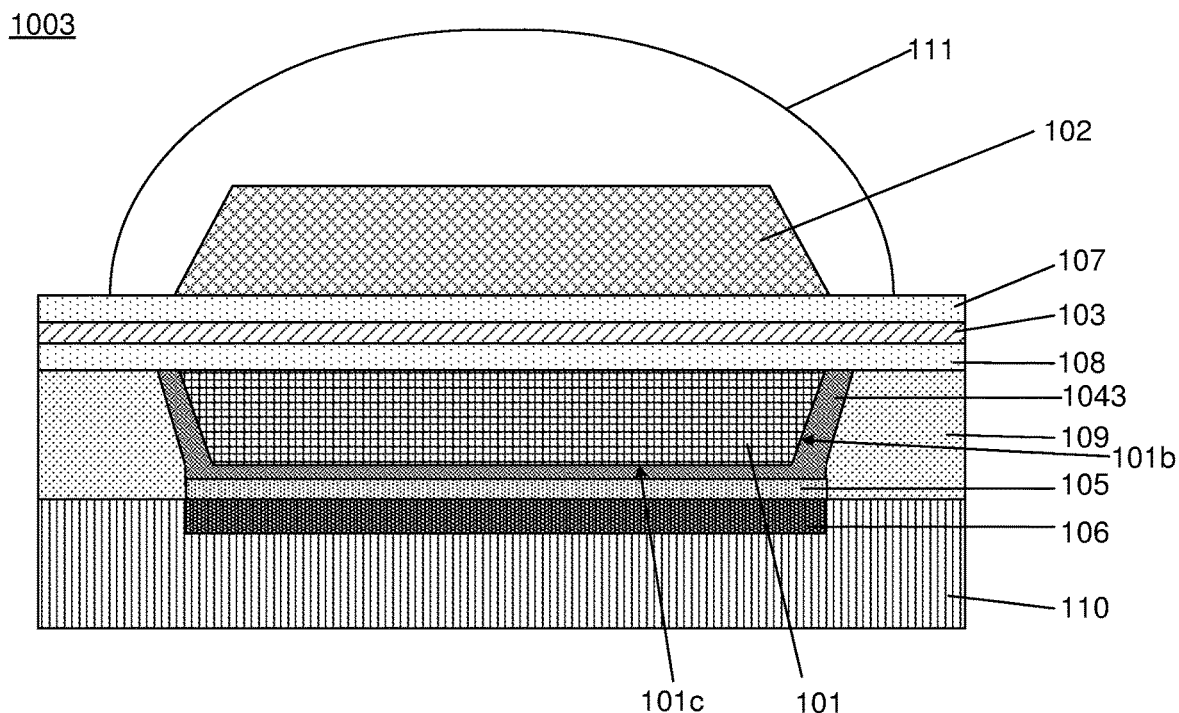
FIG. 1D is a cross-sectional view of a micro-LED structure, according to a third variation of the first embodiment of the present disclosure.

FIG. 1D is a cross-sectional view of a micro-LED structure 1003, according to a third variation of the first embodiment of the present disclosure. The embodiment illustrated in FIG. 1D differs from the embodiment illustrated in FIG. 1A in that a reflective structure 1043 is attached on both of the sidewall surface 101b and the bottom surface 101c of the first type conductive layer 101. The reflective structure 1043 is electrically conductive. The bottom connection structure 105 is formed at the bottom of the reflective structure 1043, and is electrically connected with the reflective structure 1043. Except for the reflective structure 1043, the components of the micro-LED structure 1003 illustrated in FIG. 1D are the same as the components of the micro-LED structure 1000 illustrated in FIG. 1A, and therefore detailed descriptions of these components are not repeated.

Second Embodiment

Figure 2A:
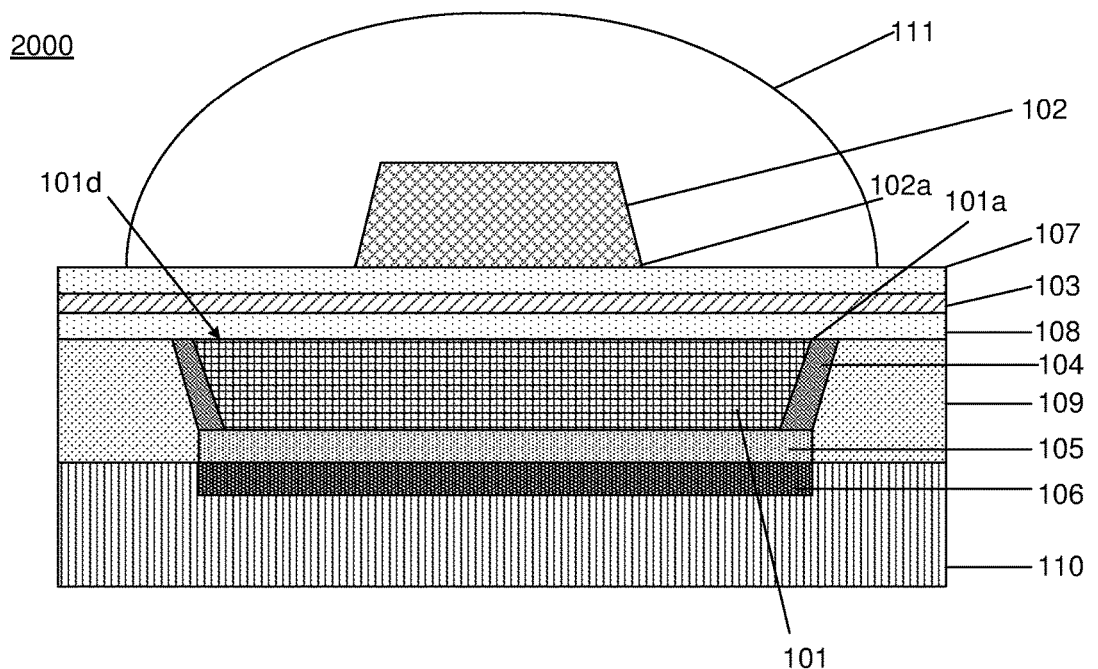
FIG. 2A is a cross-sectional view of a micro-LED structure, according to a second embodiment of the present disclosure.

FIG. 2A is a cross-sectional view of a micro-LED structure 2000, according to a second embodiment of the present disclosure. The second embodiment illustrated in FIG. 2A differs from the first embodiment illustrated in FIG. 1A in that the bottom edge 102a of the second type conductive layer 102 is not aligned with the top edge 101a of the first type conductive layer 101. Instead, a profile of the second type conductive layer 102 perpendicularly projected on the top surface 101d of the first type conductive layer 101 is surrounded by the top edge 101a of the first type conductive layer 101. The components of the micro-LED structure 2000 of the second embodiment illustrated in FIG. 2A are the same as the components of the micro-LED structure 1000 of the first embodiment illustrated in FIG. 1A, and therefore detailed descriptions of these components are not repeated.

First Variation of Second Embodiment

Figure 2B:
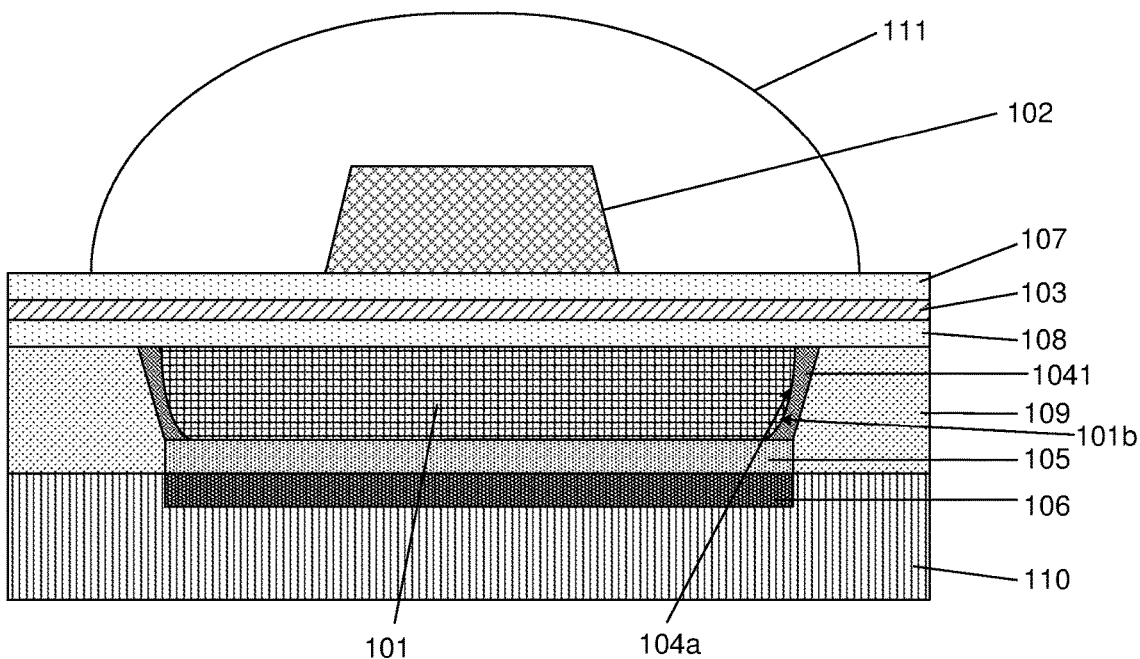
FIG. 2B is a cross-sectional view of a micro-LED structure, according to a first variation of the second embodiment of the present disclosure.

FIG. 2B is a cross-sectional view of a micro-LED structure 2001, according to a first variation of the second embodiment of the present disclosure. The embodiment illustrated in FIG. 2B differs from the embodiment illustrated in FIG. 2A in that the sidewall surface 101b of the first type conductive layer 101 is curved, and the reflective structure 1041 is formed on the sidewall surface 101b of the first type conductive layer 101 has the curved surface 104a. Except for the reflective structure 1041, the components of the micro-LED structure 2001 illustrated in FIG. 2B are the same as the components of the micro-LED structure 2000 illustrated in FIG. 2A, and therefore detailed descriptions of these components are not repeated.

Second Variation of Second Embodiment

Figure 2C:
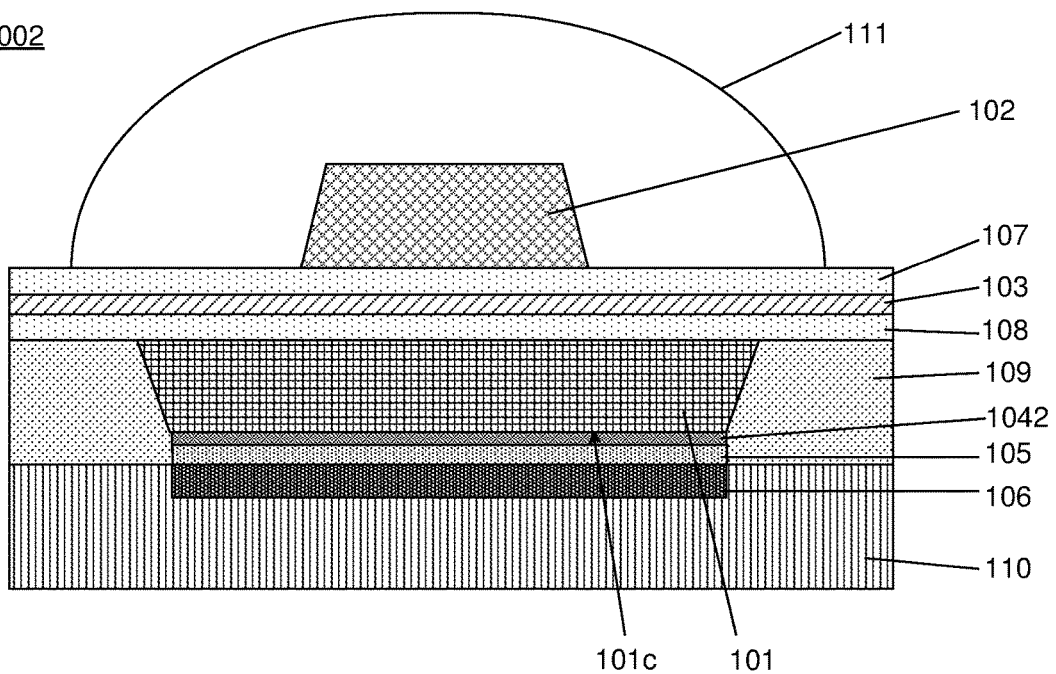
FIG. 2C is a cross-sectional view of a micro-LED structure, according to a second variation of the second embodiment of the present disclosure.

FIG. 2C is a cross-sectional view of a micro-LED structure 2002, according to a second variation of the second embodiment of the present disclosure. The embodiment illustrated in FIG. 2C differs from the embodiment illustrated in FIG. 2A in that the reflective structure 1042 is attached on the bottom surface 101c of the first type conductive layer 101. The reflective structure 1042 is electrically conductive. The bottom connection structure 105 is formed at the bottom of the reflective structure 1042, and is electrically connected with the bottom of the reflective structure 1042. The reflective structure 1042 on the bottom surface 101c of the first type conductive layer 101 may be made of metal. Except for the reflective structure 1042, the components of the micro-LED structure 2002 illustrated in FIG. 2C are the same as the components of the micro-LED structure 2000 illustrated in FIG. 2A, and therefore detailed descriptions of these components are not repeated.

Third Variation of Second Embodiment

Figure 2D:
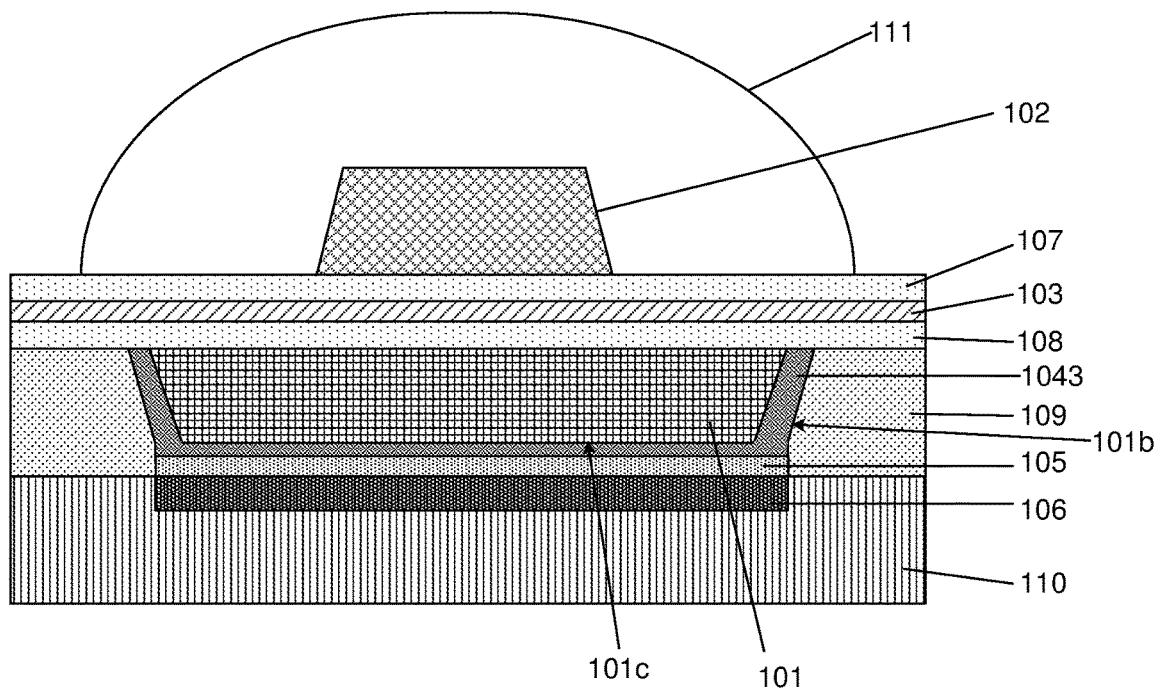
FIG. 2D is a cross-sectional view of a micro-LED structure, according to a third variation of the second embodiment of the present disclosure.

FIG. 2D is a cross-sectional view of a micro-LED structure 2003, according to a third variation of the second embodiment of the present disclosure. The embodiment illustrated in FIG. 2D differs from the embodiment illustrated in FIG. 2A in that the reflective structure 1043 is attached on both of the sidewall surface 101b and the bottom surface 101c of the first type conductive layer 101. The reflective structure 1043 is electrically conductive. The bottom connection structure 105 is formed at the bottom of the reflective structure 1043, and is electrically connected with the reflective structure 1043. Except for the reflective structure 1043, the components of the micro-LED structure 2003 illustrated in FIG. 2D are the same as the components of the micro-LED structure 2000 illustrated in FIG. 2A, and therefore detailed descriptions of these components are not repeated.

Third Embodiment

Figure 3A:
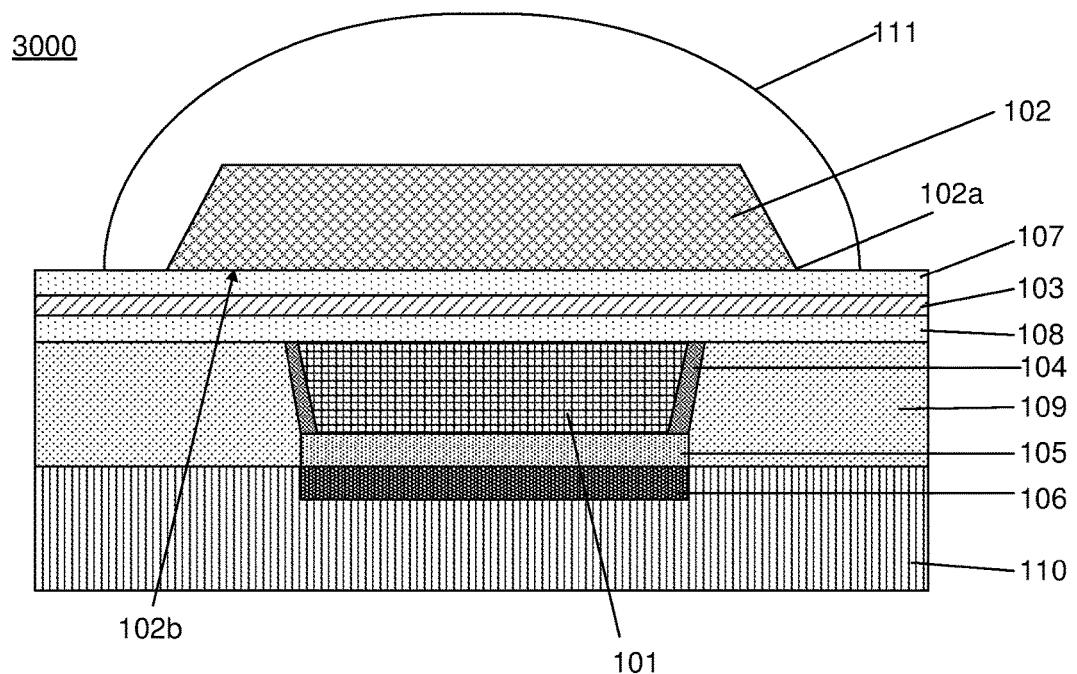
FIG. 3A is a cross-sectional view of a micro-LED structure, according to a third embodiment of the present disclosure.

FIG. 3A is a cross-sectional view of a micro-LED structure 3000, according to a third embodiment of the present disclosure. The third embodiment illustrated in FIG. 3A differs from the first embodiment illustrated in FIG. 1A in that the bottom edge 102a of the second type conductive layer 102 is not aligned with the top edge 101a of the first type conductive layer 101. Instead, a profile of the first type conductive layer 101 perpendicularly projected on a bottom surface 102b of the second type conductive layer 102 is surrounded by the bottom edge 102a of the second type conductive layer 102. The components of the micro-LED structure 3000 of the third embodiment illustrated in FIG. 3A are the same as the components of the micro-LED structure 1000 of the first embodiment illustrated in FIG. 1A, and therefore detailed descriptions of these components are not repeated.

First Variation of Third Embodiment

Figure 3B:
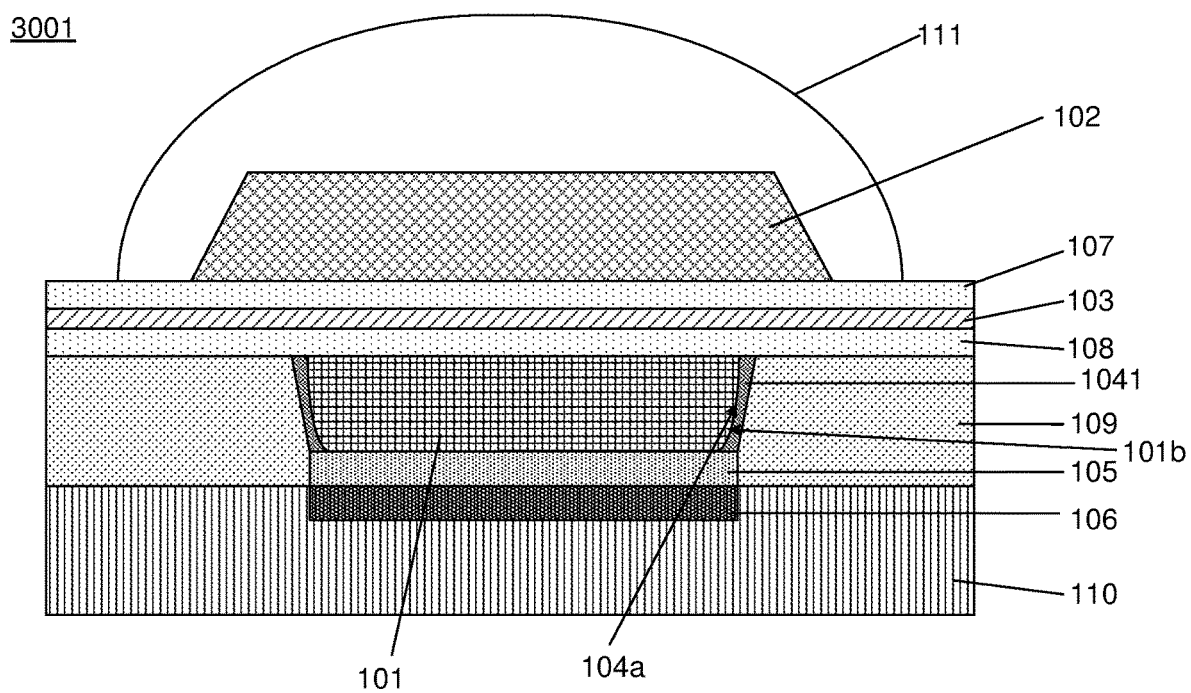
FIG. 3B is a cross-sectional view of a micro-LED structure, according to a first variation of the third embodiment of the present disclosure.

FIG. 3B is a cross-sectional view of a micro-LED structure 3001, according to a first variation of the third embodiment of the present disclosure. The embodiment illustrated in FIG. 3B differs from the embodiment illustrated in FIG. 3A in that the sidewall surface 101b of the first type conductive layer 101 is curved, and the reflective structure 1041 is formed on the sidewall surface 101b of the first type conductive layer 101 has the curved surface 104a. Except for the reflective structure 104, the components of the micro-LED structure 3001 illustrated in FIG. 3B are the same as the components of the micro-LED structure 3000 illustrated in FIG. 3A, and therefore detailed descriptions of these components are not repeated.

Second Variation of Third Embodiment

Figure 3C:
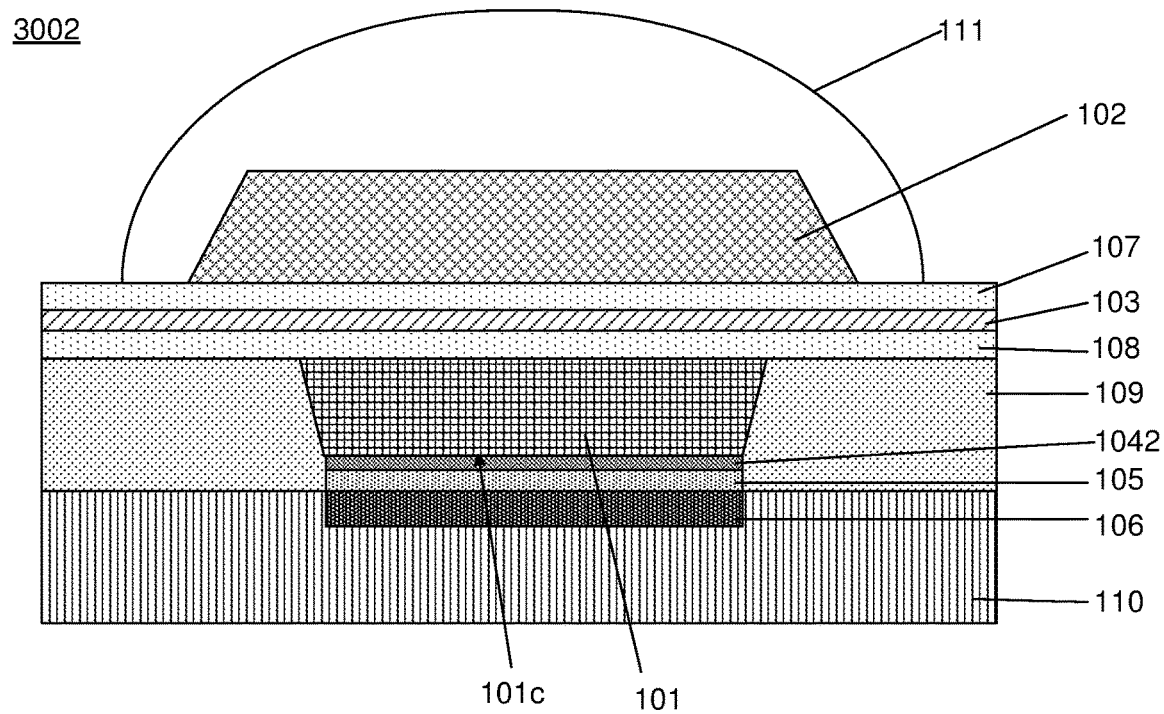
FIG. 3C is a cross-sectional view of a micro-LED structure, according to a second variation of the third embodiment of the present disclosure.

FIG. 3C is a cross-sectional view of a micro-LED structure 3002, according to a second variation of the third embodiment of the present disclosure. The embodiment illustrated in FIG. 3C differs from the embodiment illustrated in FIG. 3A in that the reflective structure 1042 is attached on the bottom surface 101c of the first type conductive layer 101. The reflective structure 1042 is electrically conductive. The bottom connection structure 105 is formed at the bottom of the reflective structure 1042, and is electrically connected with the bottom of the reflective structure 1042. The reflective structure 1042 on the bottom surface 101c of the first type conductive layer 101 may be made of metal. Except for the reflective structure 1042, the components of the micro-LED structure 3002 illustrated in FIG. 3C are the same as the components of the micro-LED structure 3000 illustrated in FIG. 3A, and therefore detailed descriptions of these components are not repeated.

Third Variation of Third Embodiment

Figure 3D:
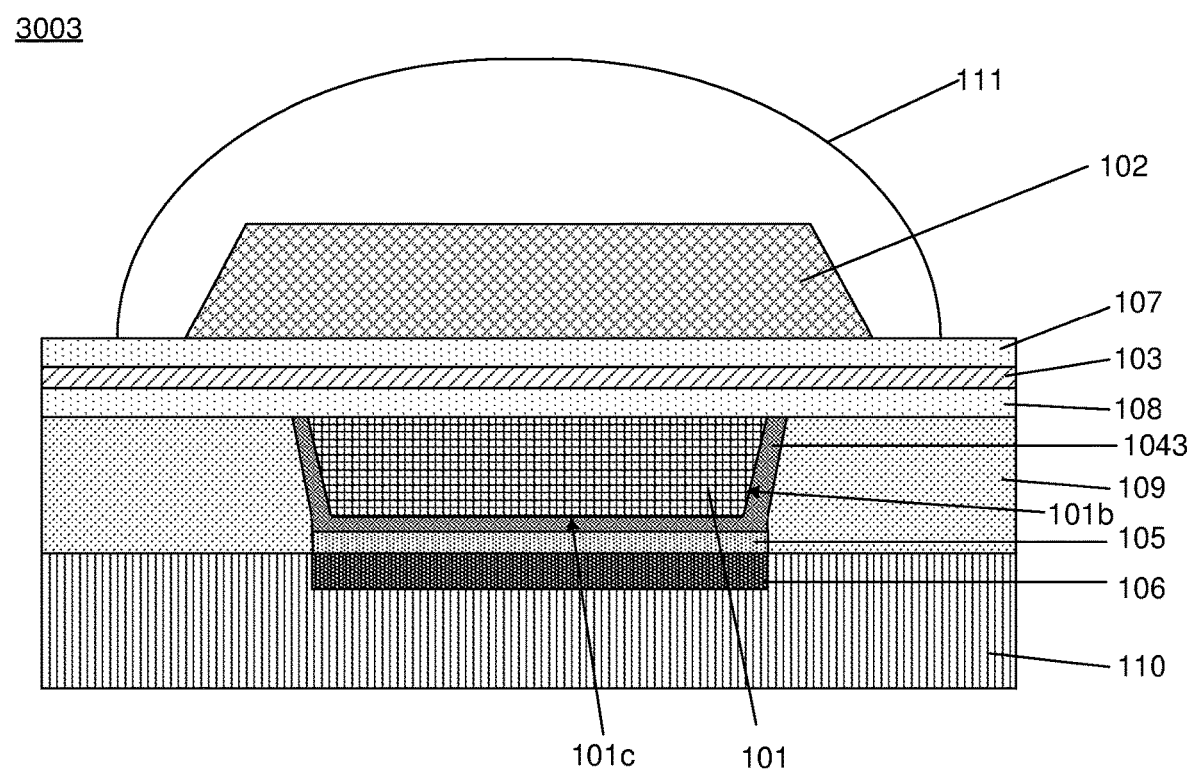
FIG. 3D is a cross-sectional view of a micro-LED structure, according to a third variation of the third embodiment of the present disclosure.

FIG. 3D is a cross-sectional view of a micro-LED structure 3003, according to a third variation of the third embodiment of the present disclosure. The embodiment illustrated in FIG. 3D differs from the embodiment illustrated in FIG. 3A in that the reflective structure 1043 is attached on both of the sidewall surface 101b and the bottom surface 101c of the first type conductive layer 101. The reflective structure 1043 is electrically conductive. The bottom connection structure 105 is formed at the bottom of the reflective structure 1043, and is electrically connected with the reflective structure 1043. Except for the reflective structure 1042, the components of the micro-LED structure 3003 illustrated in FIG. 3D are the same as the components of the micro-LED structure 3000 illustrated in FIG. 3A, and therefore detailed descriptions of these components are not repeated.

Fourth Embodiment

Figure 4A:
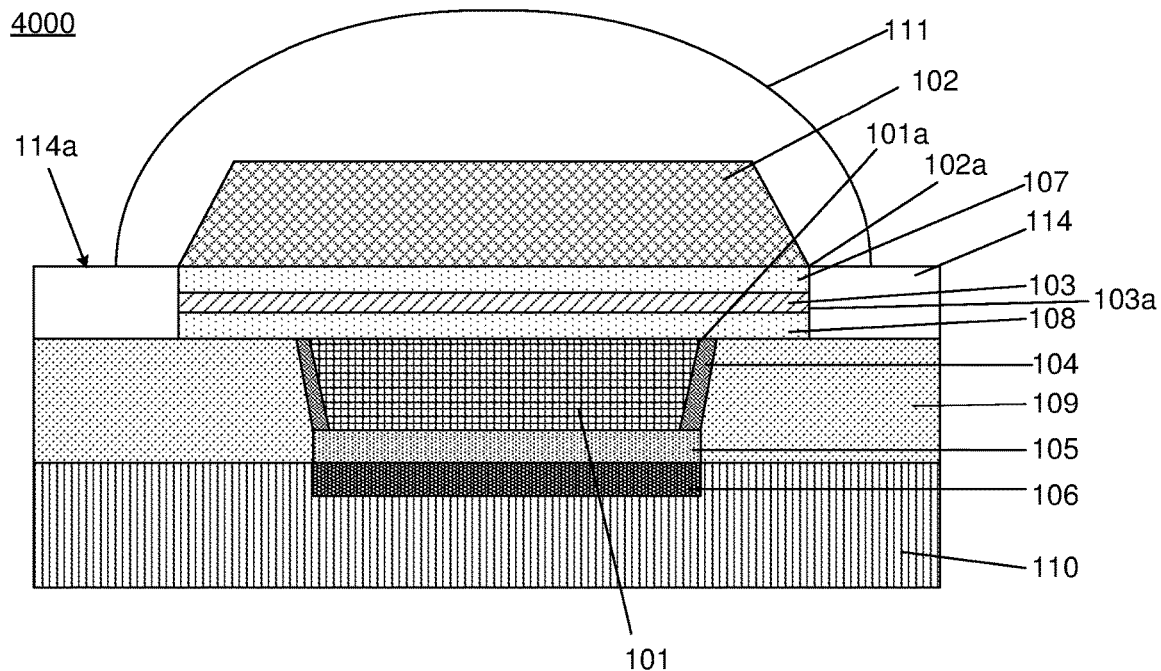
FIG. 4A is a cross-sectional view of a micro-LED structure, according to a fourth embodiment of the present disclosure.

FIG. 4A is a cross-sectional view of a micro-LED structure 4000, according to a fourth embodiment of the present disclosure. The fourth embodiment illustrated in FIG. 4A differs from the third embodiment illustrated in FIG. 3A in that the light emitting layer 103 extends along a horizontal level away from the top edge 101a of the first type conductive layer 101, and the edge 103a of the light emitting layer 103 is aligned with the bottom edge 102a of the second type conductive layer 102. In addition, the micro-LED structure 4000 further includes a top isolation layer 114 surrounding the light emitting layer 103. The top isolation layer 114 may be made of one or more electrical insulating dielectric materials, such as, for example, $SiO_2$, $Si_3N_4$, $Al_2O_3$, $TiO_2$, $HfO_2$, AlN or the like. The top isolation layer 114 is configured to isolate the micro-LED structure 4000 from an adjacent micro-LED structure (not shown). The microlens 111 is formed on the second type conductive layer 102 and on a top surface 114a of the isolation layer 114. The other components of the micro-LED structure 4000 of the fourth embodiment illustrated in FIG. 4A are the same as the components of the micro-LED structure 3000 of the first embodiment illustrated in FIG. 3A, and therefore detailed descriptions of these components are not repeated.

First Variation of Fourth Embodiment

Figure 4B:
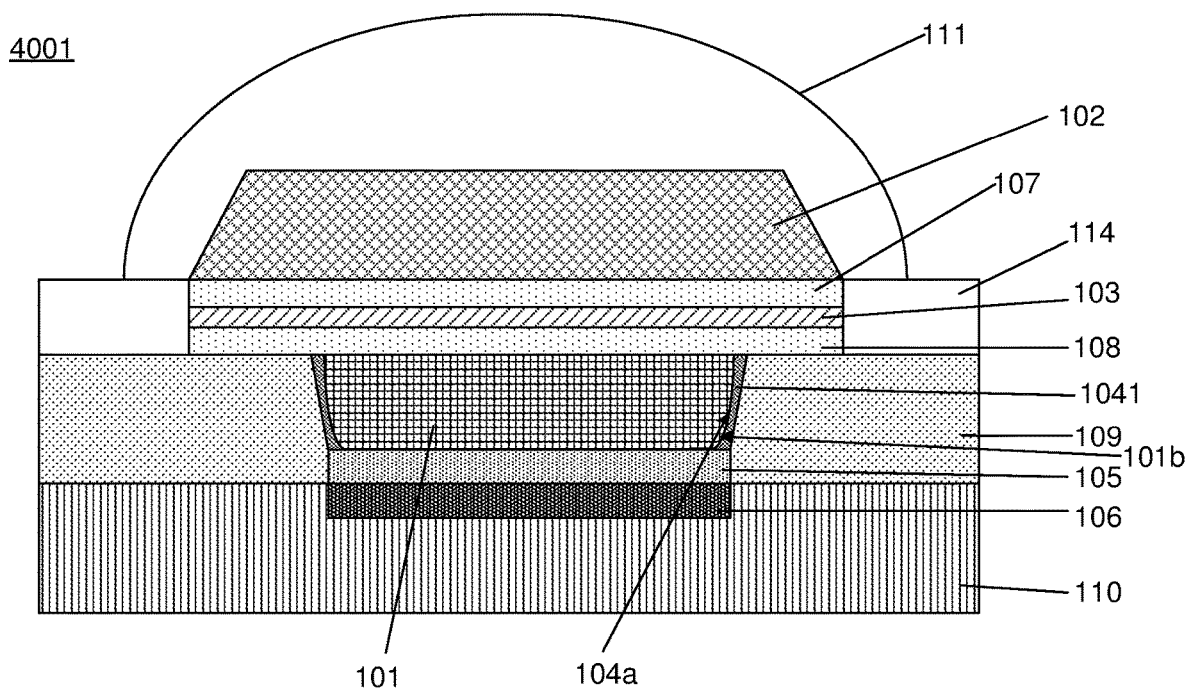
FIG. 4B is a cross-sectional view of a micro-LED structure, according to a first variation of the fourth embodiment of the present disclosure.

FIG. 4B is a cross-sectional view of a micro-LED structure 4001, according to a first variation of the fourth embodiment of the present disclosure. The embodiment illustrated in FIG. 4B differs from the embodiment illustrated in FIG. 4A in that the sidewall surface 101b of the first type conductive layer 101 is curved, and the reflective structure 1041 is formed on the sidewall surface 101b of the first type conductive layer 101 and has the curved surface 104a. Except for the reflective structure 1041, the components of the micro-LED structure 4001 illustrated in FIG. 4B are the same as the components of the micro-LED structure 4000 illustrated in FIG. 4A, and therefore detailed descriptions of these components are not repeated.

Second Variation of Fourth Embodiment

Figure 4C:
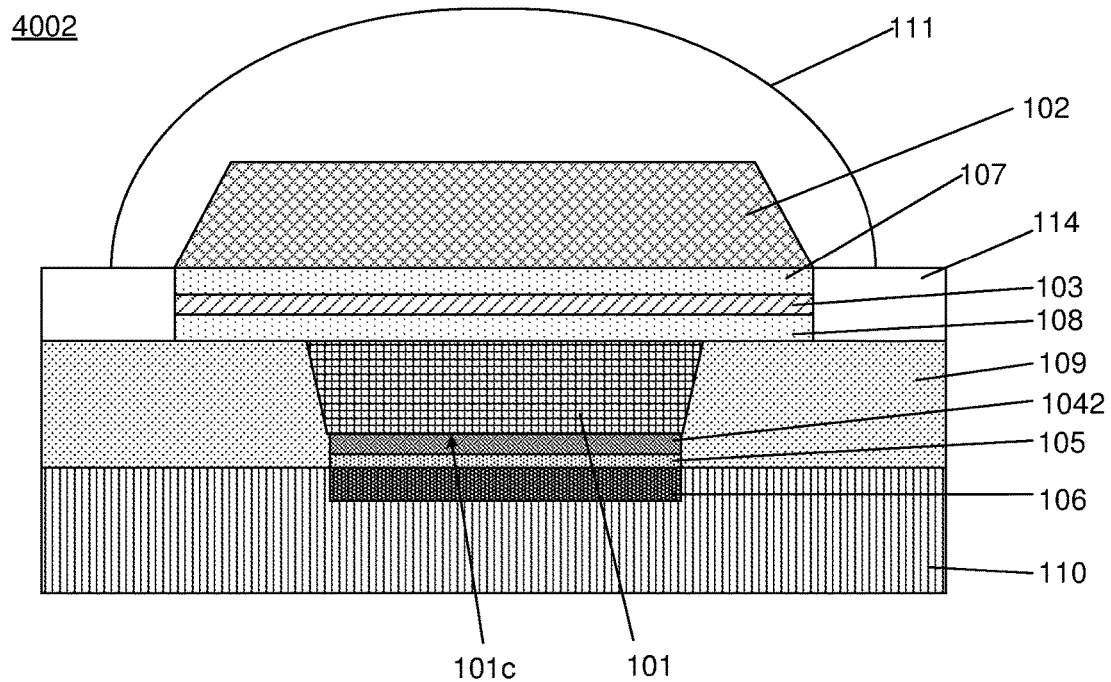
FIG. 4C is a cross-sectional view of a micro-LED structure, according to a second variation of the fourth embodiment of the present disclosure.

FIG. 4C is a cross-sectional view of a micro-LED structure 4002, according to a second variation of the fourth embodiment of the present disclosure. The embodiment illustrated in FIG. 4C differs from the embodiment illustrated in FIG. 4A in that the reflective structure 1042 is attached on the bottom surface 101c of the first type conductive layer 101. The reflective structure 1042 is electrically conductive. The bottom connection structure 105 is formed at the bottom of the reflective structure 1042, and is electrically connected with the bottom of the reflective structure 1042. The reflective structure 1042 on the bottom surface 101c of the first type conductive layer 101 may be made of metal. Except for the reflective structure 1042, the components of the micro-LED structure 4002 illustrated in FIG. 4C are the same as the components of the micro-LED structure 4000 illustrated in FIG. 4A, and therefore detailed descriptions of these components are not repeated.

Third Variation of Fourth Embodiment

Figure 4D:
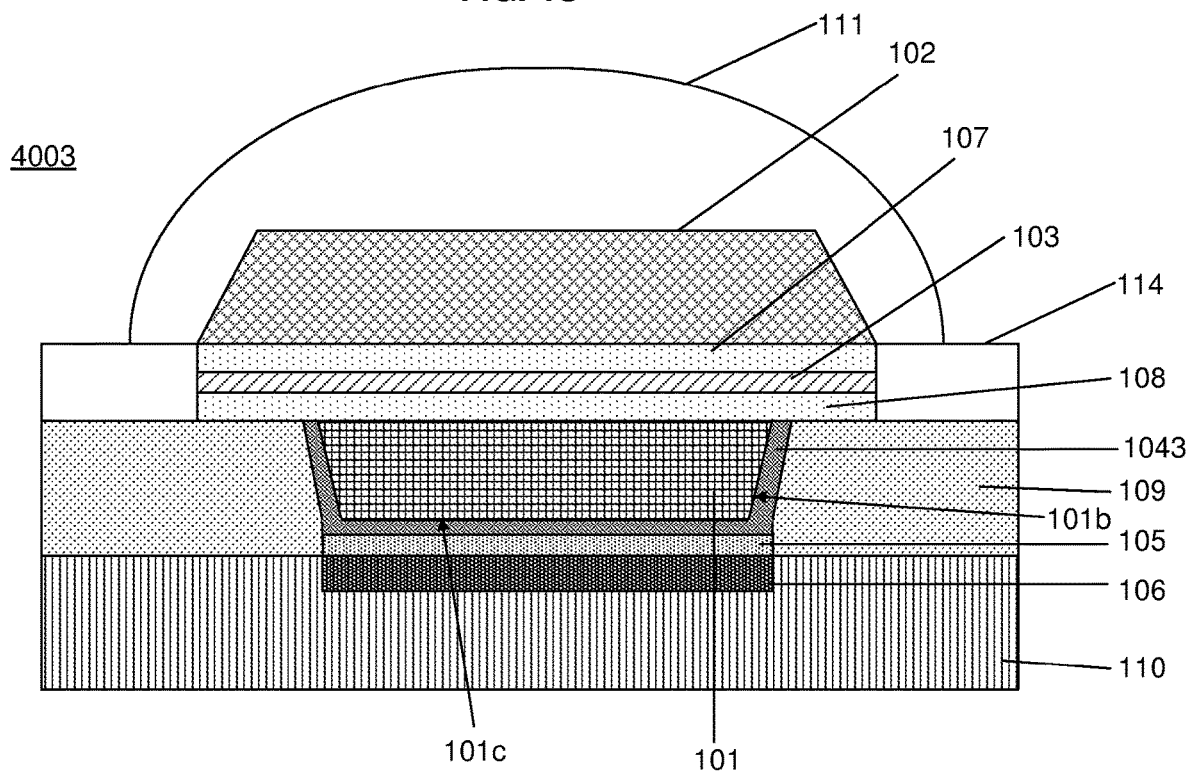
FIG. 4D is a cross-sectional view of a micro-LED structure, according to a third variation of the fourth embodiment of the present disclosure.

FIG. 4D is a cross-sectional view of a micro-LED structure 4003, according to a third variation of the fourth embodiment of the present disclosure. The embodiment illustrated in FIG. 4D differs from the embodiment illustrated in FIG. 4A in that the reflective structure 1043 is attached on both of the sidewall surface 101*b* and the bottom surface 101*c* of the first type conductive layer 101. The reflective structure 1043 is electrically conductive. The bottom connection structure 105 is formed at the bottom of the reflective structure 1043, and is electrically connected with the reflective structure 1043. Except for the reflective structure 1042, the components of the micro-LED structure 4003 illustrated in FIG. 4D are the same as the components of the micro-LED structure 4000 illustrated in FIG. 4A, and therefore detailed descriptions of these components are not repeated.

Fifth Embodiment

Figure 5A:
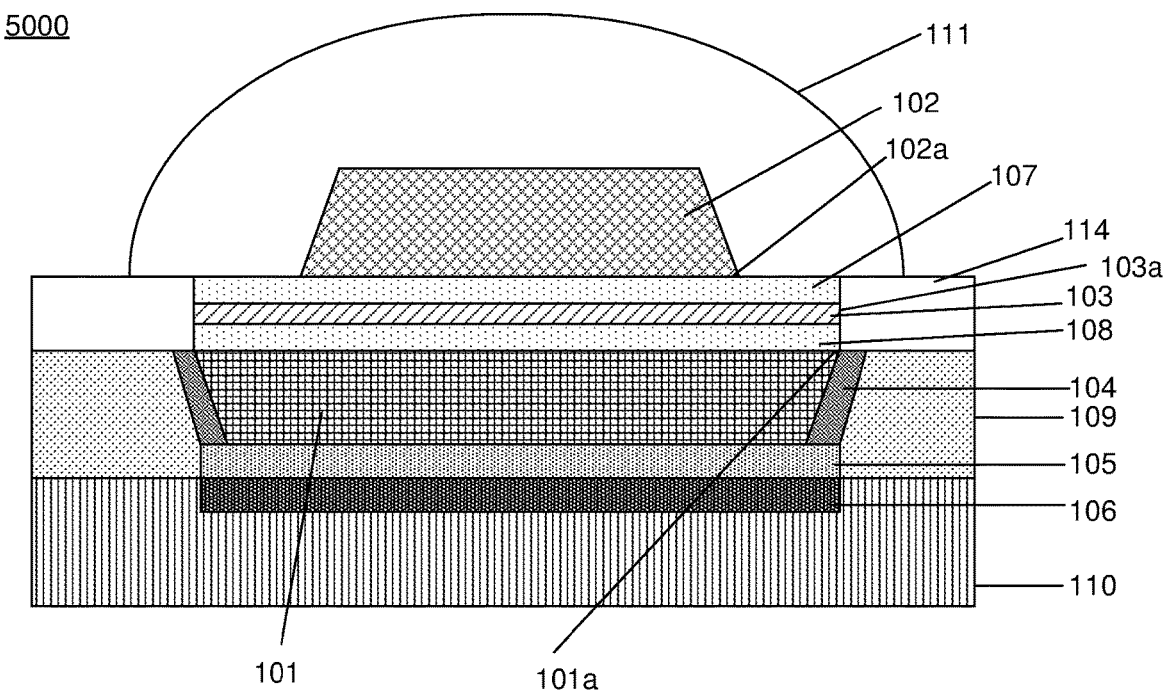
FIG. 5A is a cross-sectional view of a micro-LED structure, according to a fifth embodiment of the present disclosure.

FIG. 5A is a cross-sectional view of a micro-LED structure 5000, according to a fifth embodiment of the present disclosure. The fifth embodiment illustrated in FIG. 5A differs from the second embodiment illustrated in FIG. 2A in that the light emitting layer 103 extends along a horizontal level from the bottom edge 102*a* of the second type conductive layer 102, and the edge 103*a* of the light emitting layer 103 is aligned with the top edge 101*a* of the first type conductive layer 101. In addition, the micro-LED structure 4000 further includes the top isolation layer 114 surrounding the light emitting layer 103. The microlens 111 is formed on the second type conductive layer 102 and on the top surface 114*a* of the isolation layer 114. The other components of the micro-LED structure 5000 of the fourth embodiment illustrated in FIG. 5A are the same as the components of the micro-LED structure 2000 of the second embodiment illustrated in FIG. 2A, and therefore detailed descriptions of these components are not repeated.

First Variation of Fifth Embodiment

Figure 5B:
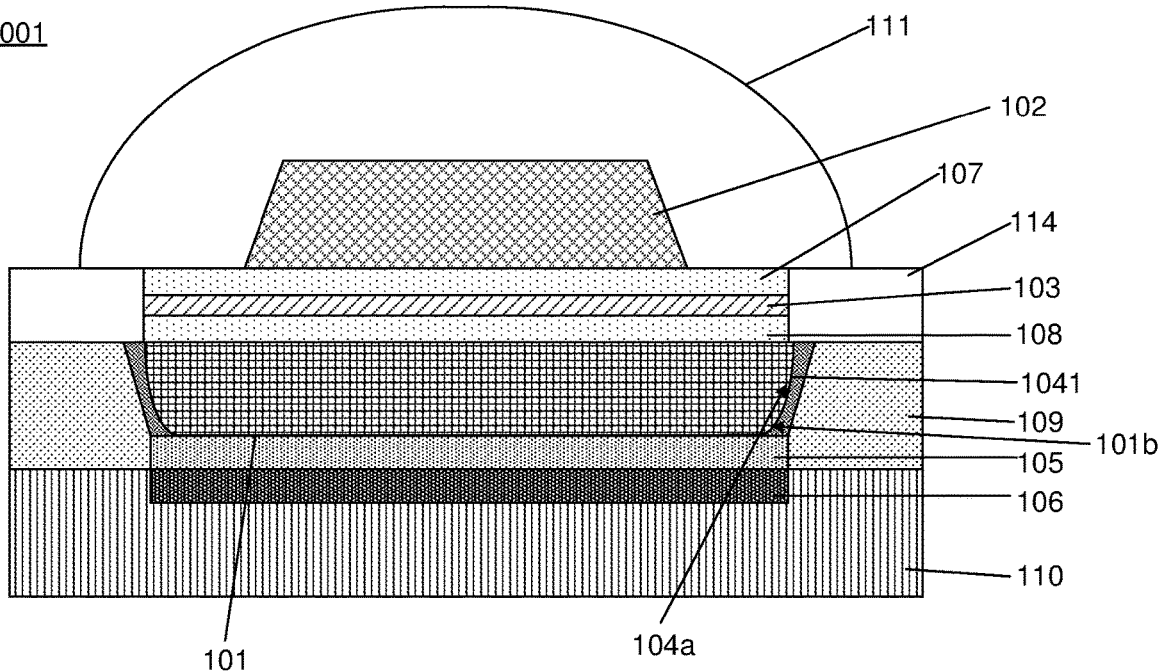
FIG. 5B is a cross-sectional view of a micro-LED structure, according to a first variation of the fifth embodiment of the present disclosure.

FIG. 5B is a cross-sectional view of a micro-LED structure 5001, according to a first variation of the fifth embodiment of the present disclosure. The embodiment illustrated in FIG. 5B differs from the embodiment illustrated in FIG. 5A in that the sidewall surface 101*b* of the first type conductive layer 101 is curved, and the reflective structure 1041 formed on the sidewall surface 101*b* of the first type conductive layer 101 has the curved surface 104*a*. Except for the reflective structure 1041, the components of the micro-LED structure 5001 illustrated in FIG. 5B are the same as the components of the micro-LED structure 5000 illustrated in FIG. 5A, and therefore detailed descriptions of these components are not repeated.

Second Variation of Fifth Embodiment

Figure 5C:
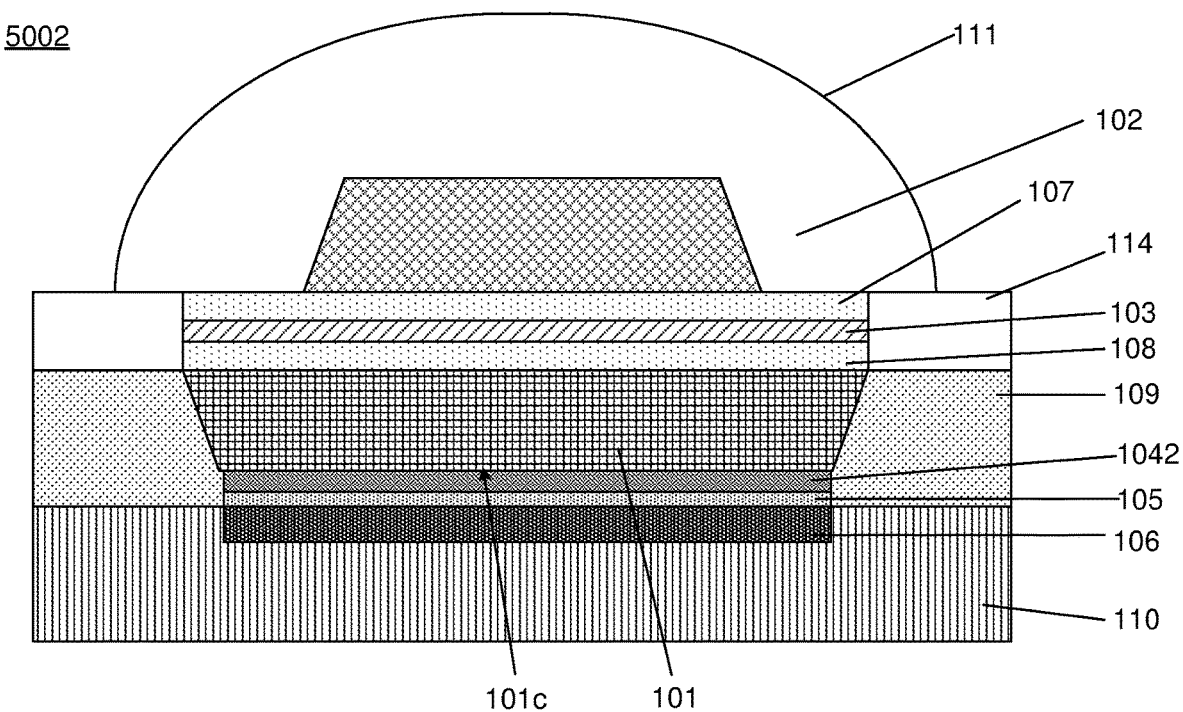
FIG. 5C is a cross-sectional view of a micro-LED structure, according to a second variation of the fifth embodiment of the present disclosure.

FIG. 5C is a cross-sectional view of a micro-LED structure 5002, according to a second variation of the fifth embodiment of the present disclosure. The embodiment illustrated in FIG. 5C differs from the embodiment illustrated in FIG. 5A in that the reflective structure 1042 is attached on the bottom surface 101*c* of the first type conductive layer 101. The reflective structure 1042 is electrically conductive. The bottom connection structure 105 is formed at the bottom of the reflective structure 1042, and is electrically connected with the bottom of the reflective structure 1042. The reflective structure 1042 on the bottom surface 101*c* of the first type conductive layer 101 is made of metal. Except for the reflective structure 1042, the components of the micro-LED structure 5002 illustrated in FIG. 5C are the same as the components of the micro-LED structure 5000 illustrated in FIG. 5A, and therefore detailed descriptions of these components are not repeated.

Third Variation of Fifth Embodiment

Figure 5D:
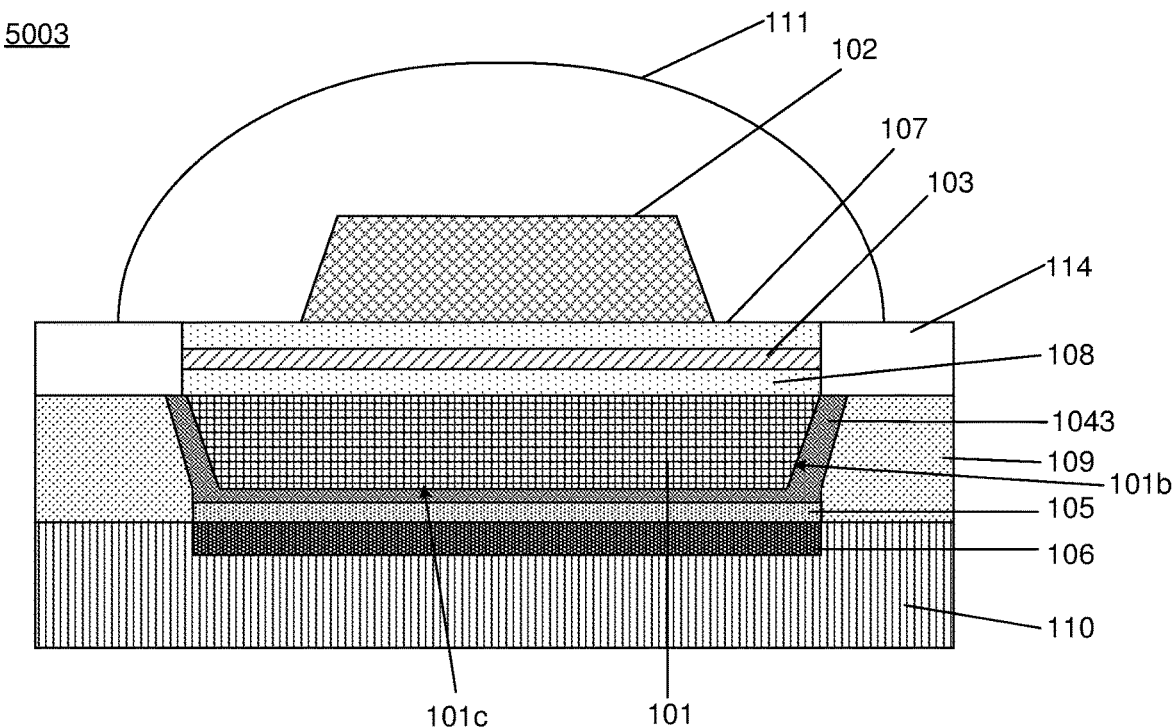
FIG. 5D is a cross-sectional view of a micro-LED structure, according to a third variation of the fifth embodiment of the present disclosure.

FIG. 5D is a cross-sectional view of a micro-LED structure 5003, according to a third variation of the fifth embodiment of the present disclosure. The embodiment illustrated in FIG. 5D differs from the embodiment illustrated in FIG. 5A in that the reflective structure 1043 is attached both on the sidewall surface 101*b* and the bottom surface 101*c* of the first type conductive layer 101. The reflective structure 1043 is electrically conductive. The bottom connection structure 105 is formed at the bottom of the reflective structure 1043, and is electrically connected with the reflective structure 1043. Except for the reflective structure 1042, the components of the micro-LED structure 5003 illustrated in FIG. 5D are the same as the components of the micro-LED structure 5000 illustrated in FIG. 5A, and therefore detailed descriptions of these components are not repeated.

Sixth Embodiment

Figure 6A:
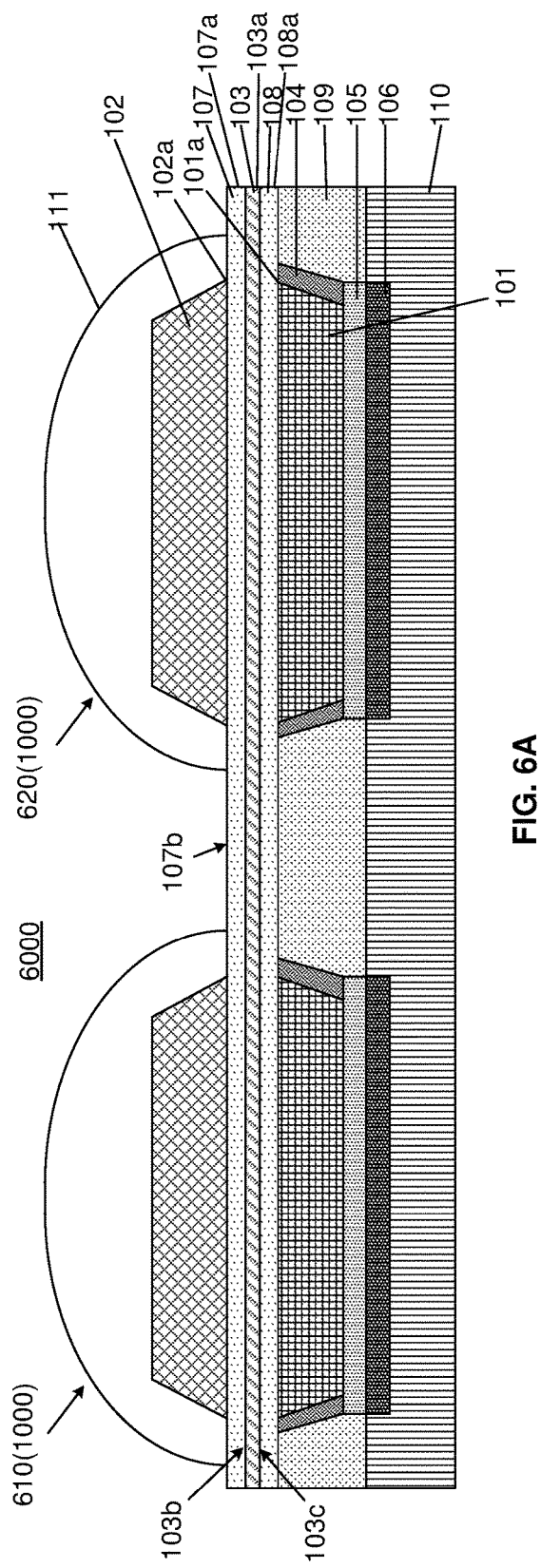
FIG. 6A is a cross-sectional view of a micro-LED chip, according to a sixth embodiment of the present disclosure.

FIG. 6A is a cross-sectional view of a micro-LED chip 6000, according to a sixth embodiment of the present disclosure. The micro-LED chip 6000 may include multiple micro-LEDs. At least one of the micro-LEDs included in the micro-LED chip 6000 may have any one of the micro-LED structures 1000, 1001, . . . 3003 described above.

In the embodiment illustrated in FIG. 6A, the micro-LED chip 6000 includes two micro-LEDs 610 and 620. Each one of the micro-LEDs 610 and 620 includes the micro-LED structure 1000 described in the first embodiment illustrated in FIG. 1A. Hereinafter in the description and in FIG. 6A, the micro-LEDs 610 and 620 in FIG. 6A are also referred to as micro-LEDs 610(1000) and 620(1000).

As illustrated in FIG. 6A, each one of the micro-LEDs 610(1000) and 620(1000) includes the first type conductive layer 101, the second type conductive layer 102 stacked on the first type conductive layer 101, and the light emitting layer 103 formed between the first type conductive layer 101 and the second type conductive layer 102. The light emitting layer 103 is continuously formed on the whole micro-LED chip 6000. The first and second micro-LEDs 610(1000) and 620(1000) share the light emitting layer 103. The light emitting layer 103 extends along a horizontal level away from the top edge 101*a* of the first type conductive layer 101 and the bottom edge 102*a* of the second type conductive layer 102, such that the edge 103*a* of the light emitting layer 103 does not contact the top edge 101*a* of the first type conductive layer 101 and the bottom edge 102*a* of the second type conductive layer 102. The bottom edge 102*a* of the second type conductive layer 102 is aligned with the top edge 101*a* of the first type conductive layer 101.

As illustrated in FIG. 6A, each one of the micro-LEDs 610(1000) and 620(1000) also includes the top spacer 107 formed on the top surface 103b of the light emitting layer 103, and the bottom spacer 108 formed on the bottom surface 103c of the light emitting layer 103. Both of the top spacer 107 and the bottom spacer 108 are continuously formed on the whole micro-LED chip 6000, and are shared by the first and second micro-LEDs 610(1000) and 620 (1000). The edge 107a of the top spacer 107 is aligned with the edge 103a of the light emitting layer 103. The edge 108a of the bottom spacer 108 is aligned with the edge 103a of the light emitting layer 103.

As illustrated in FIG. 6A, each one of the micro-LEDs 610(1000) and 620(1000) also includes the reflective structure 104 surrounding the first type conductive layer 101, the bottom connection structure 105 formed under the first type conductive layer 101, the connecting pad 106 formed in the substrate 110, the isolation layer 109 surrounding the first type conductive layer 101 and under the light emitting layer 103, the substrate 110 under the first type conductive layer 101 and electrically connected with the bottom connection structure 105 by the connecting pad 106, and the microlens 111 formed on the second type conductive layer 102 and on the top surface of 107b the top spacer 107.

Except for the light emitting layer 103, the top spacer 107, and the bottom spacer 108 that are continuously formed on the whole micro-LED chip 6000 and are shared by the first and second micro-LEDs 610(1000) and 620(1000), the components of the first and second micro-LEDs 610(1000) and 620(1000) of the sixth embodiment illustrated in FIG. 6A are the same as the components of the micro-LED structure 1000 of the first embodiment illustrated in FIG. 1A. Therefore, detailed descriptions of these components are not repeated.

First Variation of Sixth Embodiment

Figure 6B:
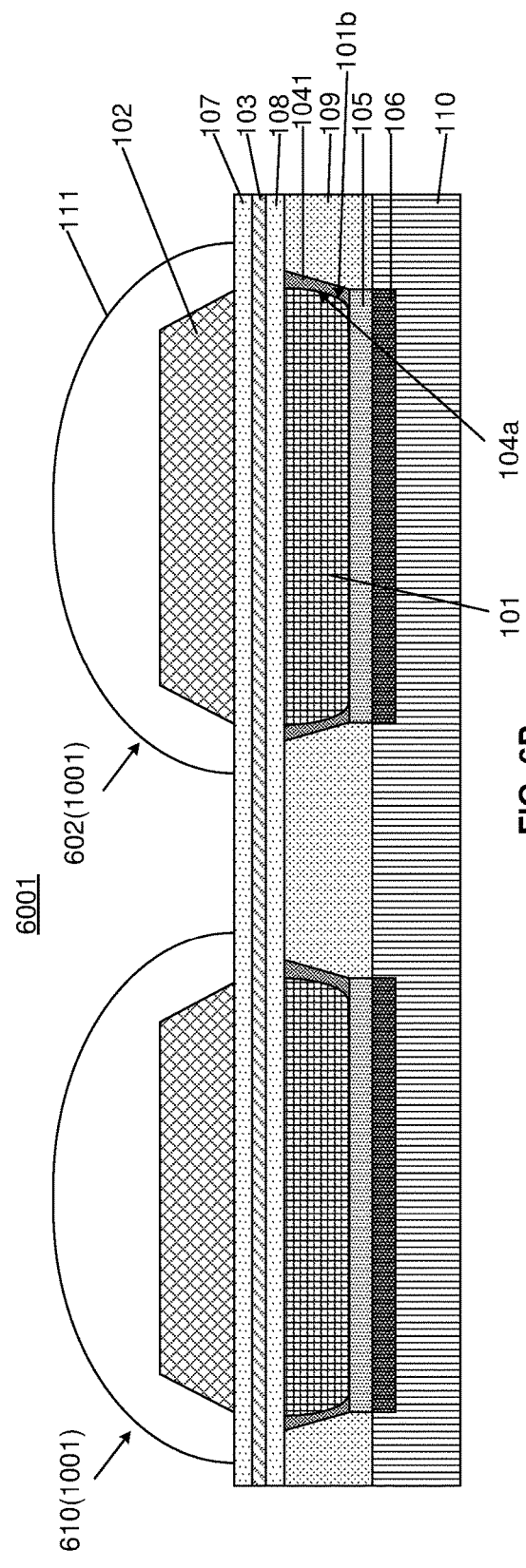
FIG. 6B is a cross-sectional view of a micro-LED chip, according to a first variation of the sixth embodiment of the present disclosure.

FIG. 6B is a cross-sectional view of a micro-LED chip 6001, according to a first variation of the sixth embodiment of the present disclosure. The first variation of the sixth embodiment illustrated in FIG. 6B differs from the sixth embodiment illustrated in FIG. 6A in that each one of the micro-LEDs 610 and 620 in the micro-LED chip 6001 includes the micro-LED structure 1001 described in the first variation of the first embodiment illustrated in FIG. 1B. Therefore, the micro-LEDs 610 and 620 in FIG. 6B are also referred to as micro-LEDs 610(1001) and 620(1001).

More specifically, as illustrated in FIG. 6B, the sidewall surface 101b of the first type conductive layer 101 is curved, and the reflective structure 1041 formed on the sidewall surface 101b of the first type conductive layer 101 has the curved surface 104a. Except for the reflective structure 1041, the components of the micro-LED chip 6001 illustrated in FIG. 6B are the same as the components of the micro-LED chip 6000 illustrated in FIG. 6A, and therefore detailed descriptions of these components are not repeated.

Second Variation of Sixth Embodiment

Figure 6C:
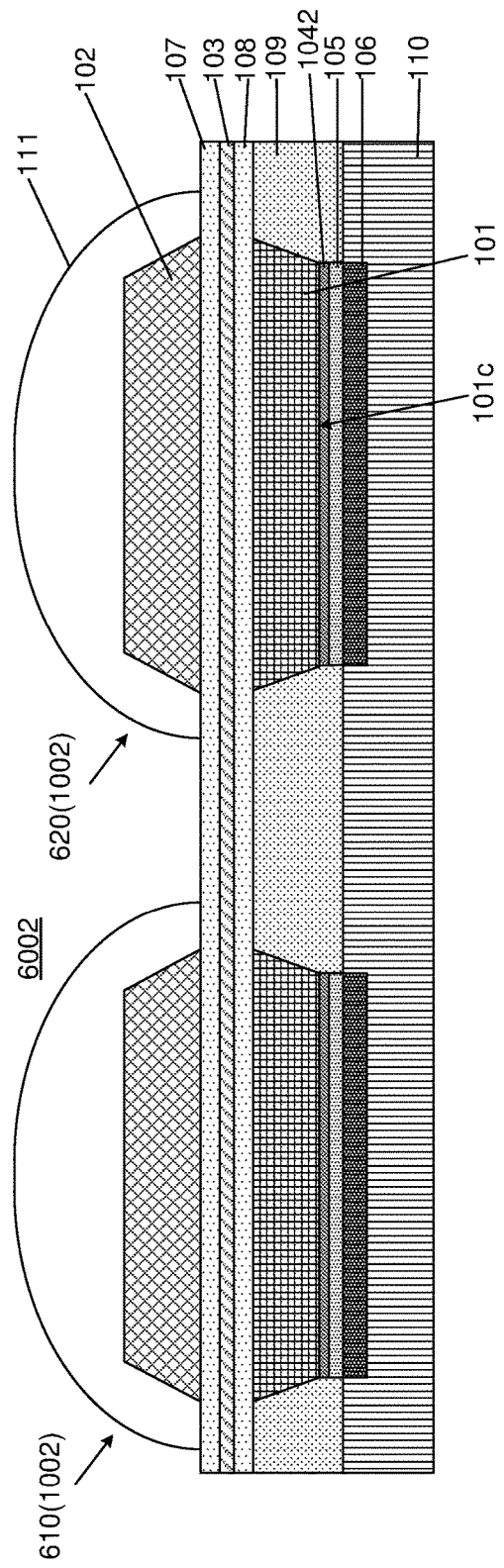
FIG. 6C is a cross-sectional view of a micro-LED chip, according to a second variation of the sixth embodiment of the present disclosure.

FIG. 6C is a cross-sectional view of a micro-LED chip 6002, according to a second variation of the sixth embodiment of the present disclosure. The second variation of the sixth embodiment illustrated in FIG. 6C differs from the sixth embodiment illustrated in FIG. 6A in that each one of the micro-LEDs 610 and 620 in the micro-LED chip 6002 includes the micro-LED structure 1002 described in the second variation of the first embodiment illustrated in FIG. 1C. Therefore, the micro-LEDs 610 and 620 in FIG. 6C are referred to as micro-LEDs 610(1002) and 620(1002).

More specifically, as illustrated in FIG. 6C, the reflective structure 1042 is attached on the bottom surface 101c of the first type conductive layer 101. The reflective structure 1042 is electrically conductive. The bottom connection structure 105 is formed at the bottom of the reflective structure 1042, and is electrically connected with the bottom of the reflective structure 1042. The reflective structure 1042 on the bottom surface 101c of the first type conductive layer 01 may be made of metal. Except for the reflective structure 1042, the components of the micro-LED chip 6002 illustrated in FIG. 6C are the same as the components of the micro-LED chip 6000 illustrated in FIG. 6A, and therefore detailed descriptions of these components are not repeated.

Third Variation of Sixth Embodiment

Figure 6D:
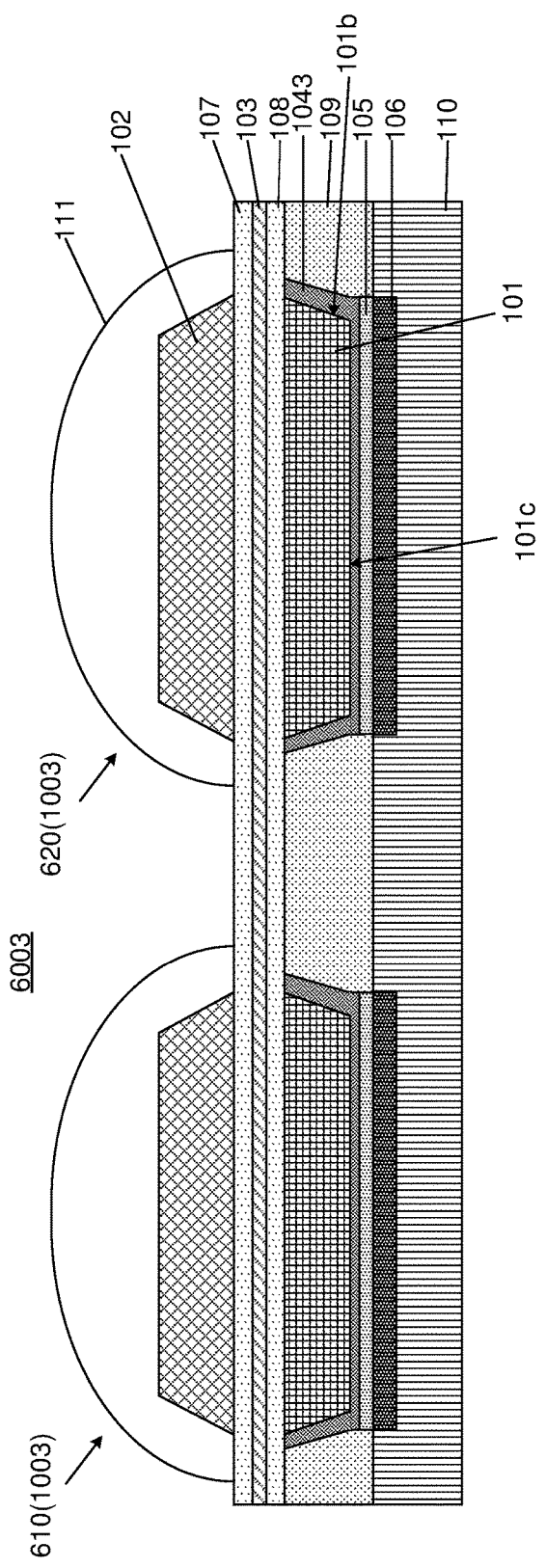
FIG. 6D is a cross-sectional view of a micro-LED chip, according to a third variation of the sixth embodiment of the present disclosure.

FIG. 6D is a cross-sectional view of a micro-LED chip 6003, according to a third variation of the sixth embodiment of the present disclosure. The embodiment illustrated in FIG. 6D differs from the embodiment illustrated in FIG. 6A in that each one of the micro-LEDs 610 and 620 in the micro-LED chip 6003 includes the micro-LED structure 1003 described in the third variation of the first embodiment illustrated in FIG. 1D. Therefore, the micro-LEDs 610 and 620 in FIG. 6C are referred to as micro-LEDs 610(1003) and 620(1003).

More specifically, as illustrated in FIG. 6D, the reflective structure 1043 is attached both on the sidewall surface 101b and the bottom surface 101c of the first type conductive layer 101. The reflective structure 1043 is electrically conductive. The bottom connection structure 105 is formed at the bottom of the reflective structure 1043, and is electrically connected with the reflective structure 1043. Except for the reflective structure 1043, the components of the micro-LED chip 6003 illustrated in FIG. 6D are the same as the components of the micro-LED chip 6000 illustrated in FIG. 6A, and therefore detailed descriptions of these components are not repeated.

Fourth Variation of Sixth Embodiment

Figure 6E:
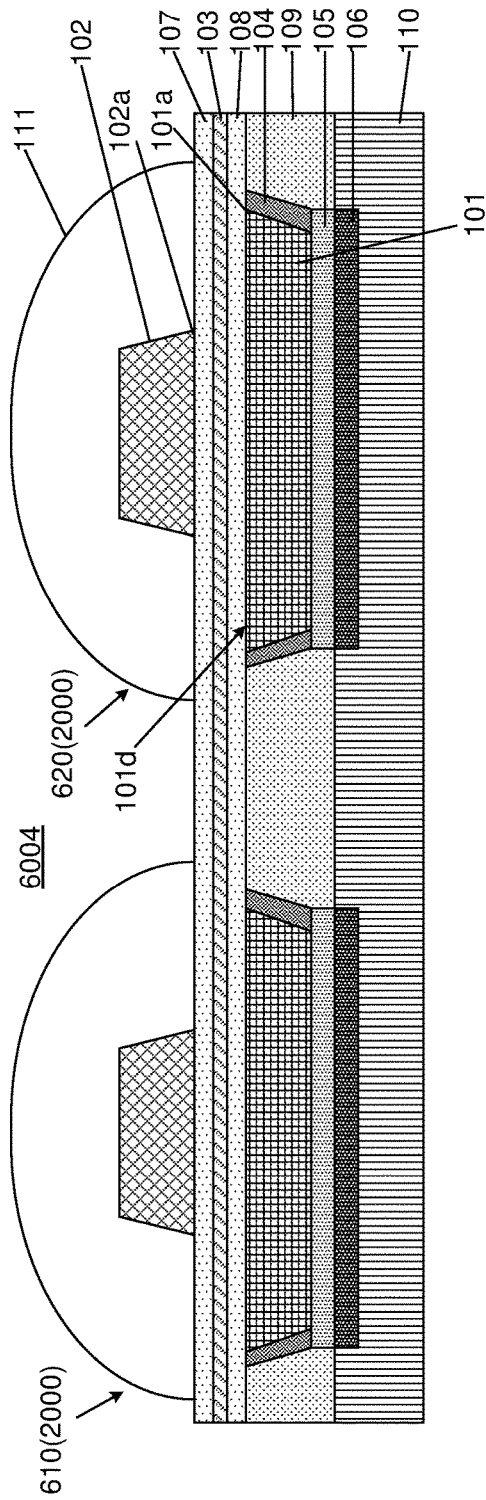
FIG. 6E is a cross-sectional view of a micro-LED chip, according to a fourth variation of the sixth embodiment of the present disclosure.

FIG. 6E is a cross-sectional view of a micro-LED chip 6004, according to a fourth variation of the sixth embodiment of the present disclosure. The embodiment illustrated in FIG. 6E differs from the embodiment illustrated in FIG. 6A in that each one of the micro-LEDs 610 and 620 in the micro-LED chip 6004 includes the micro-LED structure 2000 described in the second embodiment illustrated in FIG. 2A. Therefore, the micro-LEDs 610 and 620 in FIG. 6E are referred to as micro-LEDs 610(2000) and 620(2000).

More specifically, as illustrated in FIG. 6E, the bottom edge 102a of the second type conductive layer 102 is not aligned with the top edge 101a of the first type conductive layer 101. Instead, a profile of the second type conductive layer 102 perpendicularly projected on the top surface 101d of the first type conductive layer 101 is surrounded by the top edge 101a of the first type conductive layer 101. The components of the micro-LED chip 6004 of the embodiment illustrated in FIG. 6E are the same as the components of the micro-LED chip 6000 of the embodiment illustrated in FIG. 6A, and therefore detailed descriptions of these components are not repeated.

In the embodiment illustrated in FIG. 6E, each of the micro-LEDs 610 and 620 in the micro-LED chip 6004 includes the micro-LED structure 2000 described in the second embodiment illustrated in FIG. 2A. Alternatively, in other embodiments, each of the micro-LEDs 610 and 620 in the micro-LED chip 6004 may include the micro-LED structure 2001, 2002, or 2003 described in the first, second, or third variation of the second embodiment illustrated in FIG. 2B, 2C, or 2D, respectively.

Fifth Variation of Sixth Embodiment

Figure 6F:
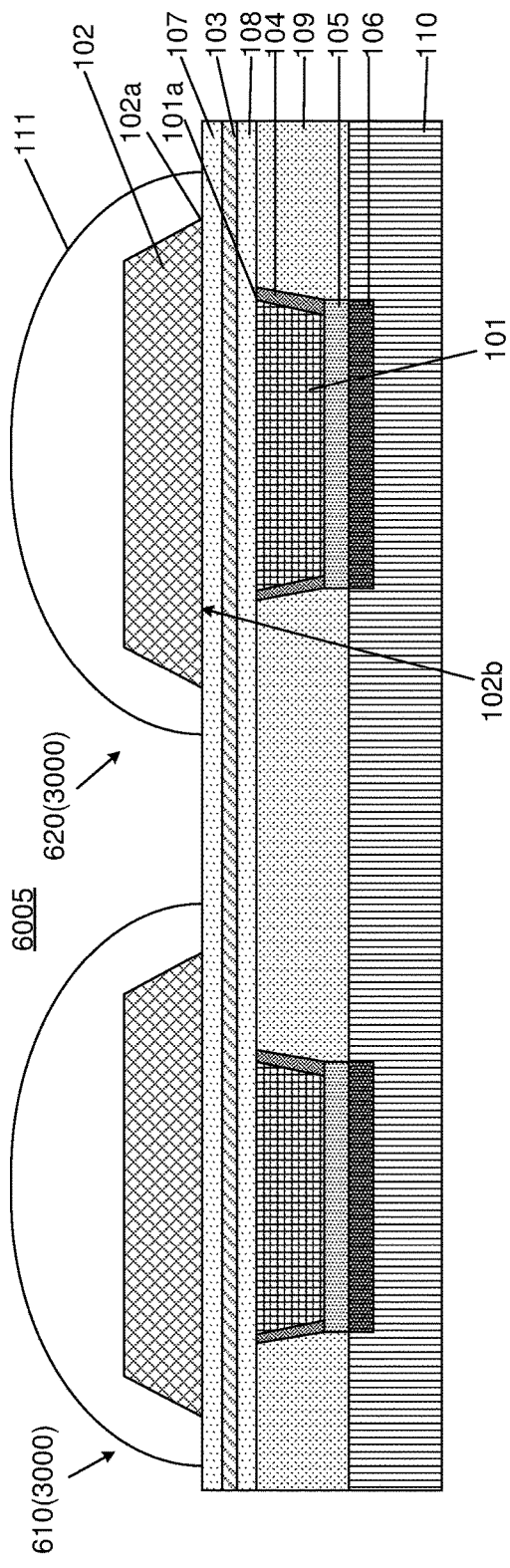
FIG. 6F is a cross-sectional view of a micro-LED chip, according to a fifth variation of the sixth embodiment of the present disclosure.

FIG. 6F is a cross-sectional view of a micro-LED chip 6005, according to a fifth variation of the sixth embodiment of the present disclosure. The embodiment illustrated in FIG. 6F differs from the embodiment illustrated in FIG. 6A in that each one of the micro-LEDs 610 and 620 in the micro-LED chip 6005 includes the micro-LED structure 3000 described in the second embodiment illustrated in FIG. 3A. Therefore, the micro-LEDs 610 and 620 in FIG. 6F are referred to as micro-LEDs 610(3000) and 620(3000).

More specifically, as illustrated in FIG. 6F, the bottom edge 102a of the second type conductive layer 102 is not aligned with the top edge 101a of the first type conductive layer 101. Instead, a profile of the first type conductive layer 101 perpendicularly projected on the bottom surface 102b of the second type conductive layer 102 is surrounded by the bottom edge 102a of the second type conductive layer 102. The components of the micro-LED chip 6005 of the embodiment illustrated in FIG. 6F are the same as the components of micro-LED chip 6000 of the embodiment illustrated in FIG. 6A, and therefore detailed descriptions of these components are not repeated.

In the embodiment illustrated in FIG. 6F, each of the micro-LEDs 610 and 620 in the micro-LED chip 6005 includes the micro-LED structure 3000 described in the third embodiment illustrated in FIG. 3A. Alternatively, in other embodiments, each of the micro-LEDs 610 and 620 in the micro-LED chip 6005 may include the micro-LED structure 3001, 3002, or 3003 described in the first, second, or third variation of the third embodiment illustrated in FIG. 3B, 3C, or 3D, respectively.

Seventh Embodiment

Figure 7:
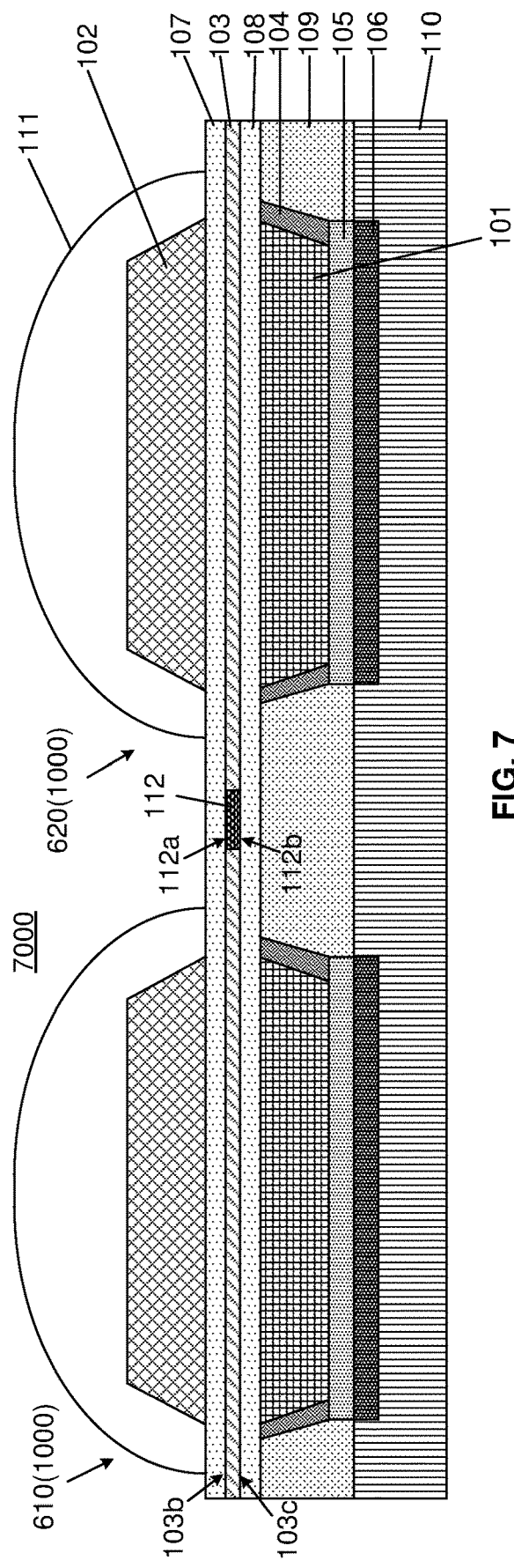
FIG. 7 is a cross-sectional view of a micro-LED chip, according to a seventh embodiment of the present disclosure.

FIG. 7 is a cross-sectional view of a micro-LED chip 7000, according to a seventh embodiment of the present disclosure. The micro-LED chip 7000 may include multiple micro-LEDs. At least one of the micro-LEDs included in the micro-LED chip 7000 may have any one of the micro-LED structures 1000, 1001, . . . 3003 described above.

The micro-LED chip 7000 illustrated in FIG. 7 differs from the micro-LED chip 6000 illustrated in FIG. 6A in that the micro-LED chip 7000 further includes an isolation structure 112 formed between adjacent micro-LEDs 610 (1000) and 620(1000). The isolation structure 112 may be made of a light absorption material, which may be a dielectric material including, for example, impurity doped $SiO_2$ or $Si_3N_4$. In other embodiments, the isolation structure 112 may be made of a reflective material such as, for example, metal. The isolation structure 112 is configured to electrically isolate the adjacent micro-LEDs 610(1000) and 620 (1000) from each other.

At least a portion of the isolation structure 112 is formed in the light emitting layer 103. In the embodiment illustrated in FIG. 7, a top surface 112a of the isolation structure 112 is aligned with the top surface 103b of the light emitting layer 103, and a bottom surface 112b of the isolation structure 112 is aligned with the bottom surface 103c of the light emitting layer 103. The isolation structure 112 may be formed surrounding at least one of the micro-LEDs 610 (1000) and 620(1000). Additionally or alternatively, at least a portion of the isolation structure 112 may be formed in the top spacer 107 or the bottom spacer 108.

Except for the isolation structure, the components of the micro-LED chip 7000 of the embodiment illustrated in FIG. 7 are the same as the components of the micro-LED chip 6000 of the embodiment illustrated in FIG. 6A, and therefore detailed descriptions of these components are not repeated.

Eighth Embodiment

Figure 8A:
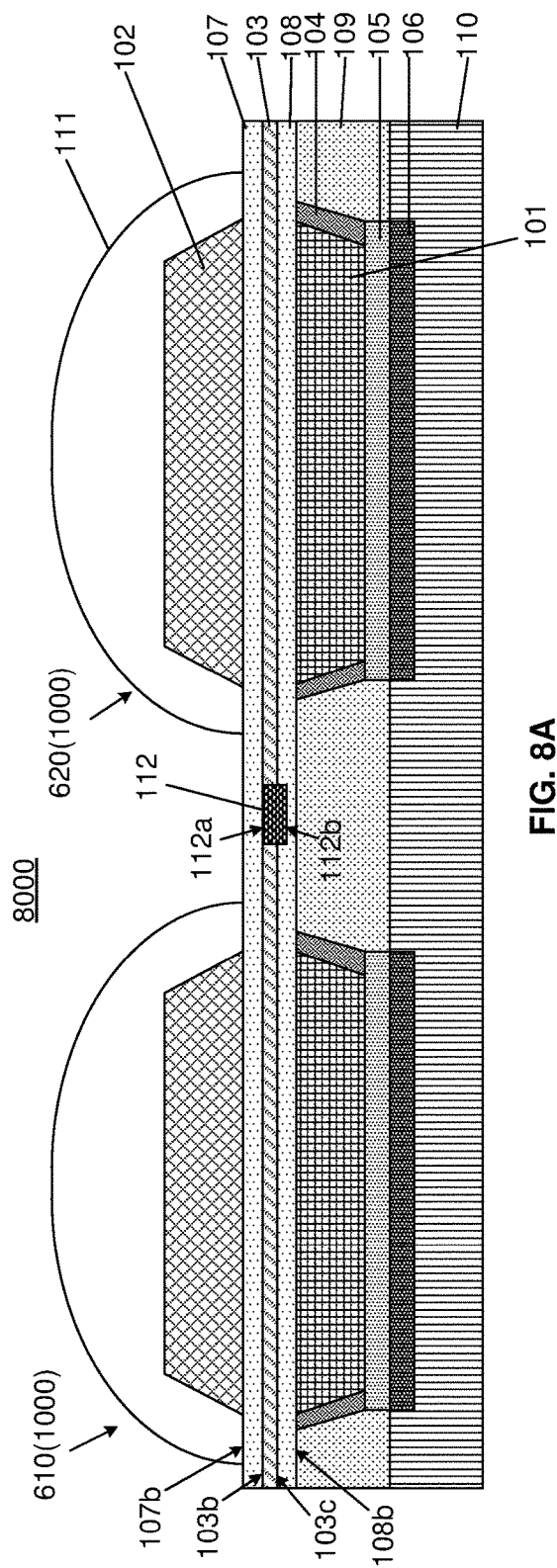
FIG. 8A is a cross-sectional view of a micro-LED chip, according to an eighth embodiment of the present disclosure.

FIG. 8A is a cross-sectional view of a micro-LED chip 8000, according to an eighth embodiment of the present disclosure. The micro-LED chip 8000 illustrated in FIG. 8A differs from the micro-LED chip 7000 illustrated in FIG. 7 in that the bottom surface 112b of the isolation structure 112 is below the light emitting layer 103. More specifically, as illustrated in FIG. 8A, the bottom surface 112b of the isolation structure 112 is below the bottom surface 103c of the light emitting layer 103 and above the bottom surface 108b of the bottom spacer 108. Except for the isolation structure 112, the components of the micro-LED chip 8000 illustrated in FIG. 8A are the same as the components of the micro-LED chip 7000 illustrated in FIG. 7, and therefore detailed descriptions of these components are not repeated.

First Variation of Eighth Embodiment

Figure 8B:
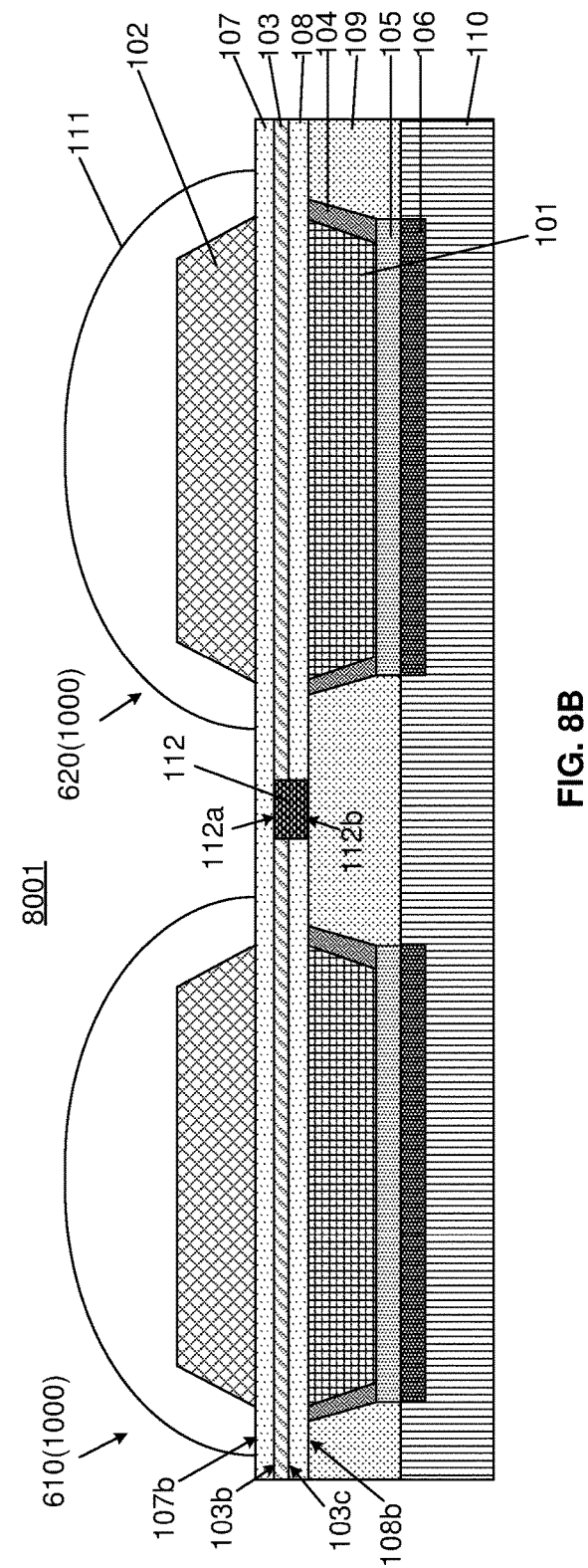
FIG. 8B is a cross-sectional view of a micro-LED chip, according to a first variation of the eighth embodiment of the present disclosure.

FIG. 8B is a cross-sectional view of a micro-LED chip 8001, according to a first variation of the eighth embodiment of the present disclosure. The micro-LED chip 8001 illustrated in FIG. 8B differs from the micro-LED chip 8000 illustrated in FIG. 8A in that the bottom surface 112b of the isolation structure 112 is aligned with the bottom surface 108b of the bottom spacer 108. Except for the isolation structure 112, the components of the micro-LED chip 8001 illustrated in FIG. 8B are the same as the components of the micro-LED chip 8000 illustrated in FIG. 8A, and therefore detailed descriptions of these components are not repeated.

Second Variation of Eighth Embodiment

Figure 8C:
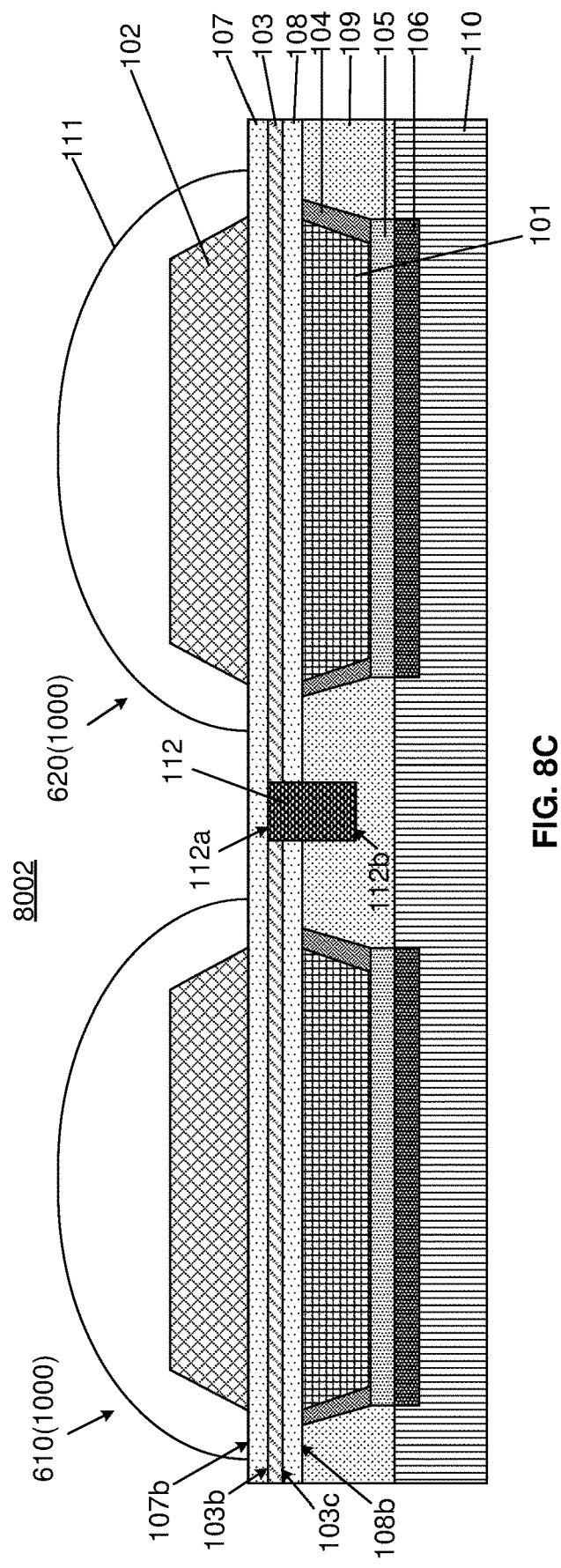
FIG. 8C is a cross-sectional view of a micro-LED chip, according to a second variation of the eighth embodiment of the present disclosure.

FIG. 8C is a cross-sectional view of a micro-LED chip 8002, according to a second variation of the eighth embodiment of the present disclosure. The micro-LED chip 8002 illustrated in FIG. 8C differs from the micro-LED chip 8000 illustrated in FIG. 8A in that the bottom surface 112b of the isolation structure 112 is below the bottom surface 108b of the bottom spacer 108 and is disposed in the isolation layer 109. Except for the isolation structure 112, the components of the micro-LED chip 8002 illustrated in FIG. 8C are the same as the components of the micro-LED chip 8000 illustrated in FIG. 8A, and therefore detailed descriptions of these components are not repeated.

In the embodiments illustrated in FIGS. 8A-8C, an area of the top surface 112a of the isolation structure 112 is equal to an area of the bottom surface 112b of the isolation structure 112. Alternatively, in other embodiments, the area of the top surface 112a of the isolation structure 112 may be larger or smaller than the area of the bottom surface 112b of the isolation structure 112. Still alternatively, in some embodiments, a cross-sectional area of the isolation structure 112 at an interface between the light emitting layer 103 and the bottom spacer 108, or at the bottom surface 108b of the bottom spacer 108, may be larger than the area of the bottom surface 112b of the isolation structure 112.

Ninth Embodiment

Figure 9A:
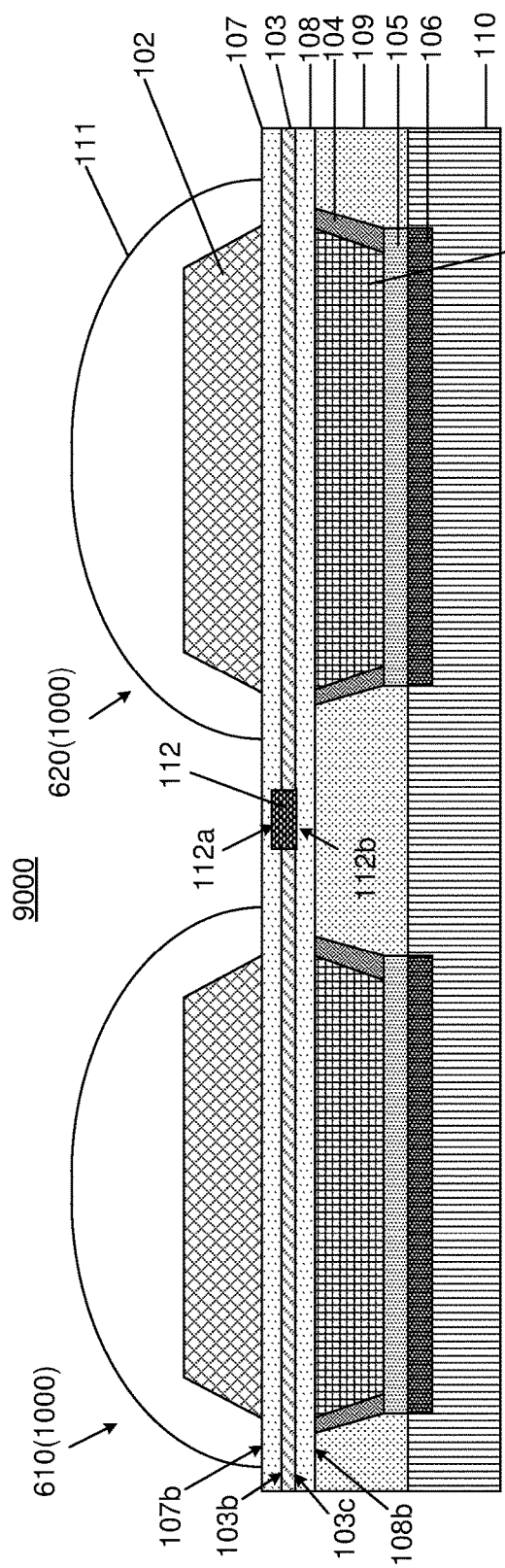
FIG. 9A is a cross-sectional view of a micro-LED chip, according to a ninth embodiment of the present disclosure.

FIG. 9A is a cross-sectional view of a micro-LED chip 9000, according to a ninth embodiment of the present disclosure. The micro-LED chip 9000 illustrated in FIG. 9A differs from the micro-LED chip 7000 illustrated in FIG. 7 in that the top surface 112a of the isolation structure 112 is above the light emitting layer 103. More specifically, as illustrated in FIG. 9A, the top surface 112a of the isolation structure 112 is above the top surface 103b of the light emitting layer 103 and below the top surface 107b of the top spacer 107. Except for the isolation structure 112, the components of the micro-LED chip 9000 illustrated in FIG. 9A are the same as the components of the micro-LED chip 7000 illustrated in FIG. 7, and therefore detailed descriptions of these components are not repeated.

First Variation of Ninth Embodiment

Figure 9B:
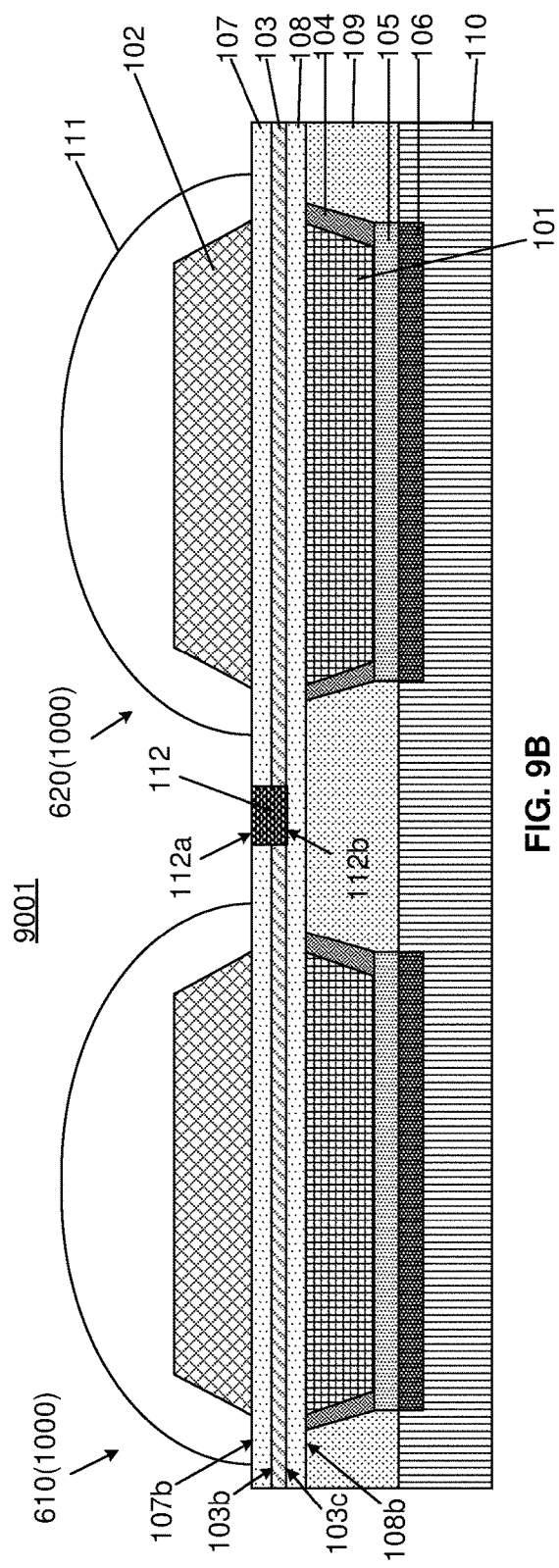
FIG. 9B is a cross-sectional view of a micro-LED chip, according to a first variation of the ninth embodiment of the present disclosure.

FIG. 9B is a cross-sectional view of a micro-LED chip 9001, according to a first variation of the ninth embodiment of the present disclosure. The micro-LED chip 9001 illustrated in FIG. 9B differs from the micro-LED chip 9000 illustrated in FIG. 9A in that the top surface 112a of the isolation structure 112 is aligned with the top surface 107b of the top spacer 107. Except for the isolation structure 112, the components of the micro-LED chip 9001 illustrated in FIG. 9B are the same as the components of the micro-LED chip 9000 illustrated in FIG. 9A, and therefore detailed descriptions of these components are not repeated.

Second Variation of Ninth Embodiment

Figure 9C:
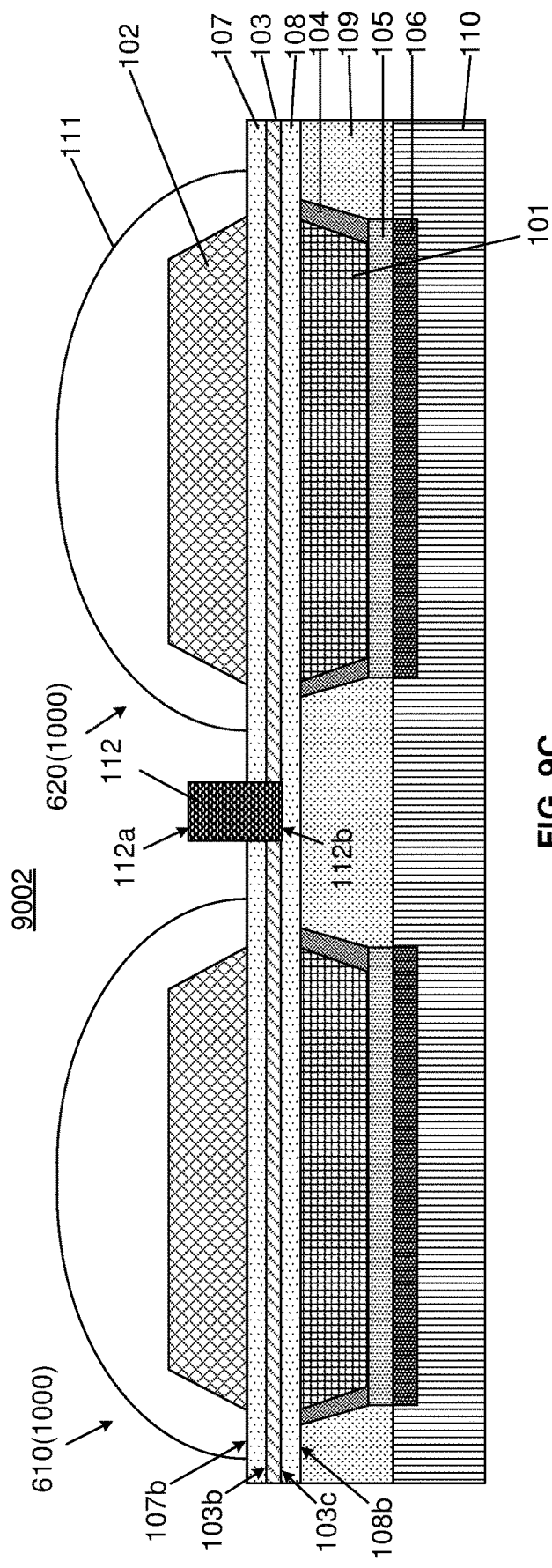
FIG. 9C is a cross-sectional view of a micro-LED chip, according to a second variation of the seventh embodiment of the present disclosure.

FIG. 9C is a cross-sectional view of a micro-LED chip 9002, according to a second variation of the ninth embodiment of the present disclosure. The micro-LED chip 9002 illustrated in FIG. 9C differs from the micro-LED chip 9000 illustrated in FIG. 9A in that the top surface 112a of the isolation structure 112 is above the top surface 107b of the top spacer 107 and between adjacent second type conductive layers 102. Except for the isolation structure 112, the components of the micro-LED chip 9002 illustrated in FIG. 9C are the same as the components of the micro-LED chip 9000 illustrated in FIG. 9A, and therefore detailed descriptions of these components are not repeated.

In the embodiment illustrated in FIGS. 9A-9C, the area of the top surface 112a of the isolation structure 112 is equal to the area of the bottom surface 112b of the isolation structure 112. Alternatively, in other embodiments, the area of the top surface 112a of the isolation structure 112 may be larger or smaller than the area of the bottom surface 112b of the isolation structure 112. Still alternatively, in some embodiments, a cross-sectional area of the isolation structure 112 at the top surface 103b of the light emitting layer 103 or at the top surface 107b of the top spacer 107 may be larger than the area of the bottom surface 112b of the isolation structure 112.

Tenth Embodiment

FIG. 10A is a cross-sectional view of a micro-LED chip 10000, according to a tenth embodiment of the present disclosure. The micro-LED chip 10000 illustrated in FIG. 10A differs from the micro-LED chip 7000 illustrated in FIG. 7 in that the top surface 112a of the isolation structure 112 is above the light emitting layer 103, and the bottom surface 112b of the isolation structure 112 is below the light emitting layer 103. More specifically, as illustrated in FIG. 10A, the top surface 112a of the isolation structure 112 is above the top surface 103b of the light emitting layer 103 and below the top surface 107b of the top spacer 107, and the bottom surface 112b of the isolation structure 112 is below the bottom surface 103c of the light emitting layer 103 and above the bottom surface 108b of the bottom spacer 108. Except for the isolation structure 112, the components of the micro-LED chip 10000 illustrated in FIG. 10A are the same as the components of the micro-LED chip 7000 illustrated in FIG. 7, and therefore detailed descriptions of these components are not repeated.

First Variation of Tenth Embodiment

FIG. 10B is a cross-sectional view of a micro-LED chip 10001, according to a first variation of the tenth embodiment of the present disclosure. The micro-LED chip 10001 illustrated in FIG. 10B differs from the micro-LED chip 10000 illustrated in FIG. 10A in that the bottom surface 112b of the isolation structure 112 is aligned with the bottom surface 108b of the bottom spacer 108. Except for the isolation structure 112, the components of the micro-LED chip 10001 illustrated in FIG. 10B are the same as the components of the micro-LED chip 10000 illustrated in FIG. 10A, and therefore detailed descriptions of these components are not repeated.

Second Variation of Tenth Embodiment

Figure 10C:
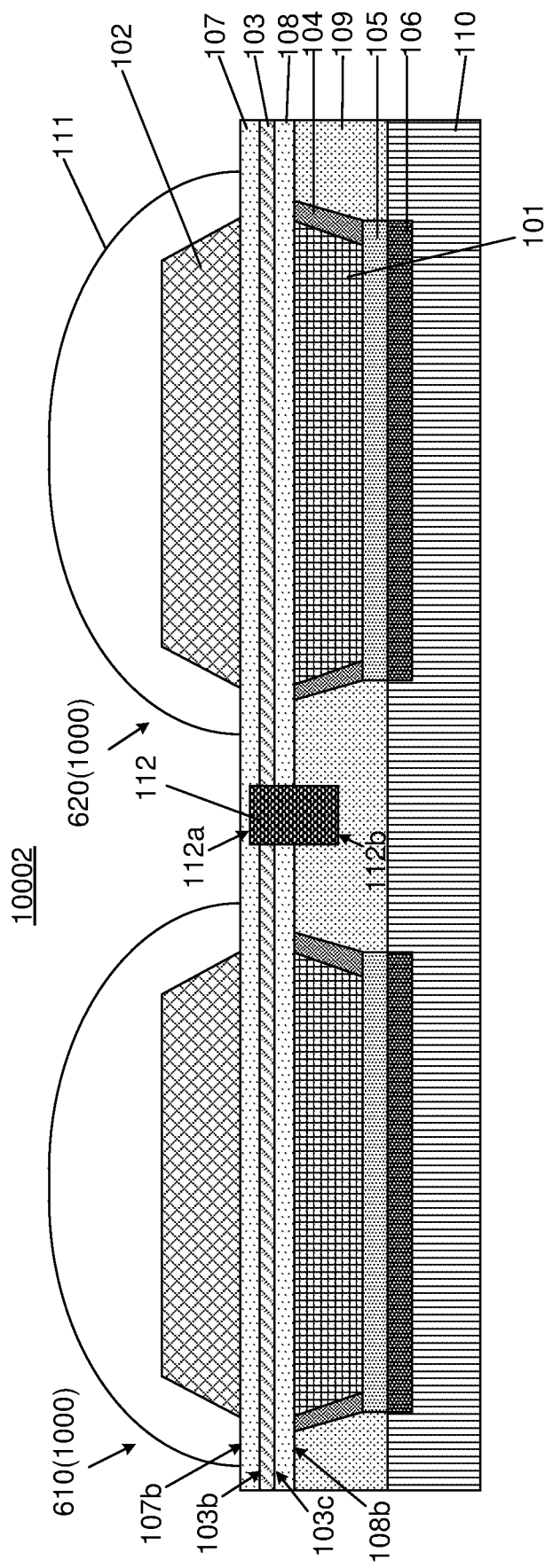
FIG. 10C is a cross-sectional view of a micro-LED chip, according to a second variation of the tenth embodiment of the present disclosure.

FIG. 10C is a cross-sectional view of a micro-LED chip 10002, according to a second variation of the tenth embodiment of the present disclosure. The micro-LED chip 10002 illustrated in FIG. 10C differs from the micro-LED chip 10000 illustrated in FIG. 10A in that the bottom surface 112b of the isolation structure 112 is below the bottom surface 108b of the bottom spacer 108 and is disposed in the isolation layer 109. Except for the isolation structure 112, the components of the micro-LED chip 10002 illustrated in FIG. 10C are the same as the components of the micro-LED chip 10000 illustrated in FIG. 10A, and therefore detailed descriptions of these components are not repeated.

In the embodiment illustrated in FIGS. 10A-10C, the area of the top surface 112a of the isolation structure 112 is equal to the area of the bottom surface 112b of the isolation structure 112. Alternatively, in other embodiments, the area of the top surface 112a of the isolation structure 112 may be larger or smaller than the area of the bottom surface 112b of the isolation structure 112. Still alternatively, in some embodiments, a cross-sectional area of the isolation structure 112 at the bottom surface 103c of the light emitting layer 103 or at the bottom surface 108b of the bottom spacer 108 may be larger than the area of the bottom surface 112b of the isolation structure 112.

Eleventh Embodiment

Figure 11A:
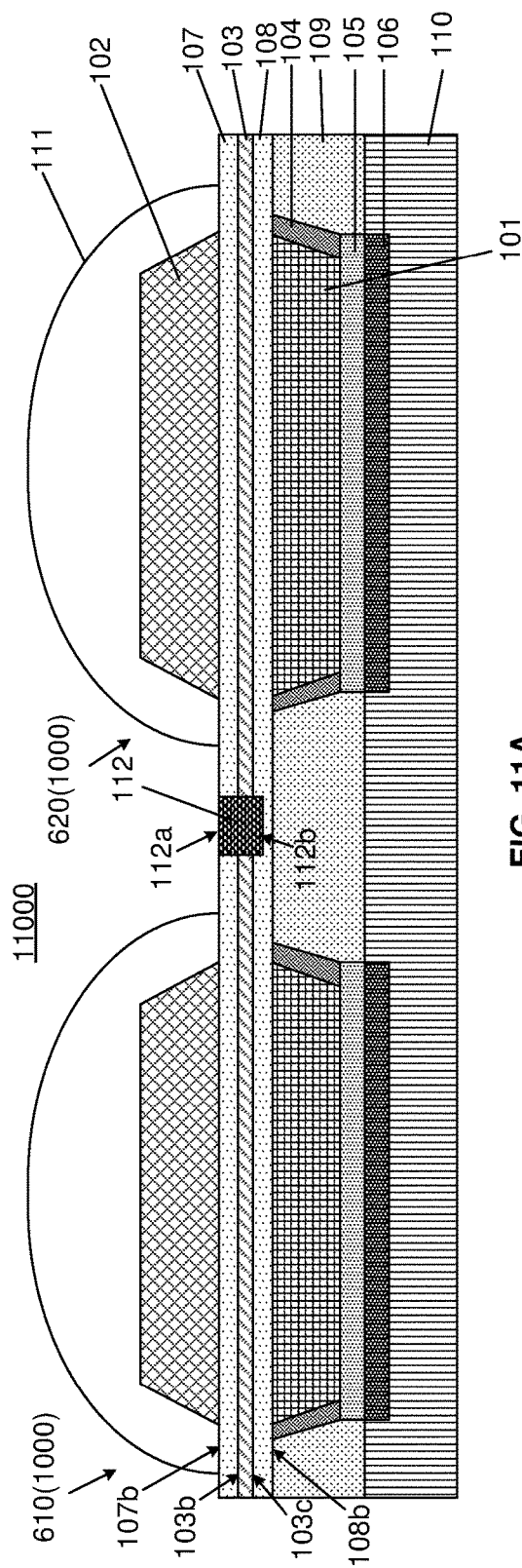
FIG. 11A is a cross-sectional view of a micro-LED chip, according to an eleventh embodiment of the present disclosure.

FIG. 11A is a cross-sectional view of a micro-LED chip 11000, according to an eleventh embodiment of the present disclosure. The micro-LED chip 11000 illustrated in FIG. 11A differs from the micro-LED chip 7000 illustrated in FIG. 7 in that the top surface 112a of the isolation structure 112 is aligned with the top surface 107b of the top spacer 107, and the bottom surface 112b of the isolation structure 112 is below the light emitting layer 103. More specifically, in the embodiment illustrated in FIG. 11A, the bottom surface 112b of the isolation structure 112 is below the bottom surface 103c of the light emitting layer 103 and above the bottom surface 108b of the bottom spacer 108. Except for the isolation structure 112, the components of the micro-LED chip 11000 illustrated in FIG. 11A are the same as the components of the micro-LED chip 7000 illustrated in FIG. 7, and therefore detailed descriptions of these components are not repeated.

First Variation of Eleventh Embodiment

Figure 11B:
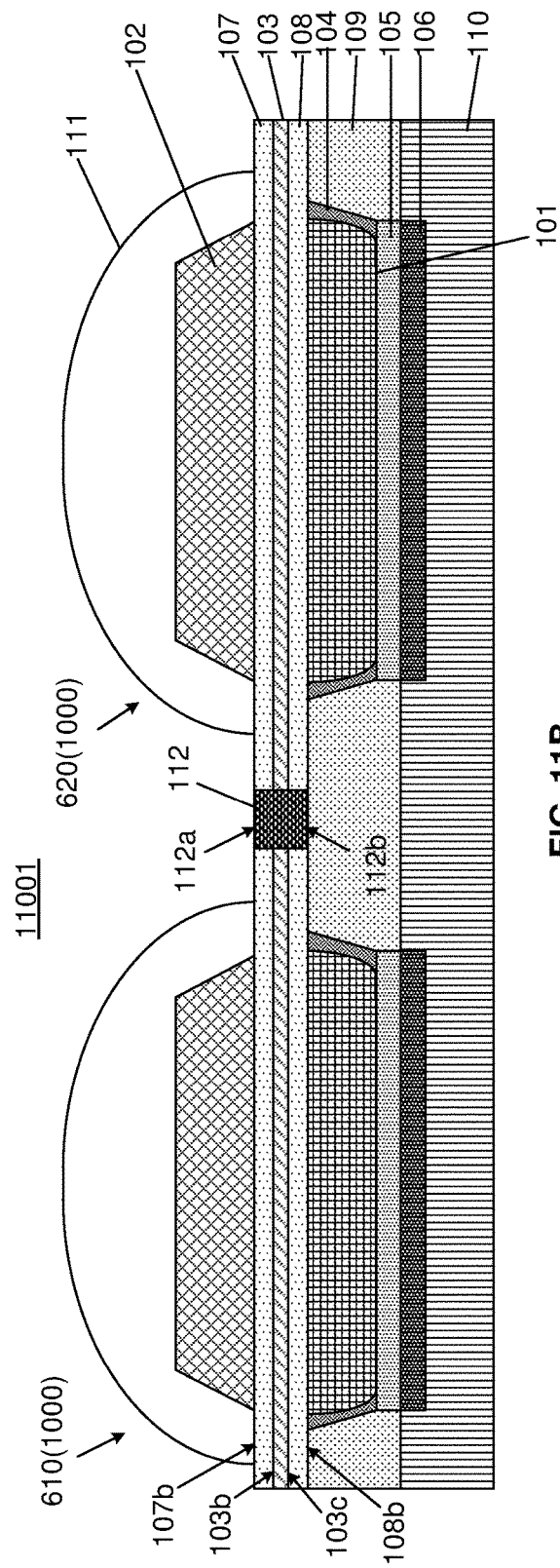
FIG. 11B is a cross-sectional view of a micro-LED chip, according to a first variation of the eleventh embodiment of the present disclosure.

FIG. 11B is a cross-sectional view of a micro-LED chip 11001, according to a first variation of the eleventh embodiment of the present disclosure. The micro-LED chip 11001 illustrated in FIG. 11B differs from the micro-LED chip 11000 illustrated in FIG. 11A in that the bottom surface 112b of the isolation structure 112 is aligned with the bottom surface 108b of the bottom spacer 108. Except for the isolation structure 112, the components of the micro-LED chip 11001 illustrated in FIG. 11A are the same as the components of the micro-LED chip 11000 illustrated in FIG. 11A, and therefore detailed descriptions of these components are not repeated.

Second Variation of Eleventh Embodiment

FIG. 11C is a cross-sectional view of a micro-LED chip 11002, according to a second variation of the eleventh embodiment of the present disclosure. The micro-LED chip 11002 illustrated in FIG. 11C differs from the micro-LED chip 11000 illustrated in FIG. 11A in that the bottom surface 112b of the isolation structure 112 is below the bottom surface 108b of the bottom spacer 108 and is disposed in the isolation layer 109. Except for the isolation structure 112, the components of the micro-LED chip 11002 illustrated in FIG. 11C are the same as the components of the micro-LED chip 11000 illustrated in FIG. 11A, and therefore detailed descriptions of these components are not repeated.

In the embodiment illustrated in FIGS. 11A-11C, the area of the top surface 112a of the isolation structure 112 is equal to the area of the bottom surface 112b of the isolation structure 112. Alternatively, in other embodiments, the area of the top surface 112a of the isolation structure 112 may be larger or smaller than the area of the bottom surface 112b of the isolation structure 112. Still alternatively, in some embodiments, a cross-sectional area of the isolation structure 112 at the bottom surface 103c of the light emitting layer 103 or the bottom surface 108b of the bottom spacer 108 may be larger than the area of the bottom surface 112b of the isolation structure 112.

Third Variation of Eleventh Embodiment

FIG. 11D is a cross-sectional view of a micro-LED chip 11003, according to a third variation of the eleventh embodiment of the present disclosure. The micro-LED chip 11003 illustrated in FIG. 11D differs from the micro-LED chip 11001 illustrated in FIG. 11B in that the area of the top surface 112a of the isolation structure 112 is larger than an area of the bottom surface 112b of the isolation structure 112. Except for the isolation structure 112, the components of the micro-LED chip 11003 illustrated in FIG. 11D are the same as the components of the micro-LED chip 11001 illustrated in FIG. 11B, and therefore detailed descriptions of these components are not repeated.

Twelfth Embodiment

Figure 12A:
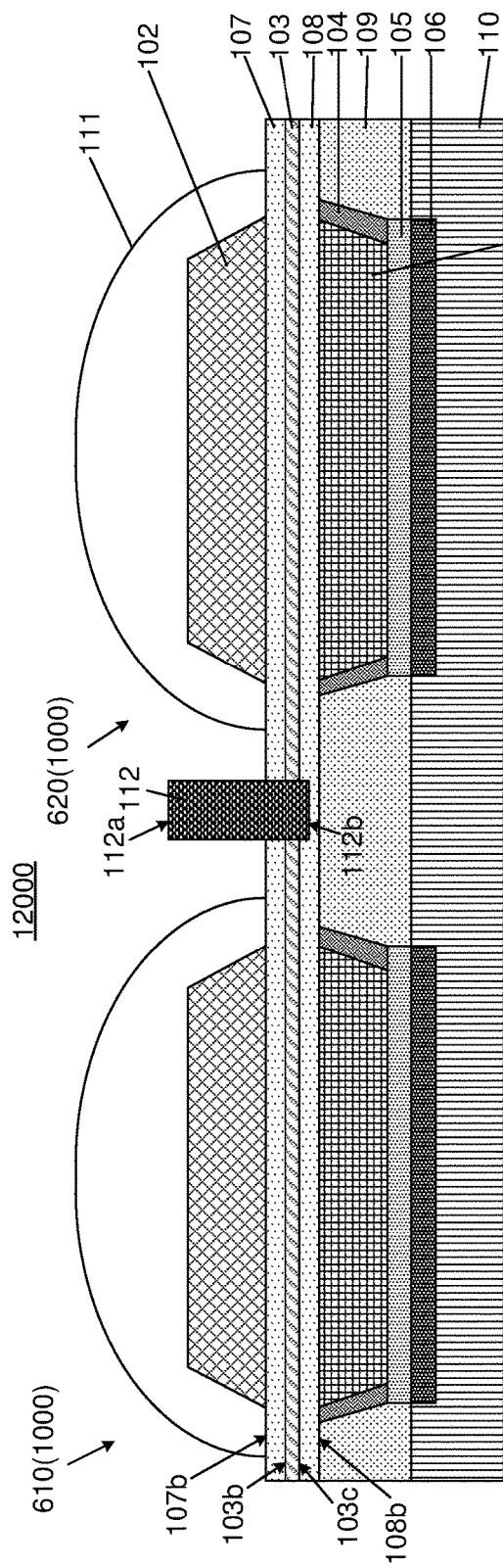
FIG. 12A is a cross-sectional view of a micro-LED chip, according to a twelfth embodiment of the present disclosure.

FIG. 12A is a cross-sectional view of a micro-LED chip 12000, according to a twelfth embodiment of the present disclosure. The micro-LED chip 12000 illustrated in FIG. 12A differs from the micro-LED chip 7000 illustrated in FIG. 7 in that the top surface 112a of the isolation structure 112 is above the top surface 107b of the top spacer 107 and between adjacent second type conductive layers 102, and the bottom surface 112b of the isolation structure 112 is below the light emitting layer 103. More specifically, in the embodiment illustrated in FIG. 12A, the bottom surface 112b of the isolation structure 112 is below the bottom surface 103c of the light emitting layer 103 and above the bottom surface 108b of the bottom spacer 108. Except for the isolation structure 112, the components of the micro-LED chip 12000 illustrated in FIG. 12A are the same as the components of the micro-LED chip 7000 illustrated in FIG. 7, and therefore detailed descriptions of these components are not repeated.

First Variation of Twelfth Embodiment

Figure 12B:
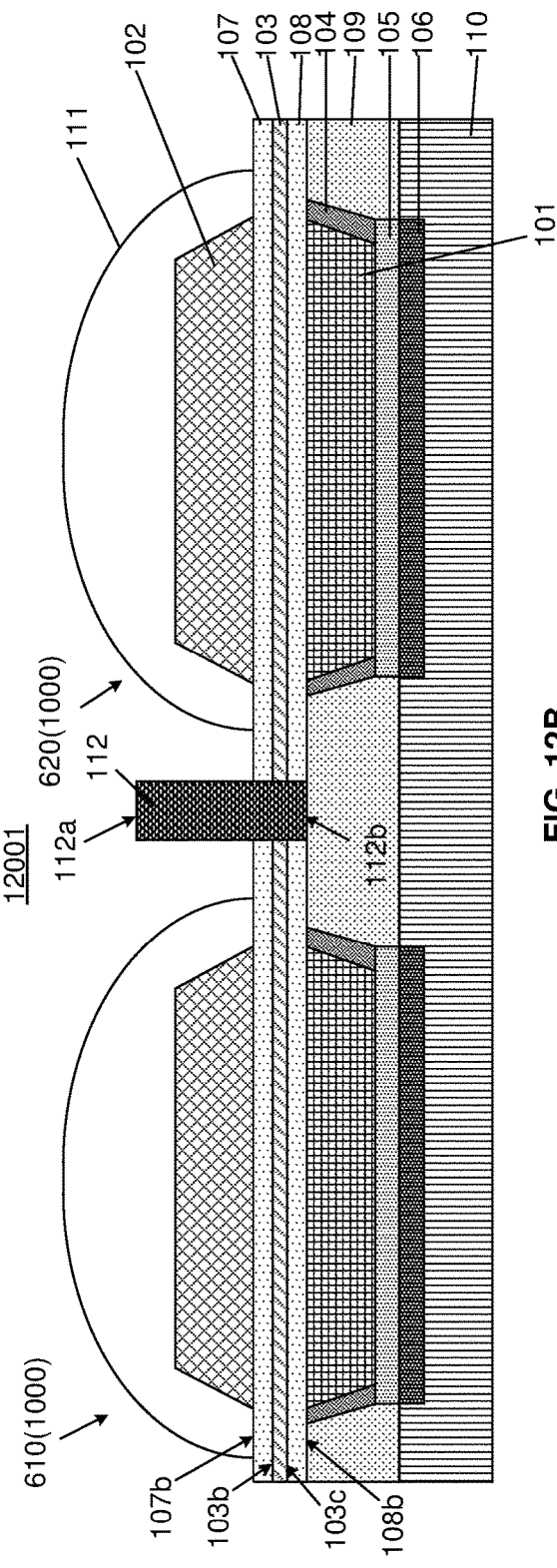
FIG. 12B is a cross-sectional view of a micro-LED chip, according to a first variation of the twelfth embodiment of the present disclosure.

FIG. 12B is a cross-sectional view of a micro-LED chip 12001, according to a first variation of the twelfth embodiment of the present disclosure. The micro-LED chip 12001 illustrated in FIG. 12B differs from the micro-LED chip 12000 illustrated in FIG. 12A in that the bottom surface 112b of the isolation structure 112 is aligned with the bottom surface 108b of the bottom spacer 108. Except for the isolation structure 112, the components of the micro-LED chip 12001 illustrated in FIG. 12B are the same as the components of the micro-LED chip 12000 illustrated in FIG. 12A, and therefore detailed descriptions of these components are not repeated.

Second Variation of Twelfth Embodiment

FIG. 12C is a cross-sectional view of a micro-LED chip 12002, according to a second variation of the twelfth embodiment of the present disclosure. The micro-LED chip 12002 illustrated in FIG. 12C differs from the micro-LED chip 12000 illustrated in FIG. 12A in that the bottom surface 112b of the isolation structure 112 is below the bottom surface 108b of the bottom spacer 108 and disposed in the isolation layer 109. Except for the isolation structure 112, the components of the micro-LED chip 12002 illustrated in FIG. 12C are the same as the components of the micro-LED chip 12000 illustrated in FIG. 12A, and therefore detailed descriptions of these components are not repeated.

Third Variation of Twelfth Embodiment

FIG. 12D is a cross-sectional view of a micro-LED chip 12003, according to a third variation of the twelfth embodiment of the present disclosure. The micro-LED chip 12003 illustrated in FIG. 12D differs from the micro-LED chip 12002 illustrated in FIG. 12C in that the area of the top surface 112a of the isolation structure 112 is smaller than the area of the bottom surface 112b of the isolation structure 112, and a cross-sectional area 112c of the isolation structure 112 at the bottom surface 103c of the light emitting layer 103 is larger than the area of the bottom surface 112b of the isolation structure 112. Except for the isolation structure 112, the components of the micro-LED chip 12003 illustrated in FIG. 12D are the same as the components of the micro-LED chip 12002 illustrated in FIG. 12C, and therefore detailed descriptions of these components are not repeated.

Thirteenth Embodiment

Figure 13A:
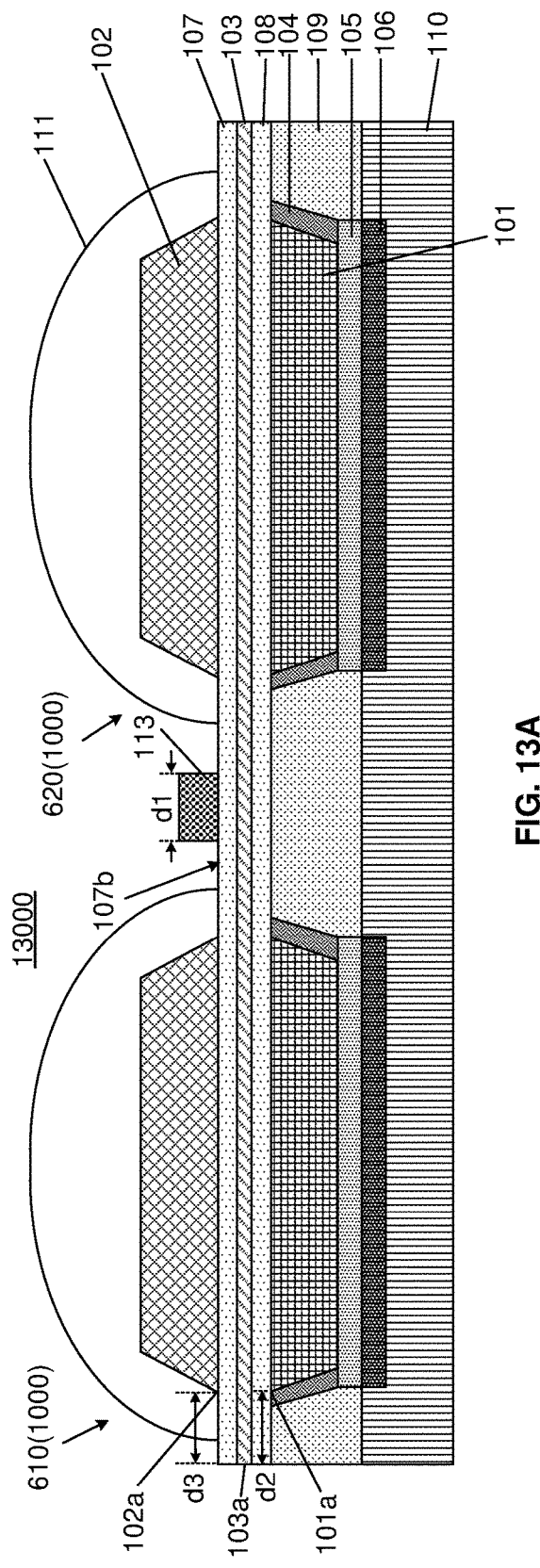
FIG. 13A is a cross-sectional view of a micro-LED chip, according to a thirteenth embodiment of the present disclosure.

FIG. 13A is a cross-sectional view of a micro-LED chip 13000, according to a thirteenth embodiment of the present disclosure. The micro-LED chip 13000 may include multiple micro-LEDs. At least one of the micro-LEDs included in the micro-LED chip 13000 may have any one of the micro-LED structures 1000, 1001, . . . 3003 described above.

The micro-LED chip 13000 illustrated in FIG. 13A differs from the micro-LED chip 6000 illustrated in FIG. 6A in that the micro-LED chip 13000 further includes a metal layer 113 formed over the light emitting layer 103 between adjacent micro-LEDs 610(1000) and 620(1000). The metal layer 113 is formed over the top surface 103b of the light emitting layer 103 and does not contact the first type conductive layer 101 or the second type conductive layer 102. More specifically, in the embodiment illustrated in FIG. 13A, the top spacer 107 is formed on top of the light emitting layer 103, and the metal layer 113 is formed on the top surface 107b of the top spacer 107.

A lateral dimensional value d1 of the metal layer 113 is not more than a distance d2 between the edge 103a of the light emitting layer 103 and the top edge 101a of the first type conductive layer 101, or the lateral dimensional value d1 of the metal layer 113 is not more than a distance d3 between the edge 103a of the light emitting layer 103 and the bottom edge 102a of the second type conductive layer 102. The lateral dimensional value d1 of the metal layer 113 may be from approximately 2 nm to approximately 10 um.

In some embodiments, a center point of the metal layer 113 may be aligned with a center point between the adjacent micro-LEDs 610(1000) and 620(1000). Alternatively, in some embodiments, the center point of the metal layer 113 is closer to one of the adjacent micro-LEDs 610(1000) and 620(1000) than the other one of the micro-LEDs 610(1000) and 620(1000).

The metal layer 113 may include a high work function metal material having a work function that matches the work function of a material of the light emitting layer 103. The high work function metal material may include at least one of gold, platinum, palladium, beryllium, cobalt, nickel, or tungsten.

Variation of Thirteenth Embodiment

Figure 13B:
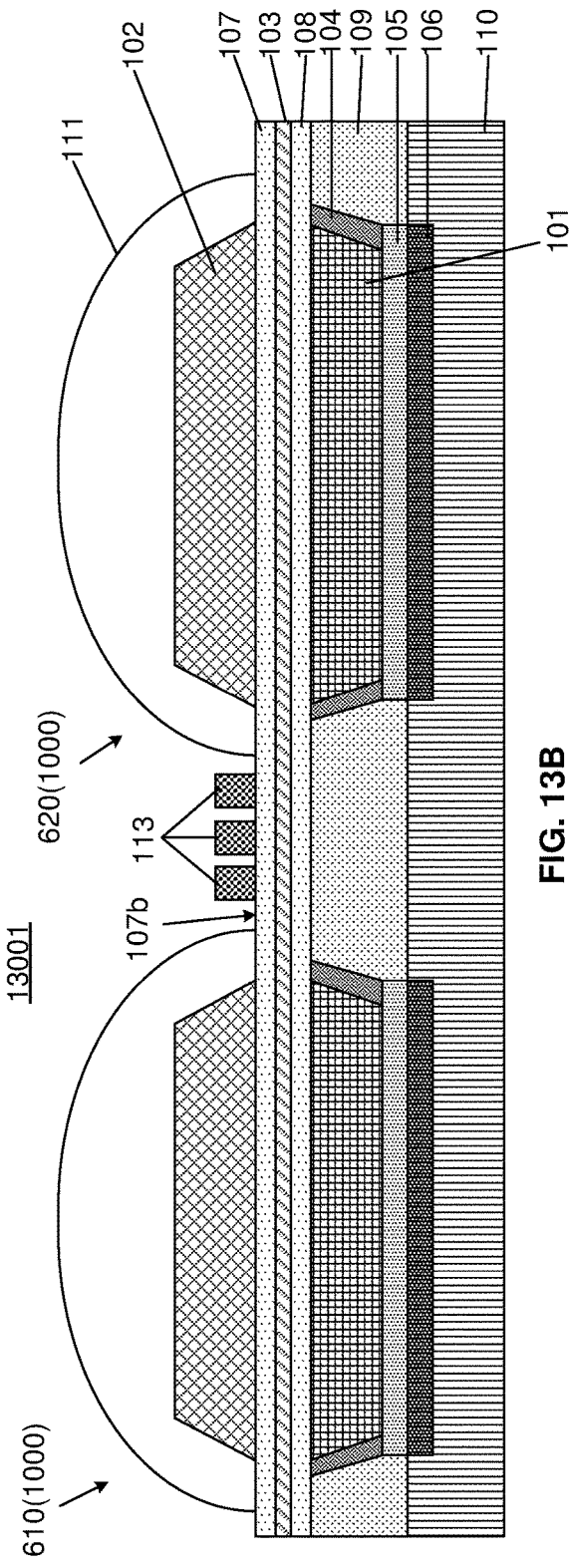
FIG. 13B is a cross-sectional view of a micro-LED chip, according to a variation of the thirteenth embodiment of the present disclosure.

FIG. 13B is a cross-sectional view of a micro-LED chip 13001, according to a variation of the thirteenth embodiment of the present disclosure. The micro-LED chip 13001 illustrated in FIG. 13B differs from the micro-LED chip 13000 illustrated in FIG. 13A in that the micro-LED chip 13001 includes multiple metal layers 113 formed on the top surface 107b of the top spacer 107 and between adjacent micro-LEDs 610(1000) and 620(1000). The metal layers 113 are arranged in parallel along the top surface 103b of the light emitting layer 103.

In the embodiment illustrated in FIG. 13B, there are three (3) metal layers 113. In other embodiments, the number of the metal layers 113 may be more than three.

In the embodiments illustrated in FIGS. 13A and 13B, each of the micro-LEDs 610 and 620 includes the micro-LED structure 1000 described in the first embodiment illustrated in FIG. 1A. Alternatively, in other embodiments, each of the micro-LEDs 610 and 620 may include any one of the micro-LED structures 1001, 1002, and 1003 described in the first, second, and third variations of the first embodiment illustrated in FIGS. 1B, 1C, and 1D, respectively.

Fourteenth Embodiment

FIG. 14A is a cross-sectional view of a micro-LED chip 14000, according to a fourteenth embodiment of the present disclosure. The embodiment illustrated in FIG. 14A differs from the embodiment illustrated in FIG. 13A in that micro-LED chip 14000 includes two micro-LEDs 610(2000) and 620(2000), and each one of the micro-LEDs 610(2000) and 620(2000) includes the micro-LED structure 2000 described in the second embodiment illustrated in FIG. 2A. The other components of the micro-LED chip 14000 of the embodiment illustrated in FIG. 14A are the same as the components of the micro-LED chip 13000 of the embodiment illustrated in FIG. 13A, and therefore detailed descriptions of these components are not repeated.

Variation of Fourteenth Embodiment

FIG. 14B is a cross-sectional view of a micro-LED chip 14001, according to a variation of the fourteenth embodiment of the present disclosure. The micro-LED chip 14001 illustrated in FIG. 14B differs from the micro-LED chip 14000 illustrated in FIG. 14A in that the micro-LED chip 14001 includes multiple metal layers 113 formed on the top surface 107b of the top spacer 107 and between adjacent micro-LEDs 610(2000) and 620(2000). The other components of the micro-LED chip 14001 of the embodiment illustrated in FIG. 14B are the same as the components of the micro-LED chip 13000 of the embodiment illustrated in FIG. 13A, and therefore detailed descriptions of these components are not repeated.

In the embodiments illustrated in FIGS. 14A and 14B, each of the micro-LEDs 610 and 620 includes the micro-LED structure 2000 described in the second embodiment illustrated in FIG. 2A. Alternatively, in other embodiments, each of the micro-LEDs 610 and 620 may include any one of the micro-LED structures 2001, 2002, and 2003 described in the first, second, and third variations of the second embodiment illustrated in FIGS. 2B, 2C, and 2D, respectively.

Fifteenth Embodiment

FIG. 15A is a cross-sectional view of a micro-LED chip 15000, according to a fifteenth embodiment of the present disclosure. The embodiment illustrated in FIG. 15A differs from the embodiment illustrated in FIG. 13A in that micro-LED chip 15000 includes two micro-LEDs 610(3000) and 620(3000), and each one of the micro-LEDs 610(3000) and 620(3000) includes the micro-LED structure 3000 described in the second embodiment illustrated in FIG. 3A. The other components of the micro-LED chip 15000 of the embodiment illustrated in FIG. 15A are the same as the components of the micro-LED chip 13000 of the embodiment illustrated in FIG. 13A, and therefore detailed descriptions of these components are not repeated.

Variation of Fifteenth Embodiment

FIG. 15B is a cross-sectional view of a micro-LED chip 15001, according to a variation of the fifteenth embodiment of the present disclosure. The micro-LED chip 15001 illustrated in FIG. 15B differs from the micro-LED chip 15000 illustrated in FIG. 15A in that the micro-LED chip 15001 includes multiple metal layers 113 formed on the top surface 107b of the top spacer 107 and between adjacent micro-LEDs 610(3000) and 620(3000). The components of the micro-LED chip 15001 of the embodiment illustrated in FIG. 15B are the same as the components of the micro-LED chip 13000 of the embodiment illustrated in FIG. 13A, and therefore detailed descriptions of these components are not repeated.

In the embodiments illustrated in FIGS. 15A and 15B, each of the micro-LEDs 610 and 620 includes the micro-LED structure 3000 described in the third embodiment illustrated in FIG. 3A. Alternatively, in other embodiments, each of the micro-LEDs 610 and 620 may include any one of the micro-LED structures 3001, 3002, and 3003 described in the first, second, and third variations of the third embodiment illustrated in FIGS. 3B, 3C, and 3D, respectively.

Sixteenth Embodiment

FIG. 16A is a cross-sectional view of a micro-LED chip 16000, according to a sixteenth embodiment of the present disclosure. The micro-LED chip 16000 may include multiple micro-LEDs. At least one of the micro-LEDs included in the micro-LED chip 16000 may have any one of the micro-LED structures 4000, 4001, . . . 5003 described above.

In the embodiment illustrated in FIG. 16A, the micro-LED chip 16000 includes two micro-LEDs 610(4000) and 620(4000). Each one of the micro-LEDs 610(4000) and 620(4000) includes the micro-LED structure 4000 described in the fourth embodiment illustrated in FIG. 4A.

As illustrated in FIG. 16A, each one of the micro-LEDs 610(4000) and 620(4000) includes the first type conductive layer 101, the second type conductive layer 102 stacked on the first type conductive layer 101, and the light emitting layer 103 formed between the first type conductive layer 101 and the second type conductive layer 102. The profile of the first type conductive layer 101 perpendicularly projected on the bottom surface 102b of the second type conductive layer 102 is surrounded by the bottom edge 102a of the second type conductive layer 102. The light emitting layer 103 extends along a horizontal level away from the top edge 101a of the first type conductive layer 101 and the edge 103a of the light emitting layer 103 is aligned with the bottom edge 102a of the second type conductive layer 102.

Each one of the micro-LEDs 610(4000) and 620(4000) further includes the top spacer 107 formed on the light emitting layer 103 and the bottom spacer formed under the light emitting layer 103. Both of the edge 107a of the top spacer 107 and the edge 108a of the bottom spacer 108 are aligned with the edge 103a of the light emitting layer 103, which is aligned with the bottom edge 102a of the second type conductive layer 102.

The micro-LED chip 16000 further includes the top isolation layer 114 surrounding the light emitting layer 103, and the microlens 111 formed on the second type conductive layer 102 and on a top surface 114a of the isolation layer 114.

Except that the edge 103a of the light emitting layer 103, the edge 107a of the top spacer 107, and the edge 108a of the bottom spacer 108 are aligned with the bottom edge 102a of the second type conductive layer 102, the components of the micro-LED chip 16000 illustrated in FIG. 16A are the same as the components of micro-LED chip 6005 illustrated in FIG. 6F, and therefore detailed descriptions of these components are not repeated.

Variation of Sixteenth Embodiment

FIG. 16B is a cross-sectional view of a micro-LED chip 16001, according to a variation of the sixteenth embodiment of the present disclosure. The embodiment illustrated in FIG. 16B differs from the embodiment illustrated in FIG. 16A in that the micro-LED chip 16001 further includes the metal layer 113 formed on the top surface 114a of the isolation layer 114 and between adjacent micro-LEDs 610(4000) and 620(4000). In the embodiment illustrated in FIG. 16B, there is only one metal layer 113 between micro-LEDs 610(4000) and 620(4000). Alternatively, in other embodiments, there are multiple metal layers 113 between micro-LEDs 610(4000) and 620(4000), and the number of the multiple metal layers 113 between micro-LEDs 610(4000) and 620(4000) may be more than two. Except for the metal layer 113, the components of the micro-LED chip 16001 illustrated in FIG. 16B are the same as the components of the micro-LED chip 16000 illustrated in FIG. 16A, and therefore detailed descriptions of these components are not repeated.

In the embodiments illustrated in FIGS. 16A and 16B, each of the micro-LEDs 610 and 620 includes the micro-LED structure 4000 described in the fourth embodiment illustrated in FIG. 4A. Alternatively, in other embodiments, each of the micro-LEDs 610 and 620 may include any one of the micro-LED structures 4001, 4002, and 4003 described in the first, second, and third variations of the fourth embodiment illustrated in FIGS. 4B, 4C, and 4D, respectively.

Seventeenth Embodiment

Figure 17A:
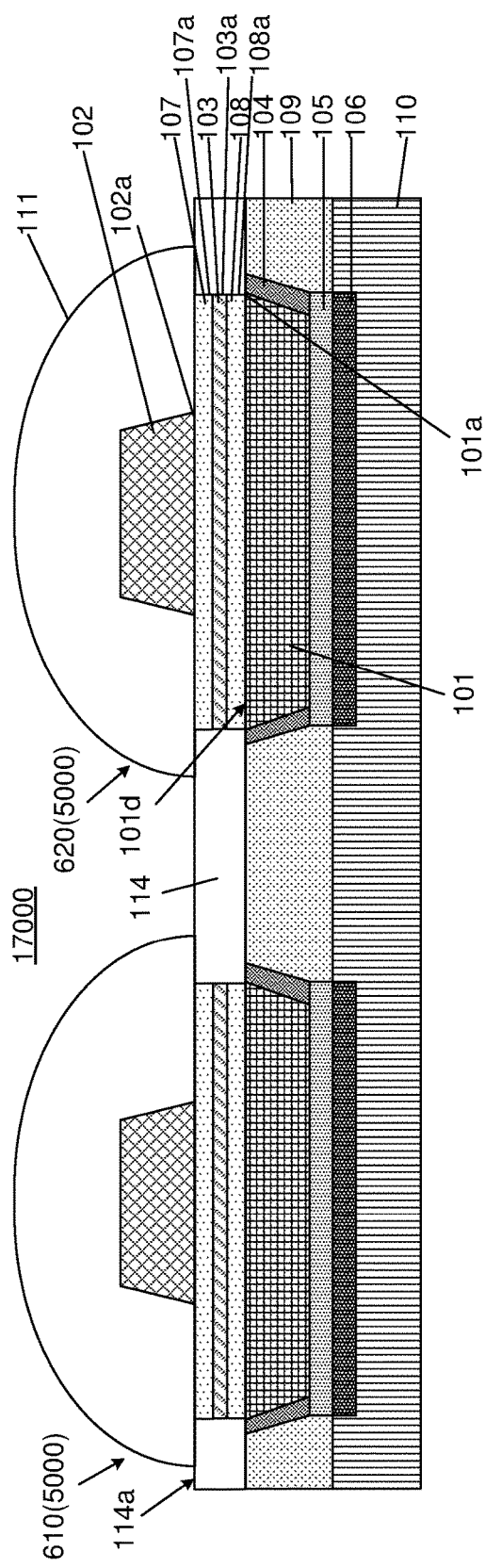
FIG. 17A is a cross-sectional view of a micro-LED chip, according to a seventeenth embodiment of the present disclosure.

FIG. 17A is a cross-sectional view of a micro-LED chip 17000, according to a seventeenth embodiment of the present disclosure. The micro-LED chip 17000 includes two micro-LEDs 610(5000) and 620(5000). Each one of the micro-LEDs 610(5000) and 620(5000) includes the micro-LED structure 5000 described in the fifth embodiment illustrated in FIG. 5A.

The micro-LED chip 17000 differs from the micro-LED chip 16000 in that a profile of the second type conductive layer 102 perpendicularly projected on the top surface 101d of the first type conductive layer 101 is surrounded by the top edge 101a of the first type conductive layer 101. In addition, the edge 103a of the light emitting layer 103, the edge 107a of the top spacer 107, and the edge 108a of the bottom spacer 108 are aligned with the top edge 101a of the first type conductive layer 101.

In addition, the micro-LED chip 17000 further includes the top isolation layer 114 surrounding the light emitting layer 103. The microlens 111 is formed on the second type conductive layer 102 and on the top surface 114a of the isolation layer 114. The other components of the micro-LED chip 17000 of the fourth embodiment illustrated in FIG. 17A are the same as the components of the micro-LED chip 16000 of the second embodiment illustrated in FIG. 16A, and therefore detailed descriptions of these components are not repeated.

Variation of Seventeenth Embodiment

Figure 17B:
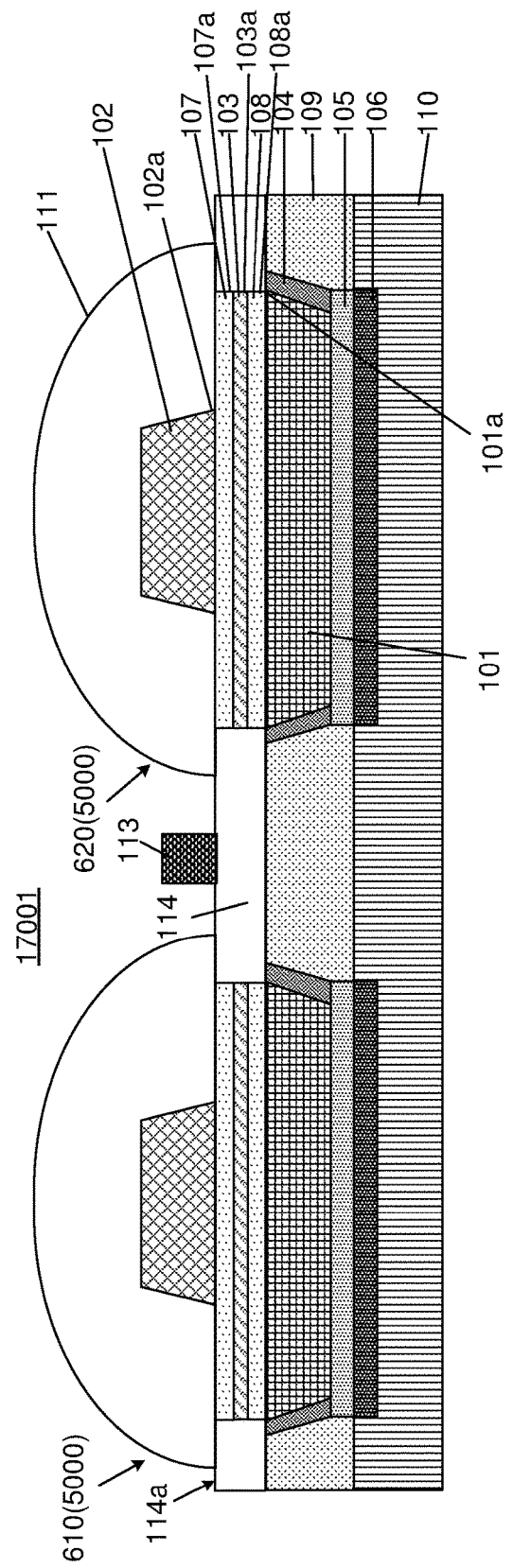
FIG. 17B is a cross-sectional view of a micro-LED chip, according to a variation of the seventeenth embodiment of the present disclosure.

FIG. 17B is a cross-sectional view of a micro-LED chip 17001, according to a variation of the seventeenth embodiment of the present disclosure. The embodiment illustrated in FIG. 17B differs from the embodiment illustrated in FIG. 17A in that that the micro-LED chip 17001 further includes the metal layer 113 formed on the top surface 114a of the isolation layer 114 and between adjacent micro-LEDs 610(5000) and 620(5000). In the embodiment illustrated in FIG. 17B, there is only one metal layer 113 between micro-LEDs 610(5000) and 620(5000). Alternatively, in other embodiments, there are multiple metal layers 113 between micro- LEDs 610(5000) and 620(5000), and the number of the multiple metal layers 113 between micro-LEDs 610(4000) and 620(4000) may be more than two. Except for the metal layer 113, the components of the micro-LED chip 17001 illustrated in FIG. 17B are the same as the components of the micro-LED chip 17000 illustrated in FIG. 17A, and therefore detailed descriptions of these components are not repeated.

In the embodiments illustrated in FIGS. 17A and 17B, each of the micro-LEDs 610 and 620 includes the micro-LED structure 5000 described in the fifth embodiment illustrated in FIG. 5A. Alternatively, in other embodiments, each of the micro-LEDs 610 and 620 may include any one of the micro-LED structures 5001, 5002, and 5003 described in the first, second, and third variations of the fifth embodiment illustrated in FIGS. 5B, 5C, and 5D, respectively.

Comparative Example

Figure 18:
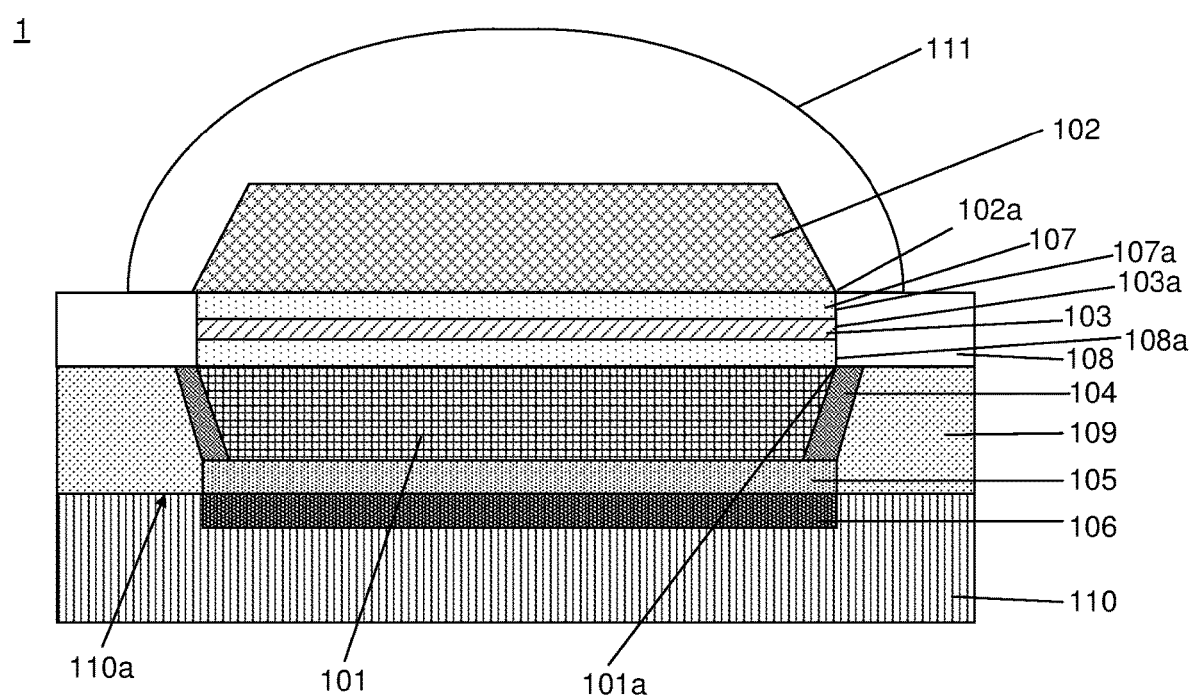
FIG. 18 is a cross-sectional view of a micro-LED structure, according to a comparative example.

FIG. 18 is a cross-sectional view of a micro-LED structure 1, according to a comparative example. The micro-LED structure 1 in the comparative example illustrated in FIG. 18 differs from the micro-LED structure 1000 of the first embodiment illustrated in FIG. 1A in that the light emitting layer 103 does not extend along the horizontal level away from the top edge 101*a* of the first type conductive layer 101 and the bottom edge 102*a* of the second type conductive layer 102. Instead, in the comparative example, the edge 103*a* of the light emitting layer 103 is aligned with both of the top edge 101*a* of the first type conductive layer 101 and the bottom edge 102*a* of the second type conductive layer 102.

As explained previously, the light emitting layer 103 may include multiple pairs of quantum well layers. The number of multi-quantum well (MQW) pairs in the light emitting layer 103 is related to exposed sidewall area of the light emitting layer 103 which is generated by, for example, inductively coupled plasma etching. The larger the exposed sidewall area, the more MQW pairs, resulting in larger surface recombination carrier loss.

In the comparative example, the sidewall of the light emitting layer 103 is aligned with the edges 101*a* and 102*a* of the first type conductive layer 101 and the second type conductive layer 102. As a result, large surface recombination carrier loss may occur in the micro-LED between the first type conductive layer 101 and the second type conductive layer 102, negatively impacting the light emission efficiency of the micro-LED.

In contrast, in the first embodiment as well as other embodiments of the present disclosure, the light emitting layer 103 extends away from the top edge 101*a* of the first type conductive layer 101 and the bottom edge 102*a* of the second type conductive layer 102, such that the edge 103*a* of the light emitting layer 103 does not contact the top edge 101*a* of the first type conductive layer 101 and the bottom edge 102*a* of the second type conductive layer 102. As a result, surface recombination carrier loss may not occur in the micro-LED between the first type conductive layer 101 and the second type conductive layer 102. Consequently, light emission efficiency of the micro-LED will be improved.

While illustrative embodiments have been described herein, the scope of the present disclosure covers any and all embodiments having equivalent elements, modifications, omissions, combinations (e.g., of aspects across various embodiments), adaptations and/or alterations as would be appreciated by those skilled in the art based on the present disclosure. For example, features included in different embodiments shown in different figures may be combined. The limitations in the claims are to be interpreted broadly based on the language employed in the claims and not limited to examples described in the present specification or during the prosecution of the application. The examples are to be construed as non-exclusive. It is intended, therefore, that the specification and examples be considered as illustrative only, with a true scope and spirit being indicated by the following claims and their full scope of equivalents.

What is claimed is:

1. A micro-LED chip including multiple micro-LEDs, wherein,
   at least one micro-LED of the multiple micro-LEDs comprises:
   a first type conductive layer;
   a second type conductive layer stacked on the first type conductive layer; and
   a light emitting layer formed between the first type conductive layer and the second type conductive layer,
   wherein the light emitting layer is continuously formed on the whole micro-LED chip, the multiple micro-LEDs sharing the light emitting layer, and
   wherein a profile of the second type conductive layer perpendicularly projected on a top surface of the first type conductive layer is surrounded by an edge of the first type conductive layer.

2. The micro-LED chip according to claim 1, further comprising:
   a top spacer formed on a top surface of the light emitting layer;
   a bottom spacer formed on a bottom surface of the light emitting layer,
   wherein an edge of the top spacer is aligned with an edge of the light emitting layer, and
   an edge of the bottom spacer is aligned with the edge of the light emitting layer.

3. The micro-LED chip according to claim 2, wherein a thickness of the top spacer is larger than a thickness of the light emitting layer, and a thickness of the bottom spacer is larger than the thickness of the light emitting layer.

4. The micro-LED chip according to claim 2, further comprising, in the at least one micro-LED, a microlens formed on the second type conductive layer and on a top surface of the top spacer.

5. The micro-LED chip according to claim 1, wherein a top area of the first type conductive layer is larger than a bottom area of the first type conductive layer, and a top area of the second type conductive layer is smaller than a bottom area of the second type conductive layer.

6. The micro-LED chip according to claim 1, wherein the light emitting layer includes only one pair of quantum well layers, or multiple pairs of quantum well layers.

7. The micro-LED chip according to claim 1, wherein the at least one micro-LED further comprises a reflective structure formed surrounding the first type conductive layer.

8. The micro-LED chip according to claim 7, wherein, in the at least one micro-LED, the reflective structure is attached on a sidewall of the first type conductive layer, and the at least one micro-LED further comprises a bottom connection structure formed under the first type conductive layer and electrically connected with the first type conductive layer.

9. The micro-LED chip according to claim 8, further comprising a substrate under the first type conductive layer, and electrically connected with the bottom connection structure by a connecting pad in the substrate.

10. The micro-LED chip according to claim 9, wherein the substrate includes an IC circuit.

11. The micro-LED chip according to claim 9, wherein the reflective structure on the sidewall of the first type conductive layer is inclined relative to a surface of the substrate, and an inclined angle of the reflective structure is approximately 30° to approximately 75° relative to the surface of the substrate.

12. The micro-LED chip according to claim 8, wherein the bottom connection structure is made of a reflective and electrically conductive material.

13. The micro-LED chip according to claim 8, wherein the reflective structure on the sidewall of the first type conductive layer has a curved surface.

14. The micro-LED chip according to claim 8, wherein the reflective structure at the sidewall of the first type conductive layer is made of an ODR (omnidirectional reflector) structure or a DBR (distributed bragg reflection) structure.

15. The micro-LED chip according to claim 7, wherein the reflective structure is attached both on a sidewall and a bottom surface of the first type conductive layer.

16. The micro-LED chip according to claim 15, wherein the reflective structure on the bottom surface of the first type conductive layer is electrically conductive, and the micro-LED chip further comprises a bottom connection structure formed at the bottom of the reflective structure and electrically connected with the reflective structure.

17. The micro-LED chip according to claim 7, wherein the reflective structure is configured to focus light on the second type conductive layer.

18. The micro-LED chip according to claim 1, wherein the at least one micro-LED further comprises:
a reflective structure attached on a bottom surface of the first type conductive layer.

19. The micro-LED chip according to claim 18, wherein the reflective structure is electrically conductive, and
the at least one micro-LED further comprises a bottom connection structure formed at the bottom of the reflective structure and electrically connected with the reflective structure.

20. The micro-LED chip according to claim 1, further comprising, in the at least one micro-LED, an isolation layer formed surrounding the first type conductive layer and under the light emitting layer, the isolation layer being made of a light absorption material.

* * * * *

UNITED STATES PATENT AND TRADEMARK OFFICE
CERTIFICATE OF CORRECTION

Page 1 of 1

PATENT NO. : 12,261,241 B2
APPLICATION NO. : 17/562191
DATED : March 25, 2025
INVENTOR(S) : Qiming Li et al.

It is certified that error appears in the above-identified patent and that said Letters Patent is hereby corrected as shown below:

In the Specification

Column 14, Line 44, "DBR (distributed bragg reflection)" should read --DBR (distributed Bragg reflection)--.

In the Claims

Claim 14, Column 35, Line 17, "DBR (distributed bragg reflection)" should read --DBR (distributed Bragg reflection)--.

Signed and Sealed this
Seventh Day of October, 2025

John A. Squires
*Director of the United States Patent and Trademark Office*